United States Patent
Ohashi

(10) Patent No.: US 8,256,905 B2
(45) Date of Patent: Sep. 4, 2012

(54) FOREIGN SUBSTANCE REMOVING DEVICE AND FOREIGN SUBSTANCE REMOVING METHOD

(75) Inventor: Kaishi Ohashi, Tokyo (JP)

(73) Assignee: Canon Kabushiki Kaisha (JP)

( * ) Notice: Subject to any disclaimer, the term of this patent is extended or adjusted under 35 U.S.C. 154(b) by 501 days.

(21) Appl. No.: 12/440,996

(22) PCT Filed: Jan. 30, 2008

(86) PCT No.: PCT/JP2008/051977
§ 371 (c)(1),
(2), (4) Date: Mar. 12, 2009

(87) PCT Pub. No.: WO2008/093884
PCT Pub. Date: Aug. 7, 2008

(65) Prior Publication Data
US 2009/0207493 A1    Aug. 20, 2009

(30) Foreign Application Priority Data

Feb. 2, 2007   (JP) .................................. 2007-024178
Dec. 5, 2007   (JP) .................................. 2007-314756

(51) Int. Cl.
*G02B 1/00* (2006.01)
(52) U.S. Cl. ........................................................ 359/507
(58) Field of Classification Search .................. 359/507, 359/508
See application file for complete search history.

(56) References Cited

U.S. PATENT DOCUMENTS

| | | |
|---|---|---|
| 7,006,138 B2 | 2/2006 | Kawai |
| 7,492,408 B2 * | 2/2009 | Ito .................................. 359/507 |
| 2004/0012714 A1 | 1/2004 | Kawai |
| 2004/0169761 A1 | 9/2004 | Kawai et al. |
| 2005/0088563 A1 | 4/2005 | Ito et al. |
| 2005/0280712 A1 | 12/2005 | Kawai |
| 2007/0171295 A1 | 7/2007 | Kawai |

FOREIGN PATENT DOCUMENTS

| | | |
|---|---|---|
| JP | 2002-204379 A | 7/2002 |
| JP | 2003-159566 A | 6/2003 |
| JP | 2003-280110 A | 10/2003 |
| JP | 2003-333391 A | 11/2003 |
| JP | 2004-012474 A | 1/2004 |
| JP | 2005-329345 A | 12/2005 |
| JP | 2007-193126 A | 8/2007 |

OTHER PUBLICATIONS

International Search Report issued in corresponding PCT/JP2008/051977, dated Apr. 22, 2008.

\* cited by examiner

*Primary Examiner* — Euncha Cherry
(74) *Attorney, Agent, or Firm* — Rossi, Kimms & McDowell LLP

(57) ABSTRACT

There is provided a foreign substance removing device which is capable of moving a foreign substance in a desired direction at a high removing efficiency. The foreign substance removing device removes a foreign substance on an object. A vibrator has first and second piezoelectric elements provided on the object. Power supplies applies alternating voltages to the respective first and second piezoelectric elements. A control circuit controls the alternating voltages applied by the power supplies. The control circuit changes the frequency of the alternating voltage and at the same time makes respective phases of the alternating voltages applied to the first and second piezoelectric elements different from each other, so as to concurrently generate a first standing wave and a second standing wave different in order.

45 Claims, 58 Drawing Sheets

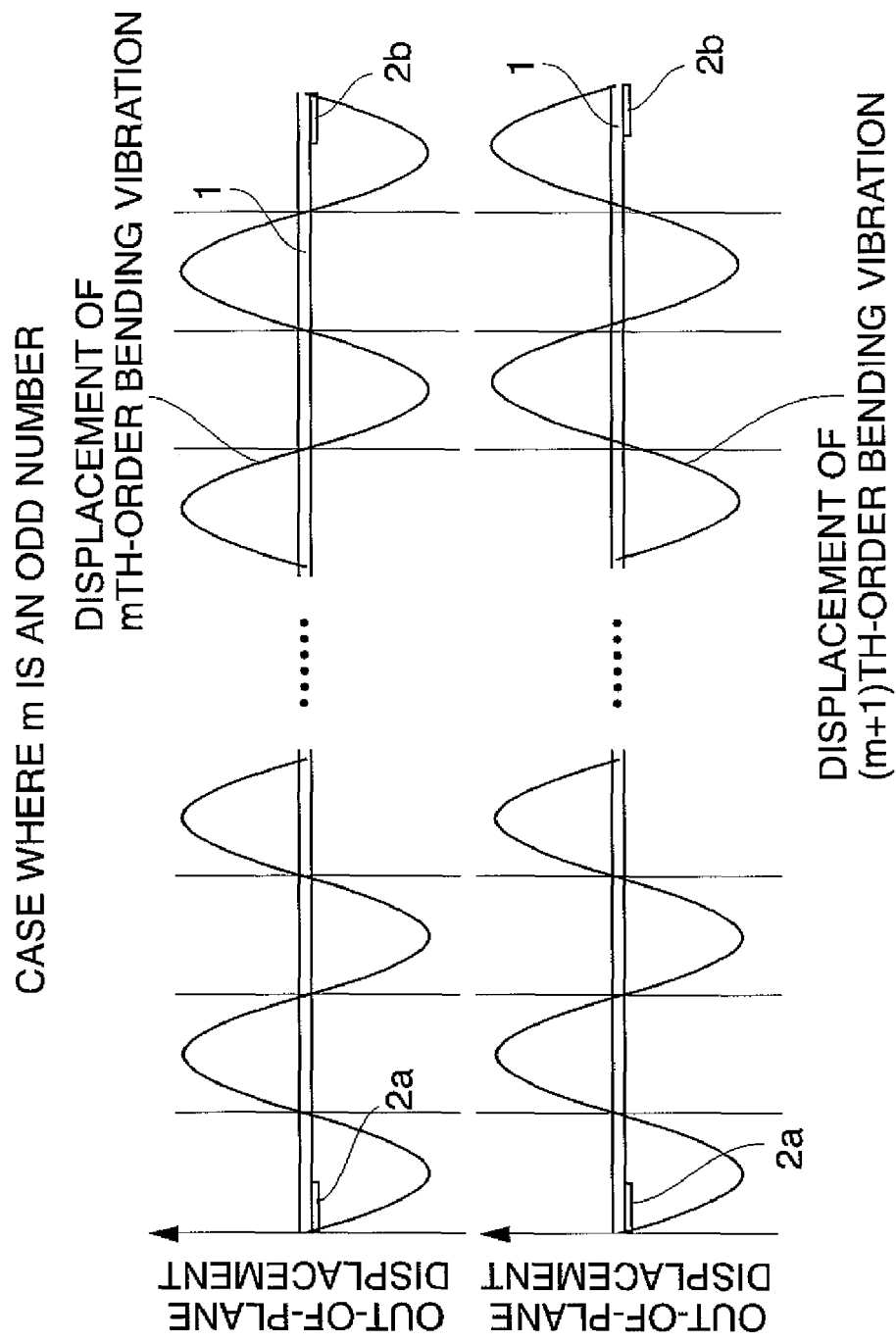

FIG. 6

| CASE WHERE m IS AN ODD NUMBER | | VOLTAGE APPLIED TO PIEZOELECTRIC ELEMENT ON ONE SIDE | | VOLTAGE TO BE APPLIED TO PIEZOELECTRIC ELEMENT ON THE OTHER SIDE | |
|---|---|---|---|---|---|
| | | REAL NUMBER COMPONENT | IMAGINARY NUMBER COMPONENT | REAL NUMBER COMPONENT | IMAGINARY NUMBER COMPONENT |
| a | mTH-ORDER | 1 | 0 | 1 | 0 |
| b | (m+1)TH-ORDER | A | 0 | -A | 0 |
| c | (m+1)TH-ORDER OUT-OF-PLANE WITH A TIME PHASE DIFFERENCE OF 90° | 0 | A | 0 | -A |
| d | SUPERPOSITION OF a AND c | 1 | A | 1 | -A |

FIG. 8

| CASE WHERE m IS AN EVEN NUMBER | | VOLTAGE APPLIED TO PIEZOELECTRIC ELEMENT ON ONE SIDE | | VOLTAGE TO BE APPLIED TO PIEZOELECTRIC ELEMENT ON THE OTHER SIDE | |
|---|---|---|---|---|---|
| | | REAL NUMBER COMPONENT | IMAGINARY NUMBER COMPONENT | REAL NUMBER COMPONENT | IMAGINARY NUMBER COMPONENT |
| a | mTH-ORDER | 1 | 0 | −1 | 0 |
| b | (m+1)TH-ORDER | A | 0 | A | 0 |
| c | (m+1)TH-ORDER OUT-OF -PLANE WITH A TIME PHASE DIFFERENCE OF 90° | 0 | A | 0 | A |
| d | SUPERPOSITION OF a AND c | 1 | A | −1 | A |

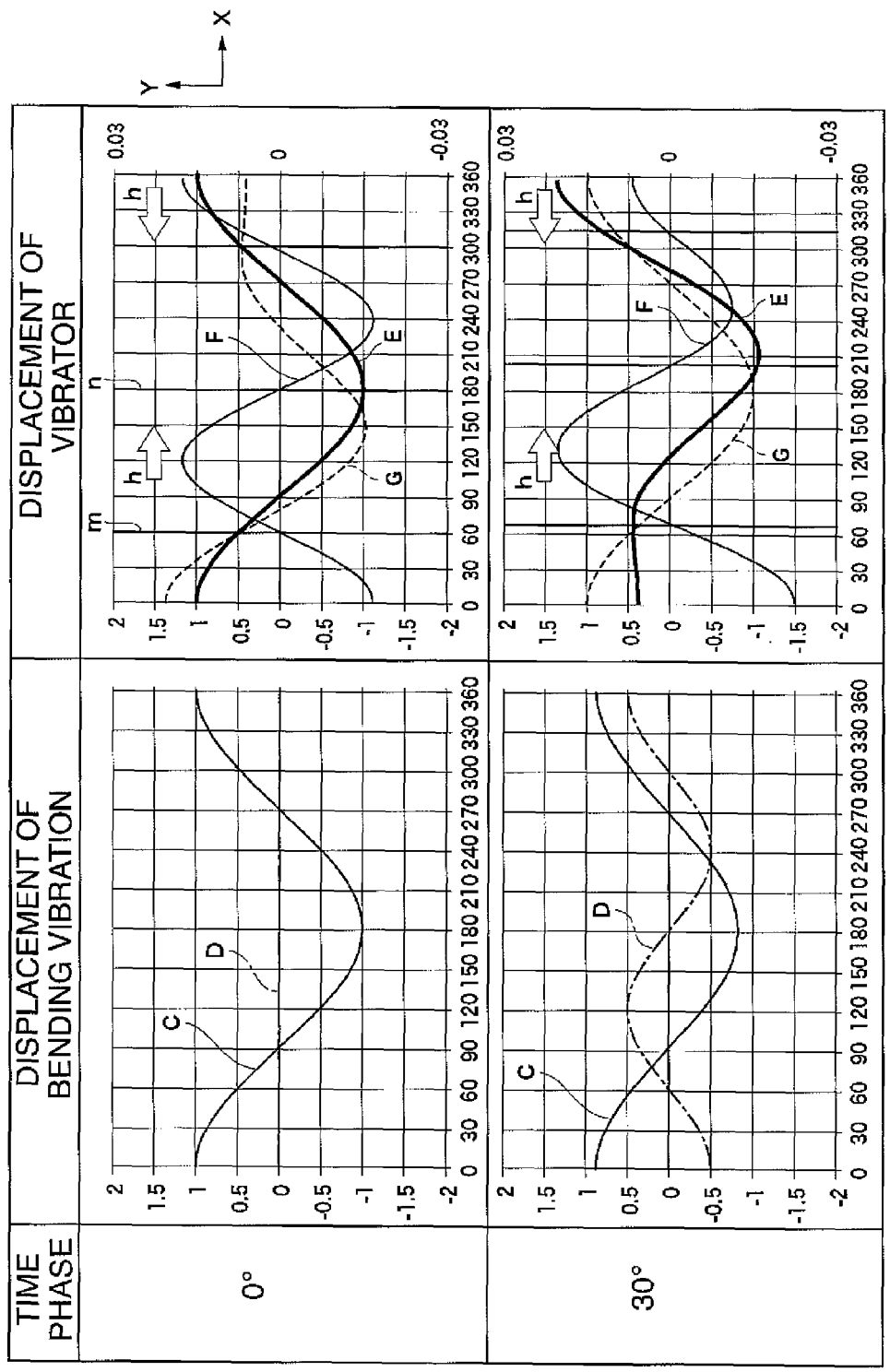

FOREIGN SUBSTANCE REMOVING DEVICE AND FOREIGN SUBSTANCE REMOVING METHOD

TECHNICAL FIELD

The present invention relates to a foreign substance removing device that removes a foreign substance on an object therefrom, and a method of removing a foreign substance on an object therefrom.

BACKGROUND ART

In recent years, with improvement of the resolution of an optical sensor in an image pickup apparatus as an optical apparatus, adverse influence of a foreign substance adhering to an optical system during operation of the apparatus, on a picked-up image, has come to be considered increasingly serious. In particular, the resolution of an image pickup device used in a video camera or a still camera has been remarkably improved. For this reason, an image rarely blurs on the surface of the image pickup device, and hence when a foreign substance, such as dust from outside the apparatus and abrasion powder produced on a mechanical sliding surface within the apparatus, adheres to an optical component disposed in the vicinity of the image pickup device, such as an infrared cut filter or an optical low-pass filter, the image of the foreign substance can be taken in a picked-up image.

Further, an image pickup section of a copying machine or a facsimile machine as an optical apparatus causes a line sensor or an original brought close to the line sensor to be scanned to thereby read a plane original. In this case, when a foreign substance adheres to a light ray incidence part via which light enters the line sensor, the image of the foreign substance is taken in a scanned image. In the reader section of a facsimile machine that employs a method of scanning and reading an original or the reader section of a copying machine that employs a method of reading an original during conveyance from an automatic document feeder, i.e. a so-called moving original reading method, an image of a foreign substance is taken as a linear image extending in the original feed direction, which causes serious degradation of image quality.

The image quality can be recovered by manually wiping off the foreign substance. However, a foreign substance that adheres to the light ray incidence part during operation of the apparatus cannot be recognized until after an image has been picked up. If the image is picked up or scanned before the foreign substance is wiped off, an image of the foreign substance is taken in the picked-up image, and hence correction by software is required. In the case of a copying machine, an image is output onto a paper medium simultaneously, and hence it takes a great deal of labor to correct the image.

To solve such a problem, a camera which is provided with a vibration-type dustproof mechanism has been proposed in Japanese Laid-Open Patent Publications (Kokai) No. 2002-204379 and No. 2003-333391. Further, an image reading apparatus has been proposed in Japanese Patent Laid-Open Publications (Kokai) No. 2003-280110 and No. 2004-012474, in which a foreign substance is moved from an image reader section by applying vibration thereto.

FIG. 61 is a view of a conventional dustproof device (foreign substance removing device) disclosed in Japanese Laid-Open Patent Publication (Kokai) No. 2002-204379. This dustproof device has a glass plate 27 as an optical element. A light ray passes through an image-forming light ray passing range 27a within the glass plate 27 to form an image on an image pickup device (not shown). Further, secured to the glass plate 27 are a piezoelectric element A 271, a piezoelectric element B 272, a piezoelectric element C 273, and a piezoelectric element D 274. Between each piezoelectric element and the glass plate 27, there is provided an electrical ground terminal 275.

Each of the piezoelectric elements has sections different in polarizing direction therebetween (each indicated by "+" and "−" in FIG. 61) arranged alternately in the longitudinal direction. The piezoelectric element A 271 and the piezoelectric element C 273 are identical in polarization arrangement in the longitudinal direction. Similarly, the piezoelectric element B 272 and the piezoelectric element D 274 are identical in polarization arrangement in the longitudinal direction. When the length of a pair of sections indicated by "+" and "−" is represented by $\lambda$, the position of the section of the piezoelectric element B 272 and that of the piezoelectric element D 274 are displaced by $\lambda/4$ in the longitudinal direction with respect to the position of the section of the piezoelectric element A 271 and that of the piezoelectric element C 273.

An oscillator 276 causes a voltage having an in-phase period to be applied to the respective piezoelectric elements A 271 and C 273. On the other hand, a 90° phase shifter 277 causes a voltage having a period shifted in phase by 90° from the phase of the voltage applied from the oscillator 276 to be applied to the piezoelectric elements B 272 and D 274.

However, it is difficult for the conventional foreign substance removing device to generate a traveling wave, which travels on the surface of the glass plate 27, for moving a foreign substance on the glass plate 27. Even if the traveling wave is generated on the surface of the glass plate 27, the traveling wave is reflected from an end of the glass plate 27, and an incident wave and a reflected wave are superposed, which changes the traveling wave into a standing wave. If the traveling wave is changed into the standing wave, the movement at each mass point ceases to be elliptical, which makes it difficult to move the foreign substance in one direction.

Further, when a means for eliminating the reflected wave is employed, it is impossible to utilize a resonance phenomenon caused by the superposition of the incident wave and the reflected wave. For this reason, large amplitude cannot be obtained, and the speed of elliptical vibration is reduced. As a result, speed at which a foreign substance is moved becomes slow, which reduces removing efficiency.

DISCLOSURE OF THE INVENTION

The present invention provides a foreign substance removing device and a foreign substance removing method which are capable of moving a foreign substance in a desired direction at a high removing efficiency.

In one aspect of the present invention, there is provided a foreign substance removing device that removes a foreign substance on an object therefrom, comprising a vibrator provided on the object, the vibrator having a first electromechanical energy conversion element, and a second electromechanical energy conversion element, power supplies configured to apply alternating voltages to the first and second electromechanical energy conversion elements, respectively, and a control circuit configured to control the alternating voltages respectively applied by the power supplies, wherein, in order to concurrently generate a first standing wave and a second standing wave different in order, the control circuit sets a frequency of the alternating voltages, and at the same time makes respective phases of the alternating voltages applied to the first and second electromechanical energy conversion elements different from each other.

In another aspect of the present invention, there is provided a method of removing a foreign substance on an object therefrom, the object having a vibrator provided thereon which has a first electromechanical energy conversion element and a second electromechanical energy conversion element, comprising a voltage application step of applying alternating voltages to the first electromechanical energy conversion element and the second electromechanical energy conversion element from power supplies, respectively, a control step of controlling the alternating voltages respectively applied by the power supplies, wherein the control step includes, so as to concurrently generate a first standing wave and a second standing wave different in order, setting a frequency of the alternating voltage, and at the same time making respective phases of the alternating voltages applied to the first and second electromechanical energy conversion elements different from each other.

Further features and aspects of the present invention will become apparent from the following detailed description of exemplary embodiments with reference to the attached drawings.

BRIEF DESCRIPTION OF DRAWINGS

FIG. 5A is a diagram showing displacement of an mth-order out-of-plane bending vibration in the vibrator in a case where m is an odd number;

FIG. 5B is a diagram showing displacement of an (m+1)th-order out-of-plane bending vibration in the vibrator in the case where m is an odd number;

FIG. 6 is a table showing alternating voltages applied to the pair of piezoelectric elements, respectively, in the case where m is an odd number;

FIG. 8 is a table showing alternating voltages applied to the pair of piezoelectric elements, respectively, in the case where m is an even number;

FIG. 10 is a graph showing respective displacements of the first-order out-of-plane bending vibration and the second-order out-of-plane bending vibration in a case where the time phase difference between the two vibrations is set to 90°, and displacement of the vibrator resulting from superposition of the two vibrations, on a time phase-by-time phase basis;

BEST MODE FOR CARRYING OUT THE INVENTION

The following description of various exemplary embodiments, features and aspects of the present invention is merely illustrative in nature and is in no way intended to limit the invention, its application, or uses.

A foreign substance removing device and a foreign substance removing method according to the present invention will be described with reference to the drawings showing embodiments thereof. The foreign substance removing device according to each of the embodiments of the present invention is installed in a camera as an optical apparatus.

First Embodiment

Figure 1A:
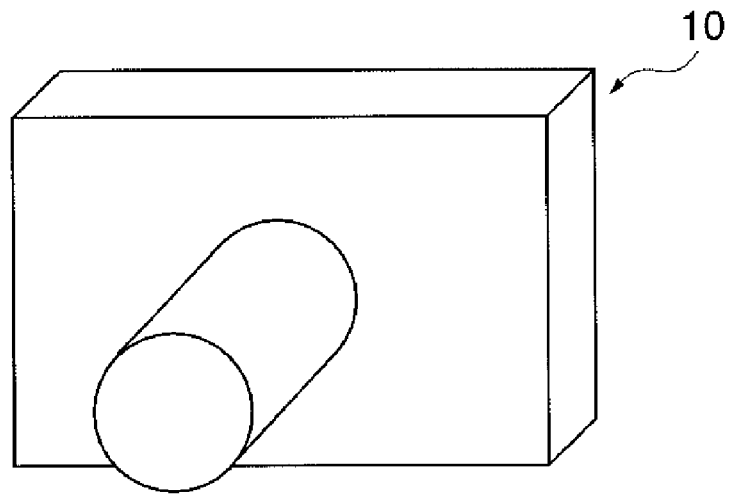
FIG. 1A is a perspective view of the appearance of a camera to which is applied a foreign substance removing device according to a first embodiment of the present invention.
Figure 1B:
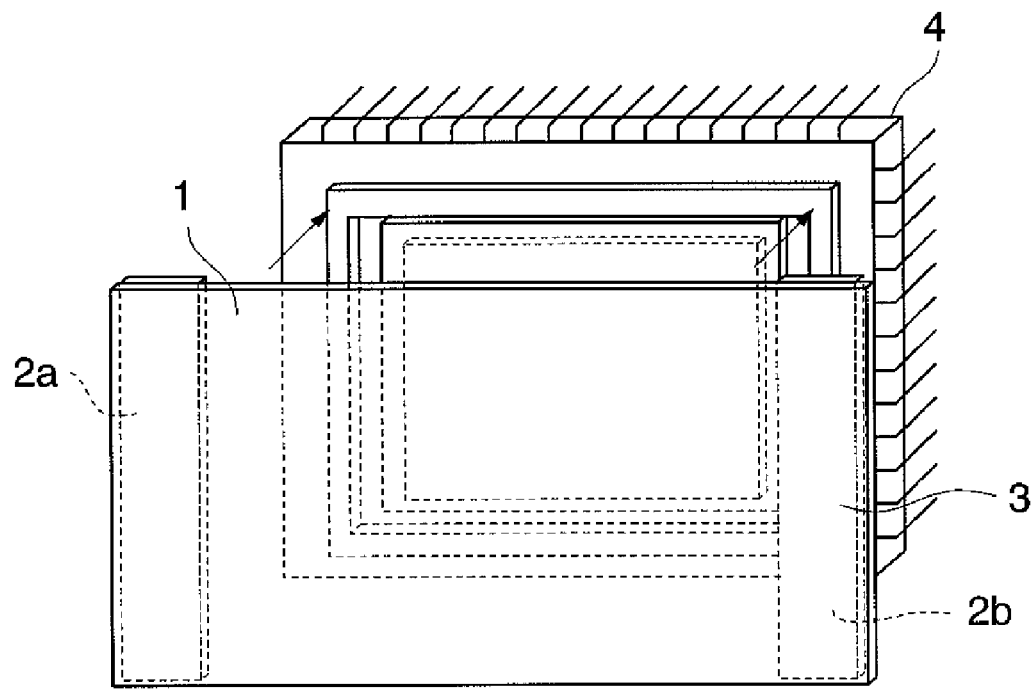
FIG. 1B is a perspective view of the construction of an image pickup section of the camera, which is equipped with the foreign substance removing device.

FIG. 1A is a perspective view of a camera to which is applied a foreign substance removing device according to a first embodiment of the present invention, and FIG. 1B is a perspective view of the construction of an image pickup section of the camera, which is equipped with the foreign substance removing device. The camera 10 is a well known digital still camera. In the image pickup section of the camera 10, there is provided an image pickup device 4 as a light-receiving element, such as a CCD or a CMOS sensor, for converting an object image received as light into an electric signal to thereby generate image data. Further, a vibrator 3 in the form of a rectangular plate is mounted on the image pickup section such that a space formed on the front surface of the image pickup device 4 is hermetically sealed. The vibrator 3 is comprised of an optical member 1 in the form of a rectangular plate, and a pair of piezoelectric elements 2a and 2b, as electromechanical energy conversion elements, which are rigidly glued to respective opposite ends of the optical member 1. The optical member 1 is formed by a highly transmissive optical member, such as a cover glass, an infrared cut filter or an optical low-pass filter, and light having passed through the optical member 1 enters the image pickup device 4.

The dimension in the direction of length (vertical direction as viewed in FIG. 1B) of each of the piezoelectric elements 2a and 2b disposed on the respective opposite ends of the optical member 1 has the same value as that of the optical member 1 in the direction of width (vertical direction as viewed in FIG. 1B) thereof so as to generate a large force for causing bending deformation by vibration. It should be noted that when it is unnecessary to specifically distinguish between the piezoelectric elements 2a and 2b, they each will be simply referred to as the piezoelectric element 2.

Figure 2:
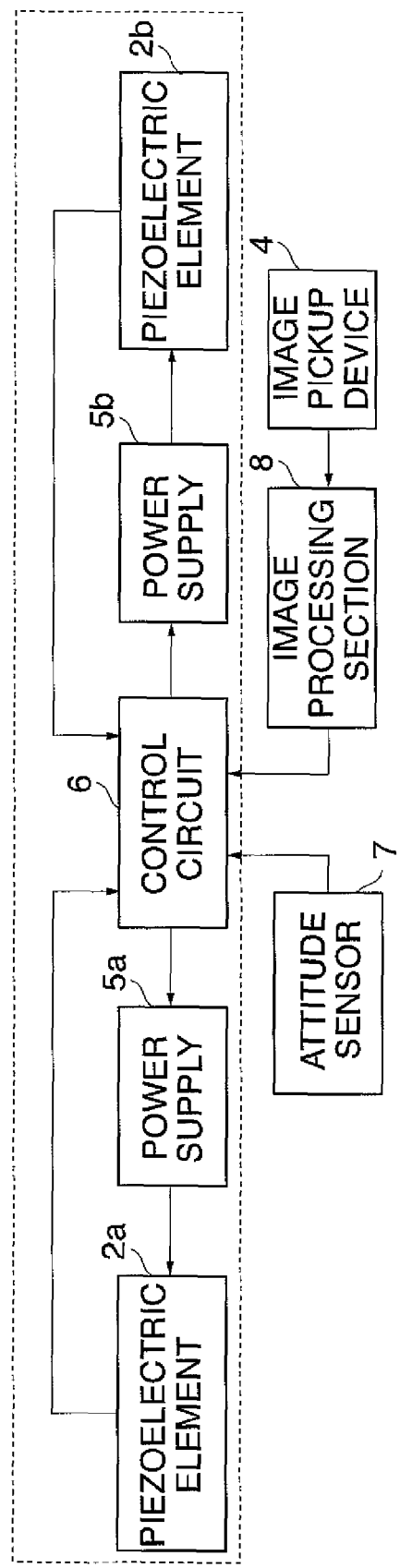
FIG. 2 is a block diagram showing the electrical configuration of the foreign substance removing device.

FIG. 2 is a block diagram showing the electrical configuration of the foreign substance removing device. Blocks enclosed by dotted lines indicate the foreign substance removing device. The foreign substance removing device has not only the optical member 1 and the piezoelectric elements 2a and 2b as first and second electromechanical energy conversion elements, which constitute the vibrator 3, but also power supplies 5a and 5b and a control circuit 6. The control circuit 6 reads a voltage generated at a sensor electrode 2S (see FIG. 3) of each piezoelectric element 2 by the piezoelectric effect, and detects the amplitude and phase of a vibration to thereby control the amplitude, frequency, and time phase of each of alternating voltages generated by the respective power supplies 5a and 5b.

In the present embodiment, the control circuit 6 is connected to an attitude sensor 7 and an image processing section 8 connected to the image pickup device 4. The attitude sensor 7 detects the attitude of the foreign substance removing device (specifically, the optical member 1). The image processing section 8 calculates the location of a spot on the optical member 1 where a foreign substance adheres, using an image picked up by the image pickup device 4. It should be noted that when it is unnecessary to specifically distinguish between the power supplies 5a and 5b which apply alternating voltages to the respective piezoelectric elements 2a and 2b, they each will be simply referred to as the power supply 5.

Figure 3:
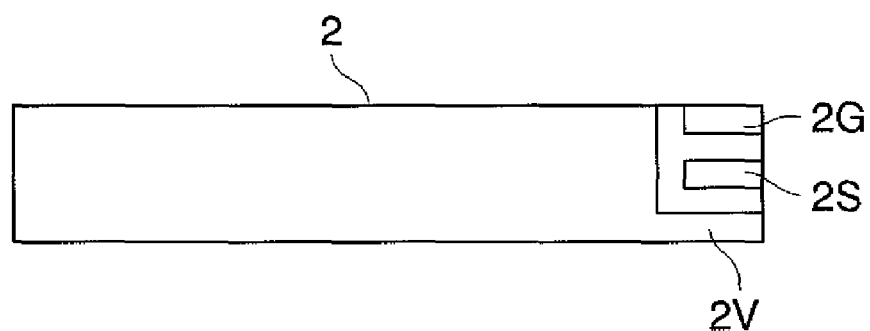
FIG. 3 is a view of an electrode pattern on the front surface of the piezoelectric element.

FIG. 3 is a view of an electrode pattern on the front surface of the piezoelectric element 2. On the front surface of the piezoelectric element 2, there are formed a voltage applying electrode 2V, and a ground electrode 2G and a sensor electrode 2S functioning as first and second sensors, respectively. On the whole rear surface, there is formed a ground electrode 2G. The ground electrode 2G on the front surface and the ground electrode 2G on the rear surface are electrically connected by a through hole as an electrode formed through the piezoelectric element 2. Further, the voltage applying electrode 2V and the ground electrode 2G are connected to the power supply voltage side of the power supply 5 and the GND side of the same, respectively. The power supply 5 applies an alternating voltage to the piezoelectric element 2, whereby vibration is excited in the vibrator 3.

Now, a description will be given of a method of driving the foreign substance removing device that removes a foreign substance from an object. First, there is shown a method of simultaneously exciting an mth-order out-of-plane bending vibration and an (m+1)th-order out-of-plane bending vibration as a first standing wave and a second standing wave different in order by one therebetween (m is a natural number), in the vibrator 3. The mth-order out-of-plane bending vibration and the (m+1)th-order out-of-plane bending vibration each have a plurality of nodes, and the nodes generated in each of the out-of-plane bending vibrations of different orders are arranged in the same direction.

Figure 4:
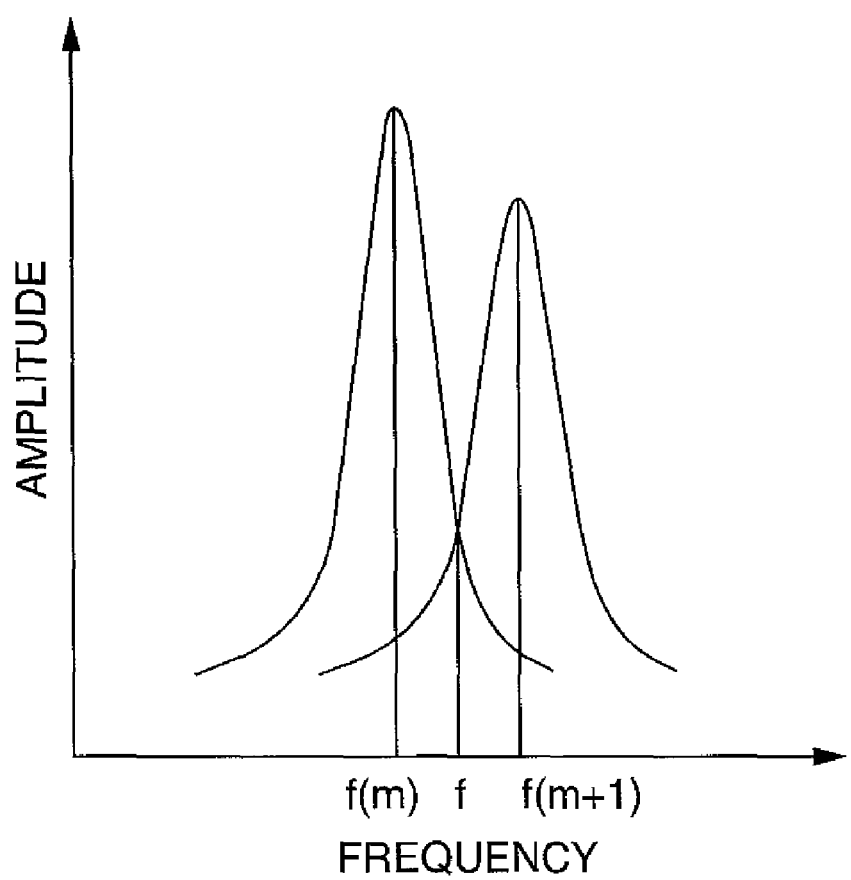
FIG. 4 is a graph showing the frequency of an alternating voltage applied to the piezoelectric element 2 and amplitudes of vibrations generated in the piezoelectric element 2.

FIG. 4 is a graph showing the frequency of an alternating voltage applied to the piezoelectric element 2 and amplitudes of vibrations generated in the piezoelectric element 2. In the graph, f(m) represents the resonance frequency of the mth-order out-of-plane bending vibration, and f(m+1) the resonance frequency of the (m+1)th-order out-of-plane bending vibration. When the frequency f of the alternating voltage applied to the piezoelectric element 2 is set such that $f(m) < f < f(m+1)$ holds, a vibration of the frequency f whose amplitude is expanded by the resonance phenomenon of the mth-order out-of-plane bending vibration and that of the (m+1)th-order out-of-plane bending vibration is obtained. The vibrations have the same repetition time period. On the other hand, as the frequency f of the alternating voltage applied to the piezoelectric element 2 is made lower than f(m), the amplitude of the (m+1)th-order out-of-plane bending vibration becomes smaller, and as the frequency f is made higher than f(m+1), the amplitude of the mth-order out-of-plane bending vibration becomes smaller.

FIGS. 5A and 5B are diagrams showing displacement of the mth-order out-of-plane bending vibration and displacement of the (m+1)th-order out-of-plane bending vibration in the vibrator 3 when m is an odd number, respectively. In the case of exciting an mth-order vibration, an alternating voltage is applied to one of the piezoelectric elements 2 secured to the respective opposite ends of the optical member 1 to thereby expand/contract the piezoelectric element 2, and an alternating voltage with the same time phase is also applied to the other piezoelectric element 2 to thereby expand/contract the same (see FIG. 5A). As a consequence, out-of-plane bending deformations with the same phase occur at the respective opposite ends of the optical member 1, which makes it possible to excite vibration efficiently.

In the case of exciting an (m+1)th-order vibration, an alternating voltage is applied to one of the piezoelectric elements 2 secured to the respective opposite ends of the optical member 1 to thereby expand/contract the piezoelectric element 2, and an alternating voltage having a time phase difference of 180° is applied to the other piezoelectric element 2 to thereby expand/contract the same (see FIG. 5B). As a consequence, out-of-plane bending deformations with respective phases reverse to each other occur at the respective opposite ends of the optical member 1, which makes it possible to excite vibration efficiently.

A description will be given of a method of exciting the two vibrations with the respective time phases made different from each other by 90° and then superposing the vibrations. FIG. 6 is a table showing alternating voltages applied to the pair of respective piezoelectric elements when m is an odd number. In this table, there are shown alternating voltages applied so as to excite (a) the mth-order out-of-plane bending vibration, (b) the (m+1)th-order out-of-plane bending vibration, (c) the (m+1)th-order out-of-plane bending vibration with a time phase difference of 90°, and (d) the vibration obtained by superposing (a) and (c) in the vibrator 3.

In the table, the amplitude and time phase of each alternating voltage applied are expressed by a real number component and an imaginary number component, respectively. Further, a ratio between the amplitude of the mth-order out-of-plane bending vibration and that of the (m+1)th-order out-of-plane bending vibration in a case where a certain alternating voltage is applied is set to A:1, and the amplitude of each alternating voltage to be applied so as to obtain the same amplitude is normalized by the amplitude of the alternating voltage applied for the mth-order out-of-plane bending vibration.

In order to superpose (a) the mth-order out-of-plane bending vibration and (c) the (m+1)th-order out-of-plane bending vibration with a time phase difference of 90°, it suffices to add the alternating voltage for (a) and that for (c). More specifically, it suffices that, as shown in (d), the real number component of the alternating voltage to be applied to one of the piezoelectric elements 2 is set to a value of 1, and the imaginary number component thereof to a value of A, while the real number component of the alternating voltage to be applied to the other piezoelectric element 2 is set to a value of 1, and the imaginary number component thereof to a value of −A. In other words, by controlling the amplitude and phase of each of the alternating voltages applied to the respective two piezoelectric elements 2 according to the ratio of gains of the amplitudes of the respective vibrations with respect to an alternating voltage of a certain frequency, it is possible to control the amplitude ratio (e.g. 1:1) and the time phase difference between the two vibrations (e.g. 90°).

Further, if the amplitude ratio between the two vibrations with respect to an alternating voltage of a certain frequency is 1:1 (A=1), the real number component of the alternating voltage applied to one of the piezoelectric elements 2 is set to a value of 1, and the imaginary number component thereof is also set to a value of 1, while the real number component of the alternating voltage applied to the other piezoelectric element 2 is set to a value of 1, and the imaginary number component thereof to a value of −1. As a consequence, the amplitude ratio between the two vibrations becomes 1:1, and the time phase difference becomes 90°.

As described above, by making the time phases of the respective alternating voltages applied to one of the piezoelectric elements 2 and the other piezoelectric element 2 different from each other by 90°, it is possible to simultaneously excite the mth-order out-of-plane bending vibration and the (m+1)th-order out-of-plane bending vibration with a time phase difference of 90°. Further, by controlling not only the amplitude and phase of each alternating voltage, but also the frequency thereof, it is possible to control the manner of superposing the two vibrations, as desired.

In the present embodiment, to obtain an amplitude ratio of 1:1 between the two vibrations, there has been devised the following method: A voltage is generated between the sensor electrode 2S and the ground electrode 2G in FIG. 3 by the piezoelectric effect of the piezoelectric element 2. The control circuit 6 detects the voltage between the sensor electrode 2S and the ground electrode 2G by each of the piezoelectric elements 2a and 2b provided on the respective opposite ends of the vibrator 3. The control circuit 6 calculates each of the amplitude values of the respective two vibrations based on the detected voltage between the sensor electrode 2S and the ground electrode 2G, and calculates a ratio between the amplitude values. The control circuit 6 calculates a difference between the calculated ratio of the amplitude values and the target ratio of 1:1 of the amplitude values. The control circuit 6 causes an increase or decrease of at least one of the frequency, the voltage values, and the phase difference of the alternating voltages applied from the respective power supplies 5a and 5b. The control circuit 6 performs feedback control such that when the increase or decrease causes a change in the difference in a decreasing direction, the amount of increase or decrease is increased, whereas when the same causes a change in the difference in an increasing direction, the direction of the increase or decrease is inverted. Thus, the amplitude ratio between the two vibrations can be controlled to 1:1, which makes it possible to move a foreign substance in one direction within a wider area of the optical member 1, thereby achieving a higher removing efficiency.

Figures 7A, 7B:
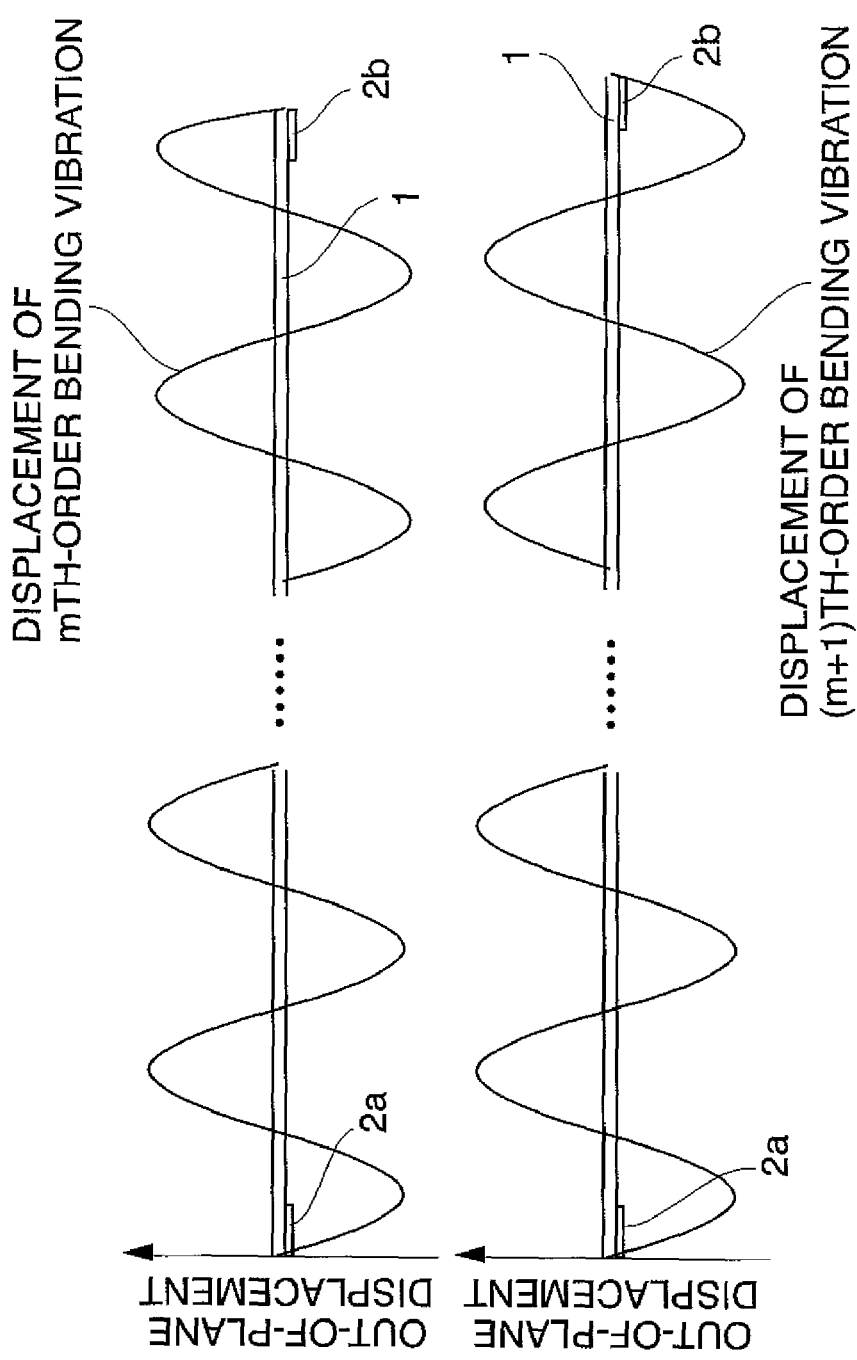
FIG. 7A is a diagram showing displacement of the mth-order out-of-plane bending vibration in the vibrator in a case where m is an even number.
FIG. 7B is a diagram showing displacement of the (m+1)th-order out-of-plane bending vibration in the vibrator in the case where m is an even number.

FIGS. 7A and 7B are diagrams showing displacement of the mth-order out-of-plane bending vibration and displacement of the (m+1)th-order out-of-plane bending vibration in the vibrator 3, respectively, when m is an even number. FIG. 8 is a table showing alternating voltages applied to the pair of respective piezoelectric elements when m is an even number. In this table, there are shown alternating voltages applied so as to excite (a) the mth-order out-of-plane bending vibration, (b) the (m+1)th-order out-of-plane bending vibration, (c) the (m+1)th-order out-of-plane bending vibration with a time phase difference of 90°, and (d) the vibration obtained by superposing (a) and (c) in the vibrator 3. In this case, as in the case where m is an even number, by controlling not only the amplitude and the phase of each alternating voltage, but also the frequency thereof, it is possible to control the manner of superposing the two vibrations, as desired.

Figure 9A:
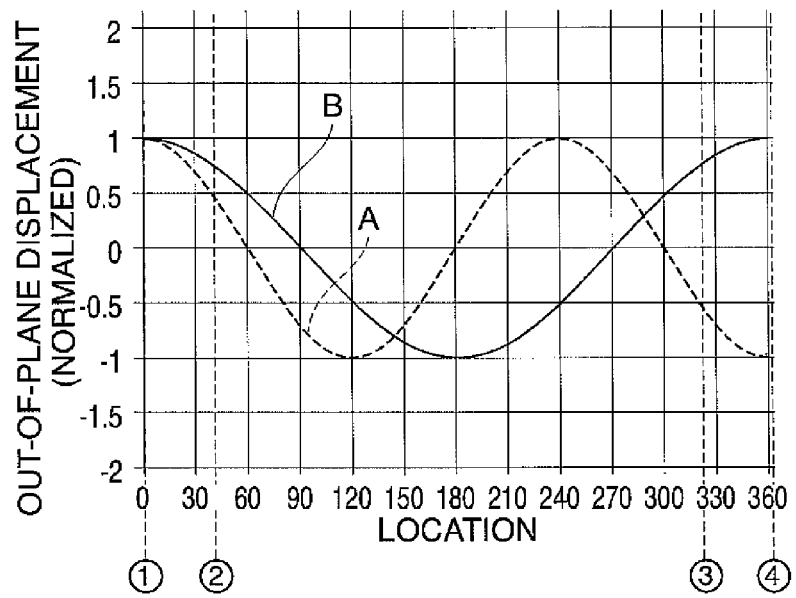
FIGS. 9A and 9B are a diagram showing respective displacements of a first-order out-of-plane bending vibration and a second-order out-of-plane bending vibration which are excited in the vibrator and deformed out of plane along the length of vibrator, and the arrangement of the piezoelectric elements.
Figure 9B:
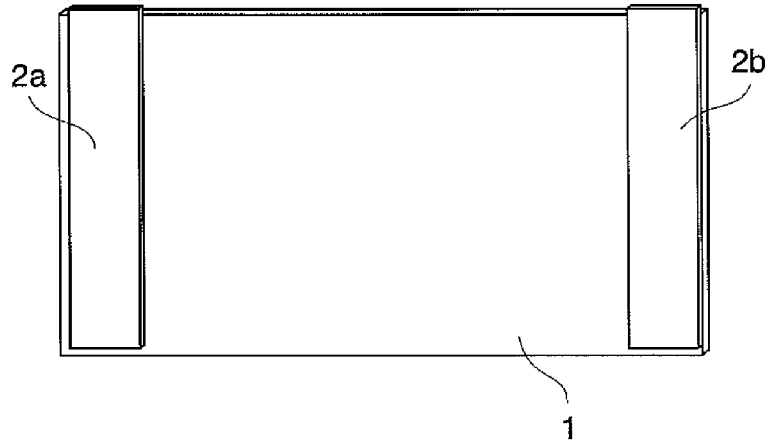
Figure 11:
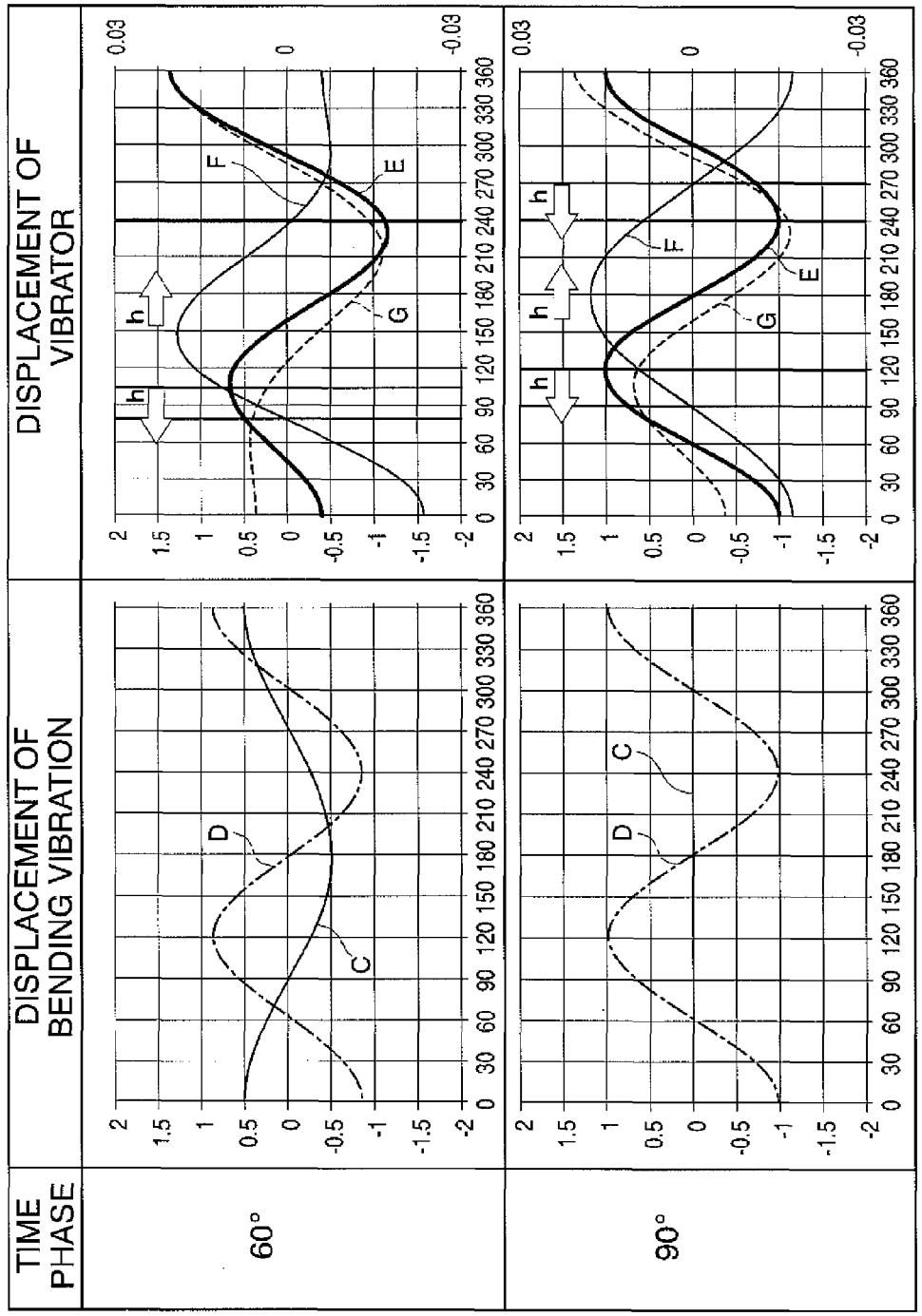
FIG. 11 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 12:
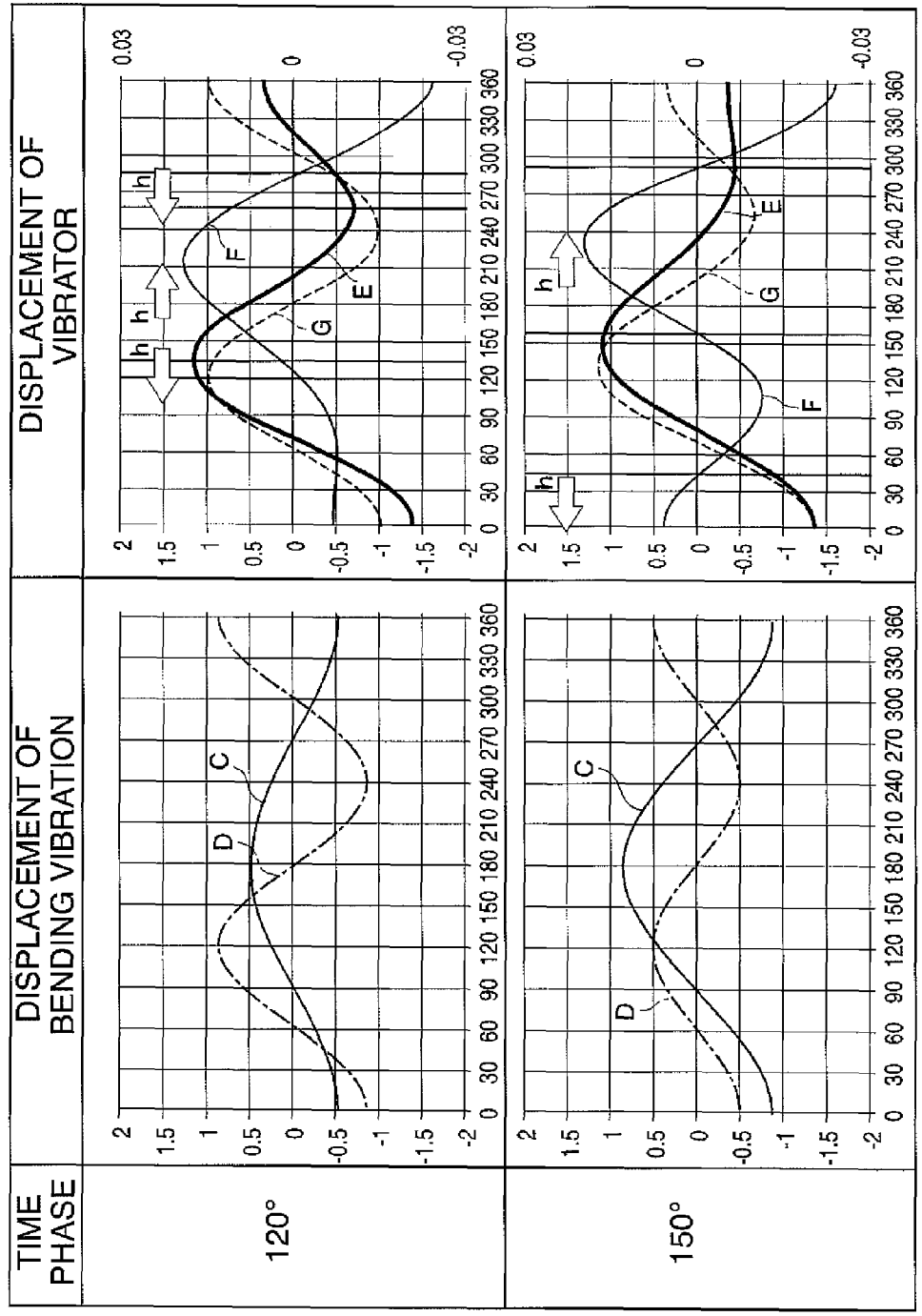
FIG. 12 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 13:
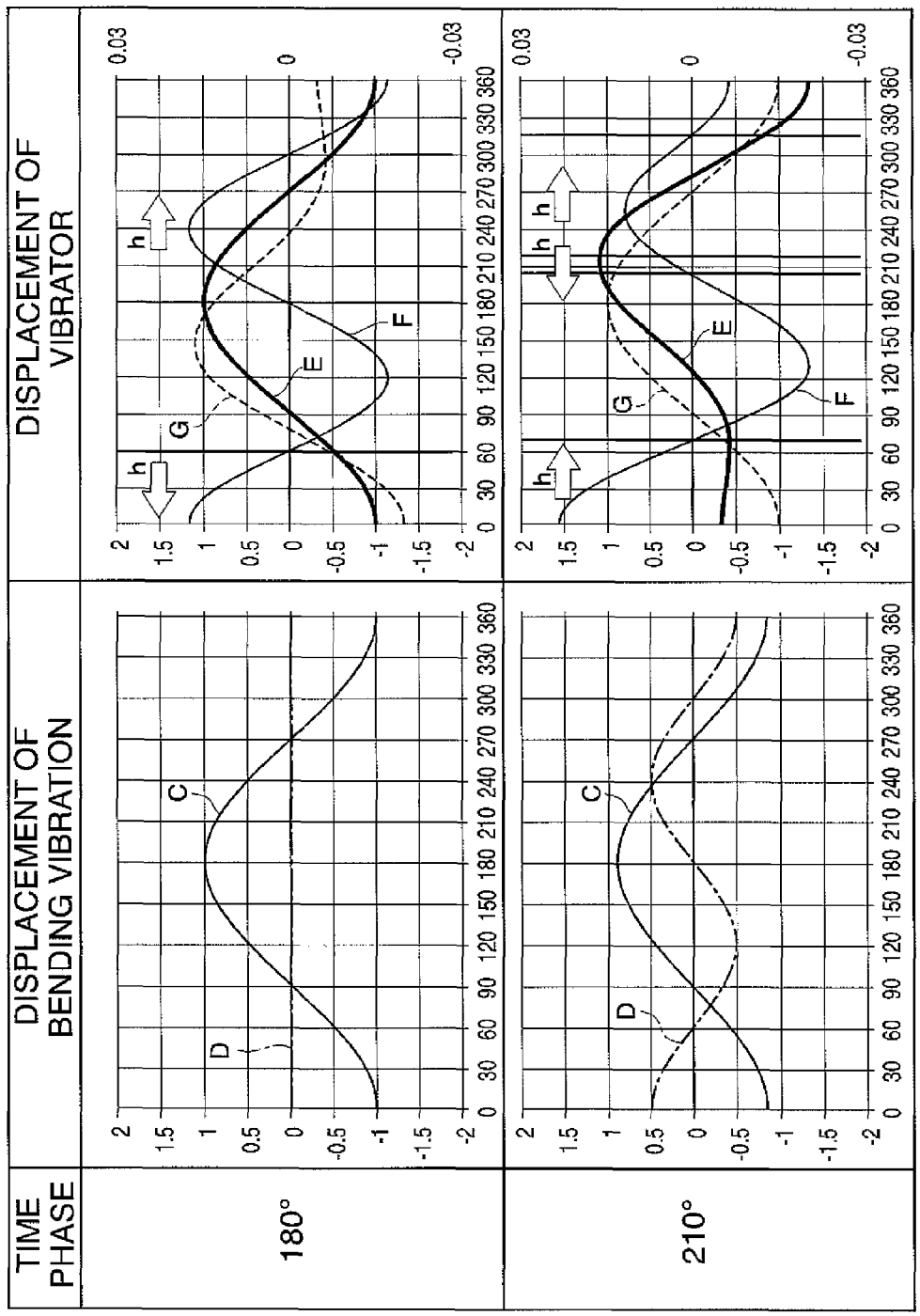
FIG. 13 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 14:
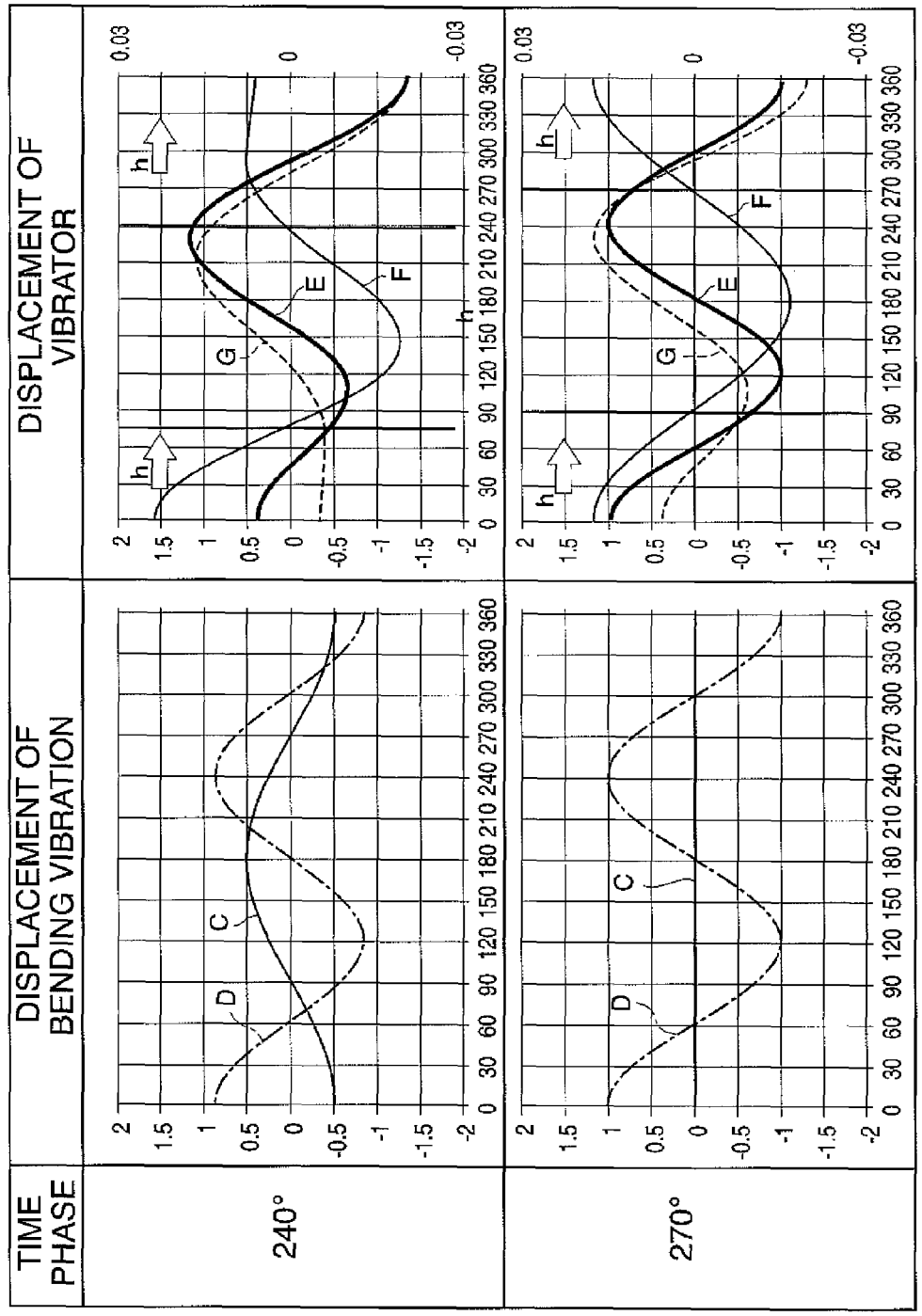
FIG. 14 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 15:
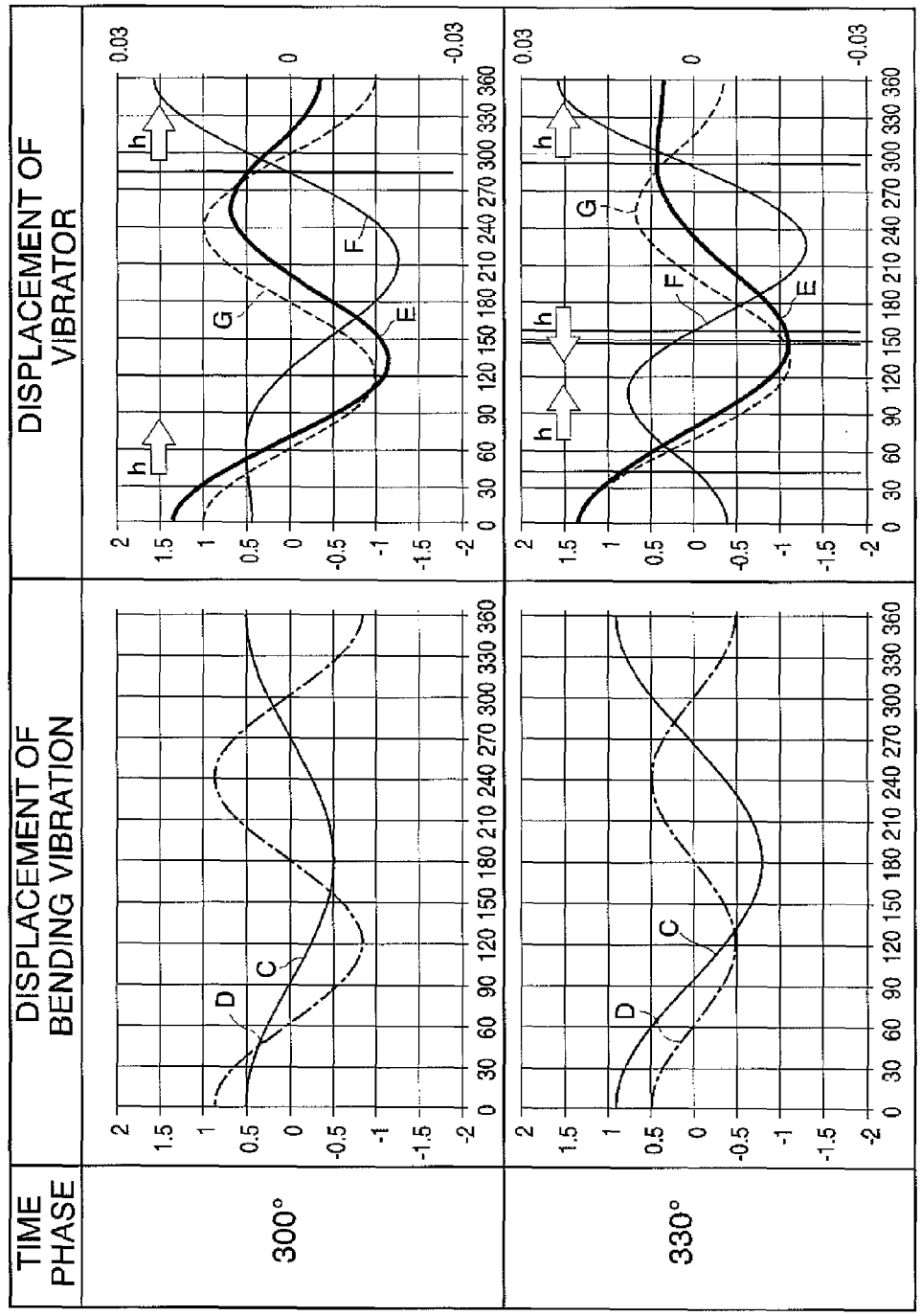
FIG. 15 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 16:
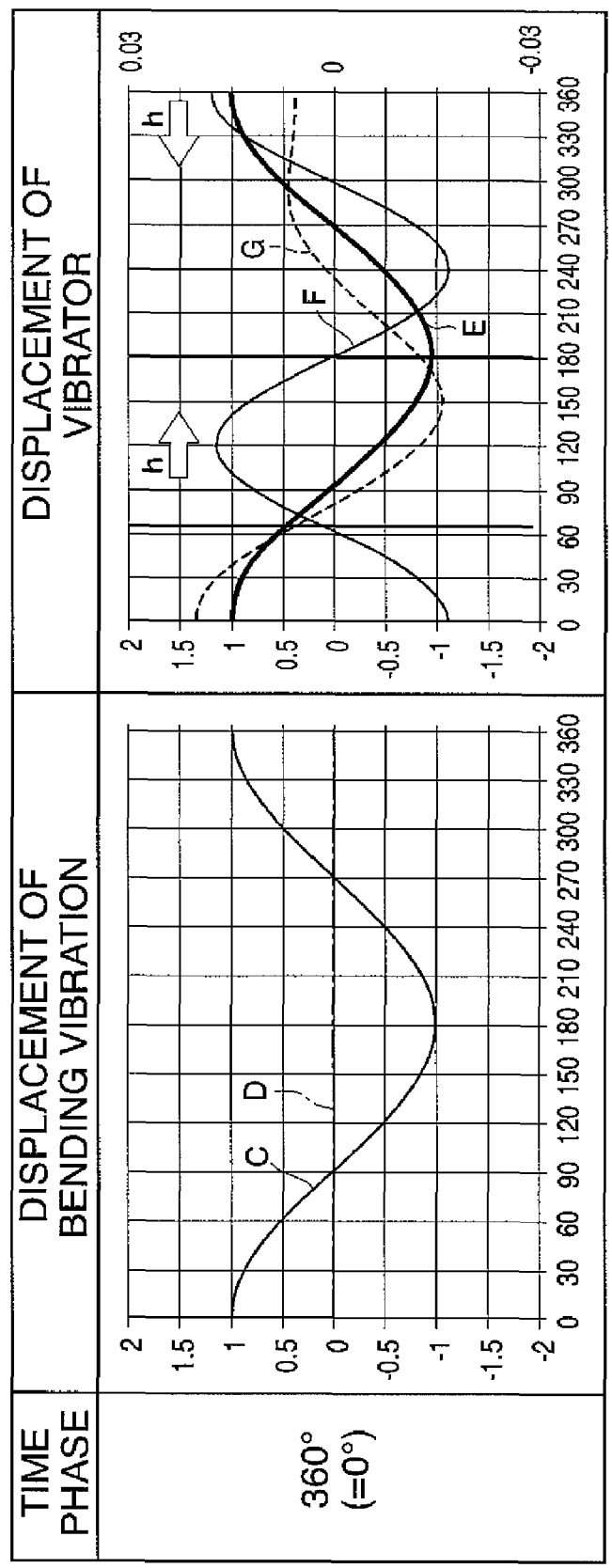
FIG. 16 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.

A method of driving the vibrator 3 of the foreign substance removing device constructed as above will be described in detail. FIGS. 9A and 9B are a diagram showing respective displacements of a first-order out-of-plane bending vibration and a second-order out-of-plane bending vibration which are excited in the vibrator 3 and deformed out of plane along the length of the vibrator 3, and the arrangement of the piezoelectric elements 2a and 2b. The abscissa represents the position of the vibrator 3 in a case where the longitudinal length of the vibrator 3 is set to "360". The ordinate represents values obtained by normalizing the out-of-plane displacement. In FIGS. 9A and 9B, a waveform B shows the first-order out-of-plane bending vibration, and a waveform A shows the second-order out-of-plane bending vibration.

The piezoelectric elements 2a and 2b are disposed with their positions shifted from each other in the direction of arrangement of the nodes of the out-of-plane bending vibrations, in a manner adapted to displacement of the vibrator 3. Specifically, the piezoelectric element 2a is disposed at a left end, as viewed in FIGS. 9A and 9B, where bending directions of the two out-of-plane bending vibrations coincide. On the other hand, the piezoelectric element 2b is disposed at a right end, as viewed in FIGS. 9A and 9B, where the bending directions of the two out-of-plane bending vibrations are reverse to each other.

Similarly to the case of exciting the mth-order out-of-plane bending vibration and the (m+1)th-order out-of-plane bending vibration in the vibrator 3, alternating voltages for the same vibration period and with a time phase difference of 90° are applied to the respective piezoelectric elements 2a and 2b. The frequency of the alternating voltages is set such that it is between the resonance frequency of the first-order out-of-plane bending vibration and that of the second-order out-of-plane bending vibration, which are deformed out of plane along the length of the vibrator 3, and at the same time, the amplitude ratio between the two vibrations becomes 1:1. As a consequence, the first-order out-of-plane bending vibration having large displacement with a response of the resonance phenomenon and the second-order out-of-plane bending vibration having a time phase difference of 90° (i.e. earlier by 90° with respect to the first-order out-of-plane bending vibration) are excited in the vibrator 3 with the same amplitude and at the same vibration period.

FIGS. 10, 11, 12, 13, 14, 15, and 16 show graphs showing respective displacements of the first-order out-of-plane bending vibration and the second-order out-of-plane bending vibration in a case where the time phase difference between the two vibrations is set to 90°, and displacement of the vibrator resulting from superposition of the two vibrations, on a time phase-by-time phase basis. In these figures, a waveform C represents the displacement of the first-order out-of-plane bending vibration. A waveform D represents the displacement of the second-order out-of-plane bending vibration. A waveform E represents the displacement of the vibrator resulting from superposition of the two vibrations. A waveform G represents the displacement of the vibrator 3 in a 30° earlier time phase than the time phase of the waveform E. A waveform F represents the normalized Y-direction displacement speed of the vibrator 3.

The image pickup device 4 is located at the negative side in the Y direction (see FIG. 10) with respect to the optical member 1. Light incident on the optical member 1 from the positive side in the Y direction passes through a portion of the optical member 1 between a location 60 and a location 300 and reaches a light-receiving surface of the image pickup device 4. In short, the effective portion of the optical member 1 for the image pickup device 4 is an area ranging from the location 60 to the location 300. A space between the optical member 1 and the image pickup device 4 is hermetically sealed so as to prevent a foreign substance from adhering to the rear surface of the optical member 1 (corresponding to the lower face of the waveform E). On the other hand, a foreign substance having entered the camera from the outside or a foreign substance produced within the camera can adhere to the front surface of the optical member 1. If a foreign substance remains in the area ranging from the location 60 to the location 300, light is blocked by the foreign substance, whereby a shadow is formed on an image picked up by the image pickup device 4.

Next, a description will be give of how a foreign substance is moved when the foreign substance removing device is operated. When the optical member 1 thrusts up a foreign substance out of plane (i.e. in the positive Y direction in FIG. 10), the foreign substance on the front surface of the optical member 1 receives a force in the normal direction and is moved in a repelled fashion. More specifically, when the waveform F indicative of the normalized Y-direction displacement speed of the vibrator 3 assumes a positive value in each time phase, the foreign substance is thrust up out of plane, and receives a force in the normal direction of the waveform E indicative of the displacement of the vibrator 3 in this time phase to be moved away. Each arrow h in FIG. 10 indicates a direction in which the foreign substance moves. For example, a left-hand arrow h indicates a direction of movement of the foreign substance in a section defined by locations m and n where the waveform F assumes a positive value.

As can be understood from FIGS. 10 to 16, when a foreign substance is adherent at the location 60, the foreign substance moves in the positive X direction within a range between a time phase of 210° and a time phase of 330°. This motion brings the foreign substance close to a location 75. Thereafter, the foreign substance moves in the positive X direction within a range between a time phase of 0° (=360°) and a time phase of 30° and a range between a time phase 270 and a time phase of 330°, and temporarily moves in the negative X direction in the vicinity of the time phase 60°. However, during one period of vibration, the amount of vibration for moving the foreign substance in the positive X direction is much larger than the amount of vibration for moving the foreign substance in the negative X direction, and therefore the foreign substance moves in the positive X direction.

The above-described movement is repeated, whereby the foreign substance moves up to a location 90. Similarly, when vibration is further repeatedly applied to the foreign substance, the foreign substance continues to move in the positive X direction and reaches a location beyond the location 300.

Thus, the foreign substance can be removed from the area ranging from the location 60 to the location 300 as the effective portion of the optical member 1 for the image pickup device 4. Further, if a foreign substance adherent anywhere within the area ranging from the location 60 to the location 300 as the effective portion of the optical member 1, the foreign substance moves in the positive X direction to a positive location beyond the location 300, and therefore it is possible to remove the foreign substance.

It should be noted that although in the above described embodiment, the time phase difference between the two vibrations is set to 90°, the time phase difference may be set to a value larger than 0° and smaller than 180°. In this case, when the out-of-plane displacement speed is positive, the vibrator 3 can be deformed such that the X component in the normal direction of the waveform E indicative of the displacement of the vibrator 3 becomes positive. Therefore, in this case as well, it is possible to move the foreign substance in the positive X direction by repeatedly applying vibration to the foreign substance. On the other hand, when the time phase difference between the two vibrations is larger than −180° and smaller than 0°, the foreign substance moves in the negative X direction, and therefore it is possible to move the foreign substance to a more negative location than the location 60 in the X direction. In short, by setting the time phase difference between the two vibrations to a value other than 0° and 180°, it is possible to move a foreign substance, thereby removing the foreign substance from the effective area, i.e. the effective portion of the optical member 1. This makes it possible to increase the degree of freedom in setting the time phase difference.

According to the foreign substance removing device of the first embodiment, the time phase difference between two voltages generated by the power supplies 5*a* and 5*b* to be applied to the respective piezoelectric elements 2*a* and 2*b* is controlled using the control circuit 6, whereby the time phase difference between two vibrations can be controlled. This makes it possible to control the direction in which a foreign substance is moved. Further, it is possible to move the foreign substance in the same direction in a wider area on the optical member 1 by controlling the amplitude values of the respective two vibrations to a ratio of approximately 1:1, to thereby realize a higher removing efficiency. Furthermore, the foreign substance can be moved in the same direction in a wider area on the optical member 1 by setting the time phase difference between the two vibrations to 90° or −90°, which makes it possible to realize a higher removing efficiency.

It should be noted that since the foreign substance removing device according to the first embodiment is installed in the camera 10, it is possible to detect a location of a foreign substance using the image pickup device 4 and the image processing section 8 provided in the camera 10. By moving the foreign substance in a direction in which the outside of the effective portion (effective area) of the optical element 1 is closer, depending on the detected location of the foreign substance, it is possible to remove the foreign substance in a shorter time, thereby realizing a higher removing efficiency. Furthermore, it is possible to detect the attitude of the optical member 1 using the attitude sensor 7 provided in the camera 10. By controlling the time phase difference between the two vibrations such that an angle between a direction of movement of the foreign substance and a direction of gravity, which is determined from the attitude of the optical member 1 detected by the attitude sensor 7, becomes smaller than 90°, it is possible to make use of gravity to move the foreign substance. This enables quicker removal of the foreign substance to thereby realize a higher removing efficiency. This applies to the other embodiments described hereinafter.

Now, a description will be given of a method of driving the foreign substance removing device that removes a foreign substance, using the image pickup device 4 and the image processing section 8 provided in the camera 10.

Figure 17:
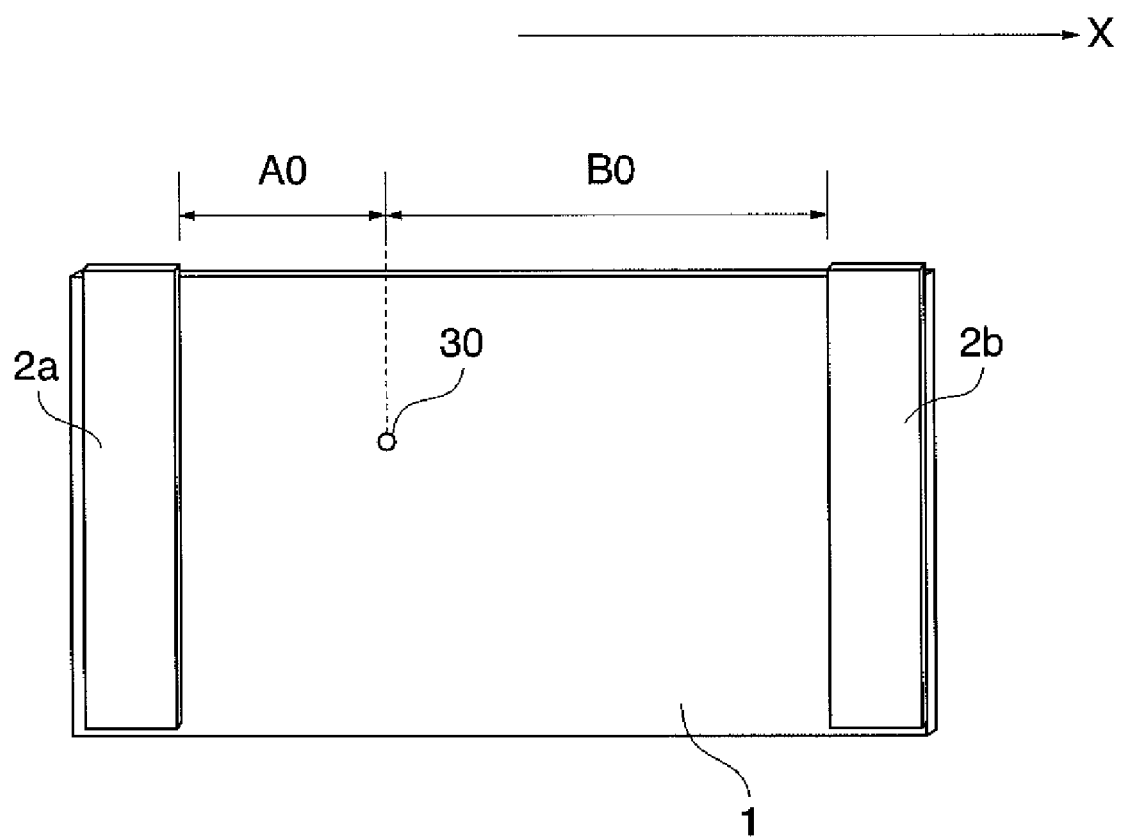
FIG. 17 is a view showing a location of a foreign substance adhering to the front surface of the optical member of the vibrator.

FIG. 17 is a view showing a location of a foreign substance 30 adhering to the front surface of the optical member 1 of the vibrator 3. In FIG. 17, reference numeral A0 designates a distance in the negative X direction in the figure between the foreign substance 30 and an area outside the effective portion of the optical member 1 for the image pickup device 4, and reference numeral B0 designates a distance in the positive X direction in the figure between the foreign substance 30 and an area outside the effective portion of the optical member 1 for the image pickup device 4.

Figure 18:
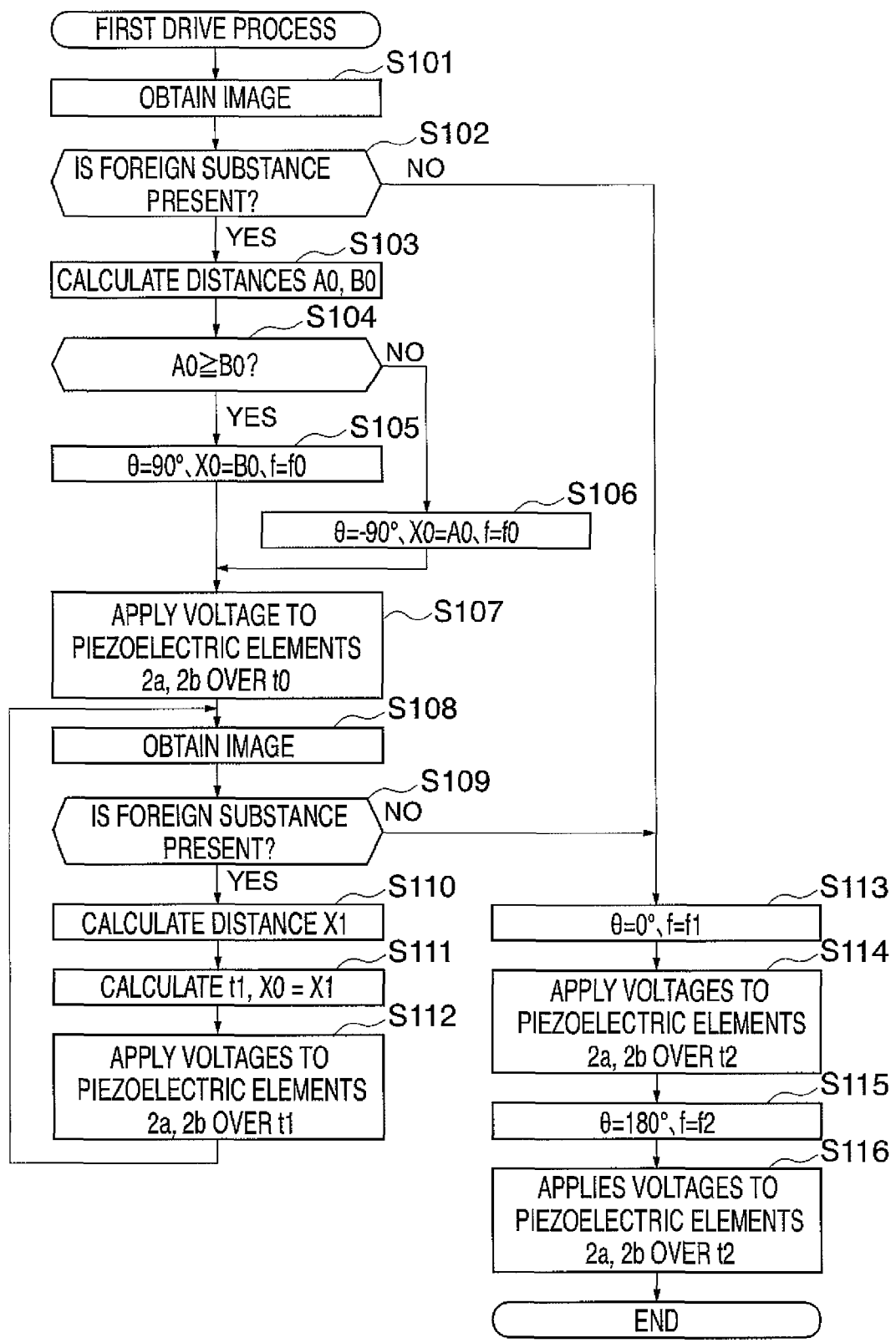
FIG. 18 is a flowchart of a first drive process for driving the vibrator of the foreign substance removing device.

FIG. 18 is a flowchart of a first drive process for driving the vibrator 3 of the foreign substance removing device.

Referring to FIG. 18, first, an image including an image of a foreign substance is obtained by the image pickup device 4 (step S101). For example, only an image of the foreign substance is obtained by turning on a light source within the camera with the shutter of the camera closed. Alternatively, shooting is performed with a composition in which an object (e.g. a white sheet) uniform in luminance and color occupies the entire angle of view, whereby an image comprised of the object and the foreign substance is obtained.

In a step S102, the image processing section 8 analyzes the image obtained by the image pickup device 4, to thereby determine whether or not a specific foreign substance which will probably have a serious effect on a picked-up image is present in the effective portion of the optical member 1. The specific foreign substance which will probably have a serious effect on a picked-up image includes e.g. an apparently larger foreign substance than the others or a foreign substance located in the vicinity of the central part of a frame. Further, as an example of a foreign substance-determining method, it is possible to envisage a method of determining an area of low luminance as a foreign substance area, or a method of determining an area where an evaluation value of contrast does not change between a plurality of images as a foreign substance area. If it is determined in the step S102 that no specific foreign substance is present in the effective portion of the optical member 1, the process proceeds to a step S113.

In the step S113, the control circuit 6 sets a time phase difference θ between voltages to be applied to the respective piezoelectric elements 2a and 2b such that the time phases are identical (θ=0°), and sets the frequency of each of the voltages such that it becomes substantially equal to a natural frequency f1 of the first-order out-of-plane bending vibration.

In a step S114, the control circuit 6 causes the voltages with the time phase difference therebetween set such that the time phases are identical to be applied to the respective piezoelectric elements 2a and 2b over a predetermined limited time period t2. This excites a standing wave of the first-order out-of-plane bending vibration in the vibrator 3 of the foreign substance removing device in a resonant state, and a foreign substance located in the vicinity of the antinode of the standing wave is caused to jump off the surface of the optical member 1. At a location out of the plane of the optical member 1, there is provided an adhesive, and the substance caused to jump off is collected by the adhesive. It should be noted that the voltage set in the step S113 may be applied to only one of the piezoelectric elements 2a and 2b to thereby excite a single standing wave of the first-order out-of-plane bending vibration in the vibrator 3 of the foreign substance removing device.

In a step S115, the control circuit 6 sets the time phase difference θ between voltages to be applied to the respective piezoelectric elements 2a and 2b to 180°, and sets the frequency of each of the voltages such that it becomes substantially equal to a natural frequency f2 of the second-order out-of-plane bending vibration.

In a step S116, the control circuit 6 causes voltages with a time phase difference therebetween set such that the time phases are reverse to each other to be applied to the respective piezoelectric elements 2a and 2b over the predetermined limited time period t2. This excites only a single standing wave of the second-order out-of-plane bending vibration in the vibrator 3 of the foreign substance removing device in a resonant state, and the foreign substance located in the vicinity of the antinode of the standing wave is caused to jump out of plane of the optical member 1 and is collected by the adhesive. The standing waves different in order are excited in the respective steps S114 and S116 so as not to produce an area where no vibration occurs in the optical member 1, by displacing the positions of the nodes of one of the standing waves from those of the nodes of the other. It should be noted that the voltage set in the step S115 may be applied to only one of the piezoelectric elements 2a and 2b to thereby excite a single standing wave of the second-order out-of-plane bending vibration in the vibrator 3 of the foreign substance removing device.

Then, the driving of the vibrator 3 for removing a foreign substance is terminated.

On the other hand, if it is determined in the step S102 that a specific foreign substance, e.g. a foreign substance 30, is present in the effective portion of the optical member 1, the process proceeds to a step S103.

In the step S103, the image processing section 8 calculates the distance A0 in the negative X direction in FIG. 17 between the foreign substance 30 and an area outside the effective portion of the optical member 1, and the distance B0 in the positive X direction in FIG. 17 between the foreign substance 30 and an area outside the effective portion of the optical member 1.

In a step S104, the image processing section 8 performs comparison between the distance A0 and the distance B0. If it is determined in the step S104 that the distance A0 is not shorter than the distance B0, the process proceeds to a step S105, whereas if the distance A0 is shorter than the distance B0, the process proceeds to a step S106.

In the step S105, the control circuit 6 sets the time phase difference θ between the voltage to be applied to the piezoelectric element 2a and the voltage to be applied to the piezoelectric element 2b to 90°, and sets an initial value X0 of the distance between the foreign substance 30 and the area outside the effective portion of the optical member 1 to B0. Further, the frequency of the voltages is set to the frequency f0 so that the amplitude ratio between mth-order and (m+1)th-order (first-order and second-order, in the present embodiment) out-of-plane bending vibrations will become 1:1. Then, the process proceeds to a step S107.

In the step S106, the control circuit 6 sets the time phase difference θ between the voltage to be applied to the piezoelectric element 2a and the voltage to be applied to the piezoelectric element 2b to −90°, and sets the initial value X0 of the distance between the foreign substance 30 and the area outside the effective portion of the optical member 1 to A0. Then, the process proceeds to the step S107.

In the step S107, the control circuit 6 causes the voltages with the time phase difference set in the step S105 or S106 to be applied to the respective piezoelectric elements 2a and 2b over a predetermined specified time period t0. As a consequence, the foreign substance 30 is moved toward the area outside the effective portion of the optical member 1 on the closer side along the X direction.

In the first drive process, the direction in which the foreign substance 30 is moved is switched by selectively setting the time phase difference θ between the voltages to be applied to the respective piezoelectric elements 2a and 2b to 90° or −90°, but this is not limitative. The direction in which the foreign substance 30 is moved is determined depending on whether the time phase difference θ between the first-order out-of-plane bending vibration and the second-order out-of-plane bending vibration falls within a range of 0°<θ<180° or within a range of −180<θ<0°, and therefore the time phase difference θ can be set to any within these ranges. Further, as described in detail hereinafter in a second embodiment, it is also possible to switch the direction in which a foreign substance is moved, by changing the amplitude ratio between the voltages to be applied to the respective piezoelectric elements 2a and 2b.

Then, in a step S108, an image is obtained again by the image pickup device 4.

In a step S109, the image processing section 8 determines whether or not a specific foreign substance is present in the effective portion of the optical member 1. If it is determined in the step S109 that a specific foreign substance, e.g. the foreign substance 30, is present in the effective portion of the optical member 1, the process proceeds to a step S110.

In the step S110, the image processing section 8 analyzes the image obtained again by the image pickup device 4 to thereby calculate a new distance X1 between the foreign substance 30 and the area outside the effective portion of the optical member 1.

In a step S111, the image processing section 8 calculates a foreign substance movement amount ΔX from the distance X1 calculated anew and the initial value X0. The foreign substance movement amount ΔX is calculated by an equation of ΔX=X1−X0. Then, a foreign substance-moving speed V is calculated from ΔX and t0. The foreign substance-moving speed V is calculated by an equation of V=ΔX/t0. Then, a new voltage application time period t1 is calculated from X1 and V. The voltage application time period t1 is calculated by an equation of t1=X1/V. Further, X1 is substituted for X0.

In a step S112, the control circuit 6 causes the voltages having the time phase difference set in the step S105 or S106 to be applied to the respective piezoelectric elements 2a and 2b over the predetermined specified time period t1. As a consequence, the foreign substance 30 is moved toward the area outside the effective portion of the optical member 1 on the closer side along the X direction.

Then, the process returns to the steps S108 and S109, and the steps S108 to S112 are repeatedly executed until no foreign substance 30 is detected, whereby the foreign substance 30 is removed from the effective portion of the optical member 1 and is collected in the area outward of the location 60 or 300.

On the other hand, if it is determined in the step S109 that no specific foreign substance is present in the effective portion of the optical member 1, the steps S113 to S116 are executed to thereby sequentially excite standing waves of out-of-plane bending vibrations different in order in the vibrator 3 in a resonance state.

In a case where the standing wave of the first-order or second-order out-of-plane bending vibration is excited, the area outward of the location 60 or 300 in FIGS. 9A and 9B is located close to the antinode of the standing wave. Therefore, the foreign substances collected through the steps S103 to S112 can be effectively caused to jump off the surface of the optical member 1.

As described above, according to the first drive process, it is possible to move the foreign substance 30 to the area outside the effective portion of the optical member 1 in a shorter time, and to effectively cause the foreign substances moved to the area to jump out of the effective portion of the optical member 1.

Next, a description will be given of a second drive process for driving the vibrator 3, which is different from the first drive process.

As distinct from the above-described first drive process in which the time phase difference θ between the voltages to be applied to the respective piezoelectric elements 2a and 2b is set according to the distance between the foreign substance 30 and an area outside the effective portion of the optical member 1, in the second drive process, the time phase difference θ between the voltages to be applied to the respective piezoelectric elements 2a and 2b is set according to the positional relationship between the center-of-gravity position 31 of the foreign substance 30 and a contact portion between the foreign substance 30 and the optical member 1.

Figure 19:
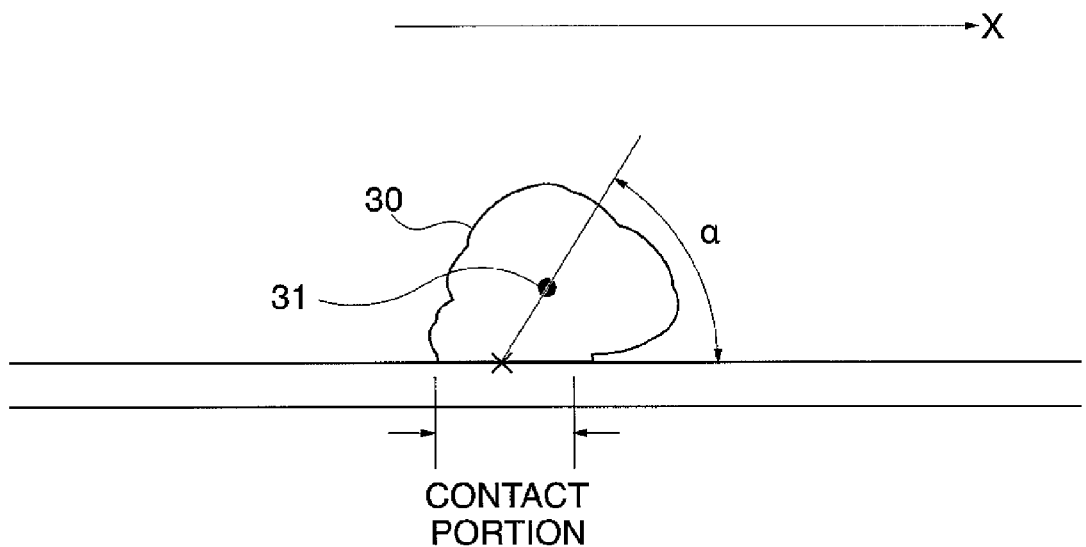
FIG. 19 is a view showing the cross section of the optical member of the vibrator, the foreign substance adhering to the front surface of the optical member, and the center-of-gravity position of the foreign substance.
Figure 20:
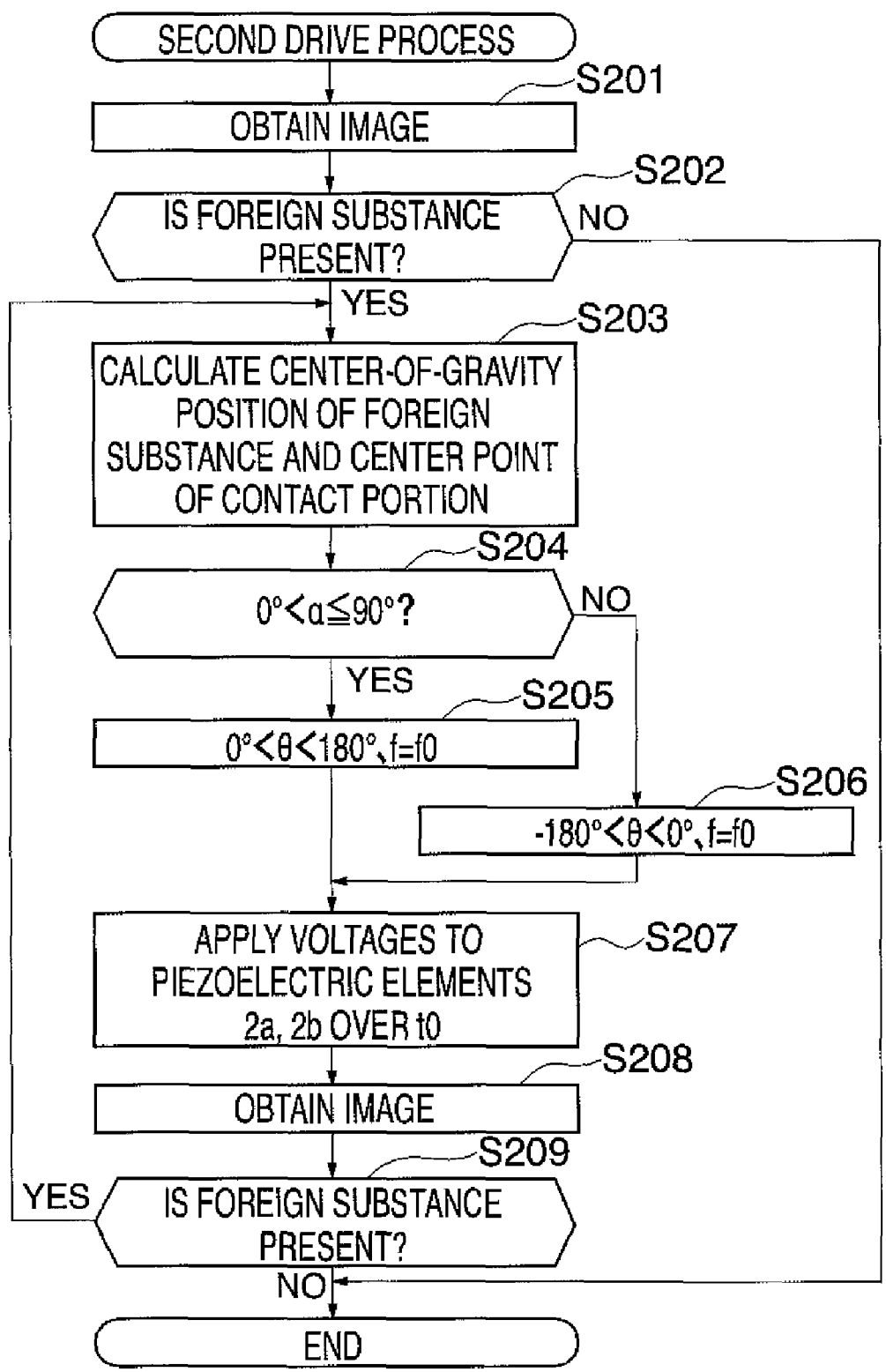
FIG. 20 is a flowchart of a second drive process for driving the vibrator of the foreign substance removing device.

FIG. 19 is a view showing the cross section of the optical member 1 in the vibrator 3, the foreign substance 30 adhering to the front surface of the optical member 1, and the center-of-gravity position 31 of the foreign substance 30, and FIG. 20 is a flowchart of the second drive process for driving the vibrator 3 in the foreign substance removing device.

Referring to FIG. 19, a symbol α designates an angle formed by a straight line connecting between the center-of-gravity position 31 of the foreign substance 30 and the center point of the contact portion between the foreign substance 30 and the optical member 1, and the front surface of the optical member 1.

Referring to FIG. 20, first, an image including an image of a foreign substance is obtained by the image pickup device 4 (step S201). For example, an image having only an image of a foreign substance taken therein is obtained by turning on the light source within the camera with the shutter of the camera closed.

In a step S202, the image processing section 8 determines, based on the image obtained by the image pickup device 4, whether or not a specific foreign substance which will probably have a serious effect on a picked-up image is present in the effective portion of the optical member 1. If it is determined in the step S202 that no specific foreign substance is present in the effective portion of the optical member 1, the second drive process is terminated, whereas if a specific foreign substance, e.g. the foreign substance 30, is present in the effective portion of the optical member 1, the process proceeds to a step S203.

In the step S203, the image processing section 8 analyzes the image obtained by the image pickup device 4, to thereby calculate an approximate center-of-gravity position 31 of the foreign substance 30 from the outer shape of the foreign substance 30 adhering to the surface of the effective portion of the optical member 1. For example, the center position of the foreign substance 30 calculated from the outer shape of the same is regarded as the center-of-gravity position 31. Further, the image processing section 8 calculates the center point of the contact portion between the foreign substance 30 and the optical member 1. Specifically, since the contact portion between the foreign substance 30 and the optical member 1 looks darkest inside the outer shape of in the foreign substance 30, the center position of the darkest area is obtained as the center point of the contact portion between the foreign substance 30 and the optical member 1.

In a step S204, the image processing section 8 performs comparison between the center point of the contact portion and the center-of-gravity position 31 to thereby determine whether the angle α falls in a range of $0°<α≦90°$ or within a range of $9°<α<180°$. If it is determined in the step S204 that the angle α falls in the range of $0°<α≦90°$, the process proceeds to a step S205, whereas if the angle α falls in the range of $90°<α<180°$, the process proceeds to a step S206.

In the step S205, the control circuit 6 sets the time phase difference θ between the voltage to be applied to the piezoelectric element 2a and the voltage to be applied to the piezoelectric element 2b to a value larger than 0° and smaller than 180°. This is because if the angle α falls in the range of $0°<α≦90°$ in FIG. 19, the amount of movement of the foreign substance 30 thrust up out of plane is larger when receiving a force containing a positive component in the X direction in FIG. 19 than when receiving a force containing a negative component in the X direction. Further, the frequency of the voltages is set to f0 so that the amplitude ratio between m-order and (m+1)-order (first-order and second-order, in the present embodiment) out-of-plane bending vibrations will become 1:1.

In the step S206, the control circuit 6 sets the time phase difference θ between the voltage to be applied to the piezoelectric element 2a and the voltage to be applied to the piezoelectric element 2b to a value larger than −180° and smaller than 0°. This is because if the angle α falls in the range of $90°<α<180°$ in FIG. 19, the amount of movement of the foreign substance 30 thrust up out of plane is larger when receiving a force containing a negative component in the X direction in FIG. 19 than when receiving a force containing a positive component in the X direction. Further, the frequency of the voltages is set to f0.

It should be noted that when the angle α is equal to 90°, the amount of movement of the foreign substance 30 is the same whether the foreign substance 30 receives a positive force or a negative force in the X direction, but in the present embodiment, the time phase difference θ is set to a value larger than 0° and smaller than 180°.

In a step S207, the control circuit 6 causes the voltages with the time phase difference set in the step S205 or S206 to be applied to the respective piezoelectric elements 2a and 2b over the predetermined specified time period t0. As a consequence, it is possible to move the foreign substance 30 toward the area outside the effective portion of the optical member 1.

Then, in a step S208, an image is obtained again by the image pickup device 4.

In a step S209, the image processing section 8 determines again whether or not a specific foreign substance is present in the effective portion of the optical member 1. If it is determined in the step S209 that no specific foreign substance is present in the effective portion of the optical member 1, the second drive process is terminated, whereas if a specific foreign substance, e.g. the foreign substance 30, is present in the effective portion of the optical member 1, the process returns to the step S203.

As described above, according to the present second drive process, the time phase difference between the voltages to be applied to the respective piezoelectric elements 2a and 2b is set such that a foreign substance adhering to the effective portion of the optical member 1 is more largely moved, and voltage application is repeatedly performed, so that the foreign substance adhering to the effective portion of the optical member 1 can be positively caused to jump off.

Next, a description will be given of a third drive process for driving the vibrator 3, which is different from the first and second drive processes.

In the third drive process, when a plurality of foreign substances which will probably have a serious effect on a picked-up image are present, the degree of adverse influence of each foreign substance on image quality is calculated based on the location, size, and density of the foreign substance, and the priorities of the specific foreign substances to be removed are determined. Then, the foreign substances are sequentially removed in order of decreasing degree of influence.

Figure 24:
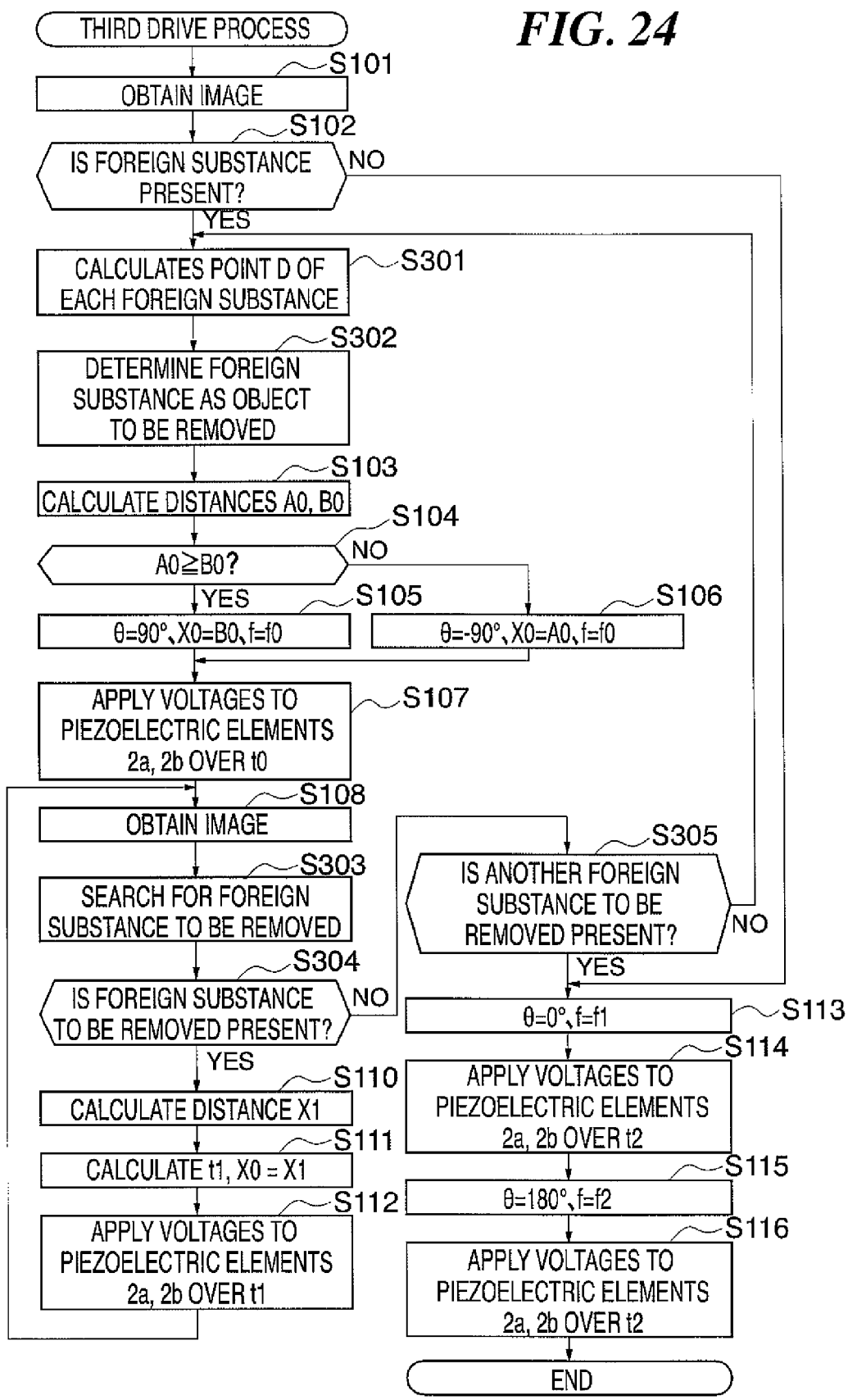
FIG. 24 is a flowchart of a third drive process for driving the vibrator of the foreign substance removing device.

FIG. 24 is a flowchart of the third drive process for driving the vibrator 3 in the foreign substance removing device. In FIG. 24, steps identical to those in FIG. 18 are designated by identical step numbers.

Referring to FIG. 24, first, an image including an image of a foreign substance is obtained by the image pickup device 4 (step S101).

In the step S102, the image processing section 8 analyzes the image obtained by the image pickup device 4, to thereby determine whether or not a specific foreign substance which will probably have a serious effect on a picked-up image is present in the effective portion of the optical member 1. If it is determined in the step S102 that no specific foreign substance is present in the effective portion of the optical member 1, the process proceeds to the steps S113 to S116. In the steps S113 to S116, the same processing as executed in the steps S113 to S116 in FIG. 18 is carried out, followed by terminating the present third drive process.

On the other hand, if a specific foreign substance, e.g. the foreign substance 30, is present in the effective portion of the optical member 1, the process proceeds to a step S301.

In the step S301, if a plurality of foreign substances are present in the effective portion of the optical member 1, the image processing section 8 calculates a final point D of each foreign substance so as to prioritize the foreign substances.

Figure 21:
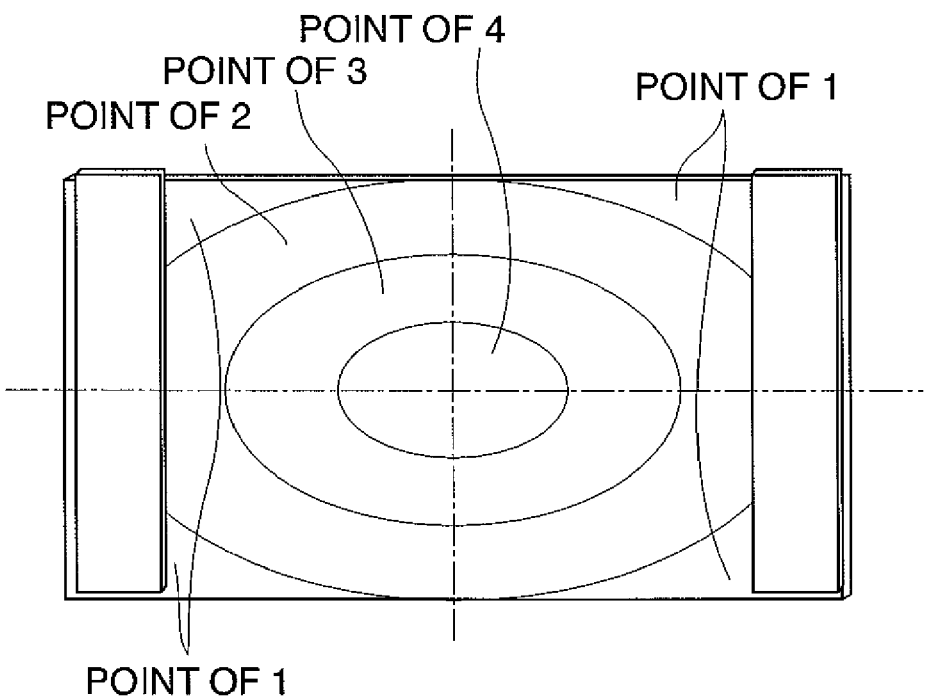
FIG. 21 a view useful in explaining a point A used for determining a final point D of a foreign substance.
Figure 22:
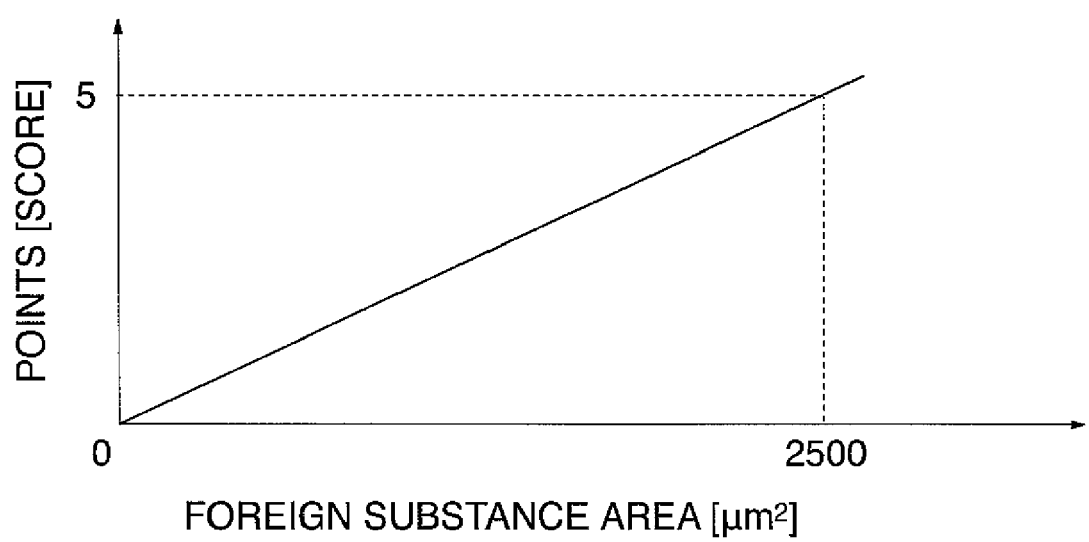
FIG. 22 is a diagram useful in explaining a point B used for determining the final point D of the foreign substance.
Figure 23:
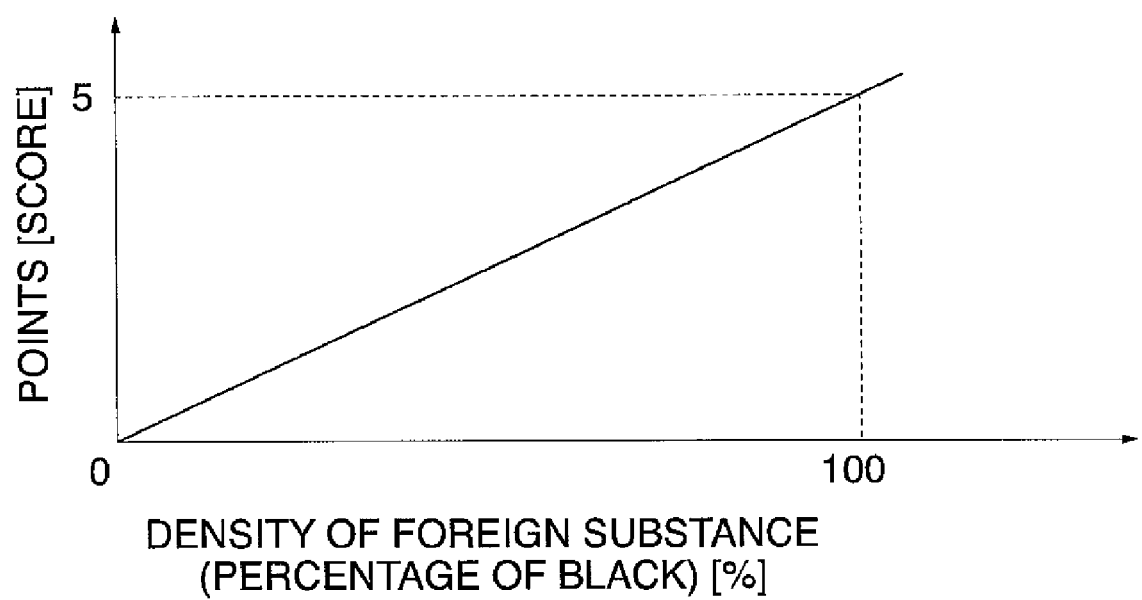
FIG. 23 is a diagram useful in explaining a point C used for determining the final point D of the foreign substance.

FIG. 21 and FIGS. 22 and 23 are a view and diagrams useful in explaining points used for determining the final point D of each foreign substance.

In FIG. 21, there are shown points A determined based on the position of a foreign substance. A foreign substance in a central part of the optical member 1 is regarded as a most serious one to degrade image quality and is given a highest point of 4, and the outer foreign substance is given the lower points. FIG. 22 shows points B determined based on the size of a foreign substance. The abscissa indicates a foreign substance area, and the ordinate indicates points. The point B is calculated by an equation of B=(foreign substance area ($\mu m^2$))×0.002. The larger foreign substance area degrades image quality more seriously, and hence the point B is set to a value corresponding to the size of a foreign substance area. FIG. 23 shows points C each determined based on the density of a foreign substance. The abscissa indicates the percentage of black in a foreign substance shadow whose brightness is below a threshold value, and the ordinate indicates points. The point C is calculated by an equation of C=(percentage (%) of black)×0.05. The final point D of a foreign substance is calculated by an equation of D=A×B×C. A foreign substance with the higher point D is given the higher priority, and foreign substances are sequentially removed in order of priorities.

In the following step S302, the control circuit 6 determines foreign substance 30 with the highest point D as a foreign substance to be removed. Thereafter, the present third drive process is continuously executed while paying attention to the foreign substance 30 alone until the foreign substance 30 is moved into the area outside the effective portion of the optical member 1. It should be noted that when only one foreign substance is present, the steps S301 and S302 can be omitted.

Then, the process proceeds to the steps S103 to S108, and the same processing as executed in the steps S103 to S108 in FIG. 18 is carried out, followed by the process proceeding to a step S303.

In the step S303, the image processing section 8 analyzes the image obtained by the image pickup device 4 in the step S108, to thereby search for the foreign substance 30 determined in the step S302 as an object to be removed. A direction in which the foreign substance 30 is moved is determined by selectively executing the steps S105 or S106, and an image area where the foreign substance 30 is present is defined at the same time. Therefore, the foreign substance 30 determined in the step S302 as an object to be removed is searched for from the delimited image area.

In a step S304, the image processing section 8 determines whether or not the foreign substance 30 to be removed is present. If it is determined in the step S304 that the foreign substance 30 is not present, the process proceeds to a step S305.

On the other hand, if it is determined in the step S304 that the foreign substance 30 is present, the process proceeds to the step S110, and the steps S108 to S112 are repeatedly carried out until the foreign substance 30 is removed.

In the step S305, the image processing section 8 analyzes the image obtained by the image pickup device 4 in the step S108, to thereby determine whether or not another foreign substance than the already removed foreign substance 30 is present for removal. The foreign substance to be removed includes a foreign substance having a size exceeding the threshold value or a foreign substance present in the vicinity of the central part of the frame, as mentioned in the step S102.

If it is determined in the step S305 that another foreign substance for removal is present, the process returns to the step S301, wherein the point D of the foreign substance is calculated. The steps S301 to S305 are repeatedly carried out until all foreign substances to be removed disappear.

If it is determined in the step S305 that no other foreign substance for removal is present, the process proceeds to the steps S113 to S116, and the same processing as executed in the steps S113 to S116 in FIG. 18 is carried out, followed by terminating the present third drive process.

According to the third drive process, since foreign substances are sequentially removed in order of decreasing priorities, it is possible to efficiently move a plurality of foreign substances to the area outside the effective portion of the optical member 1 in a shorter time.

As described above, the foreign substance removing device according to the present embodiment makes it possible to utilize the image pickup device 4 and the image processing section 8 to remove a foreign substance in a shorter time depending on the state of each foreign substance.

Figure 25A:
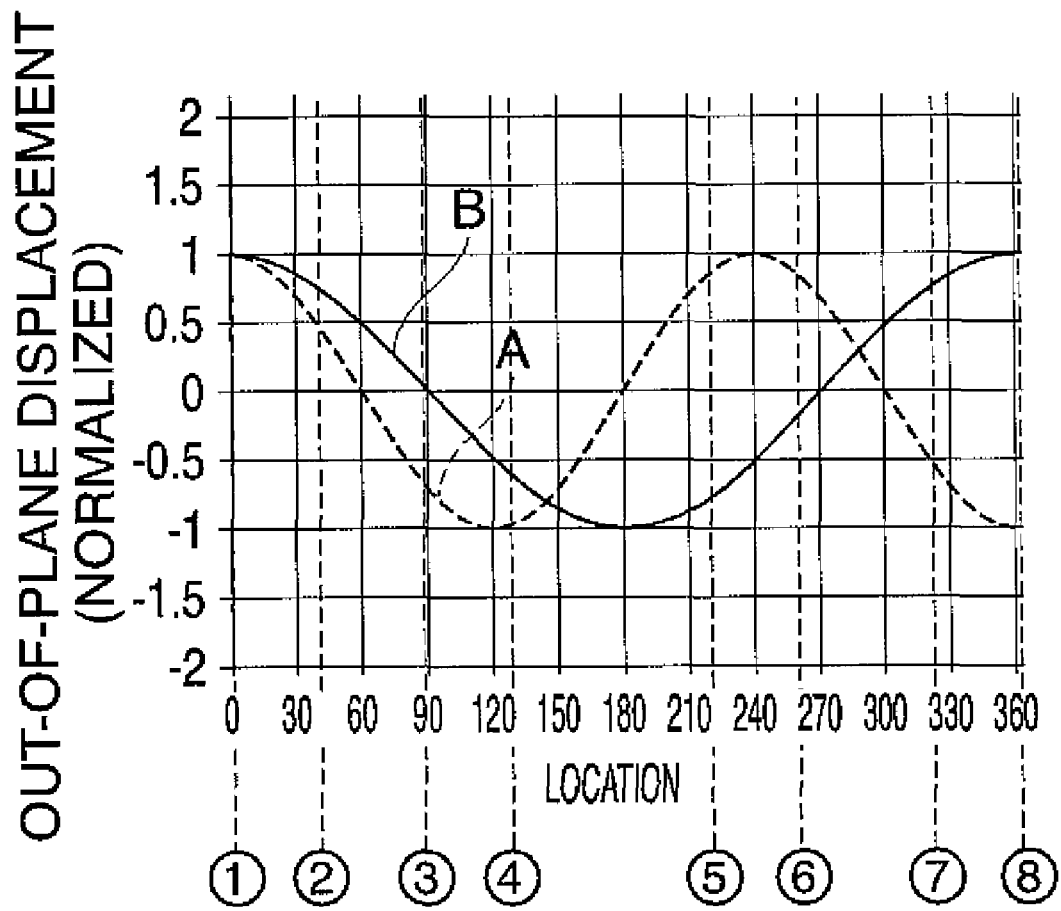
FIGS. 25A and 25B are a diagram showing respective displacements of the first-order out-of-plane bending vibration and the second-order out-of-plane bending vibration which are excited in the vibrator and deformed out of plane along the length of the vibrator, and arrangements of the piezoelectric elements.
Figure 25B:
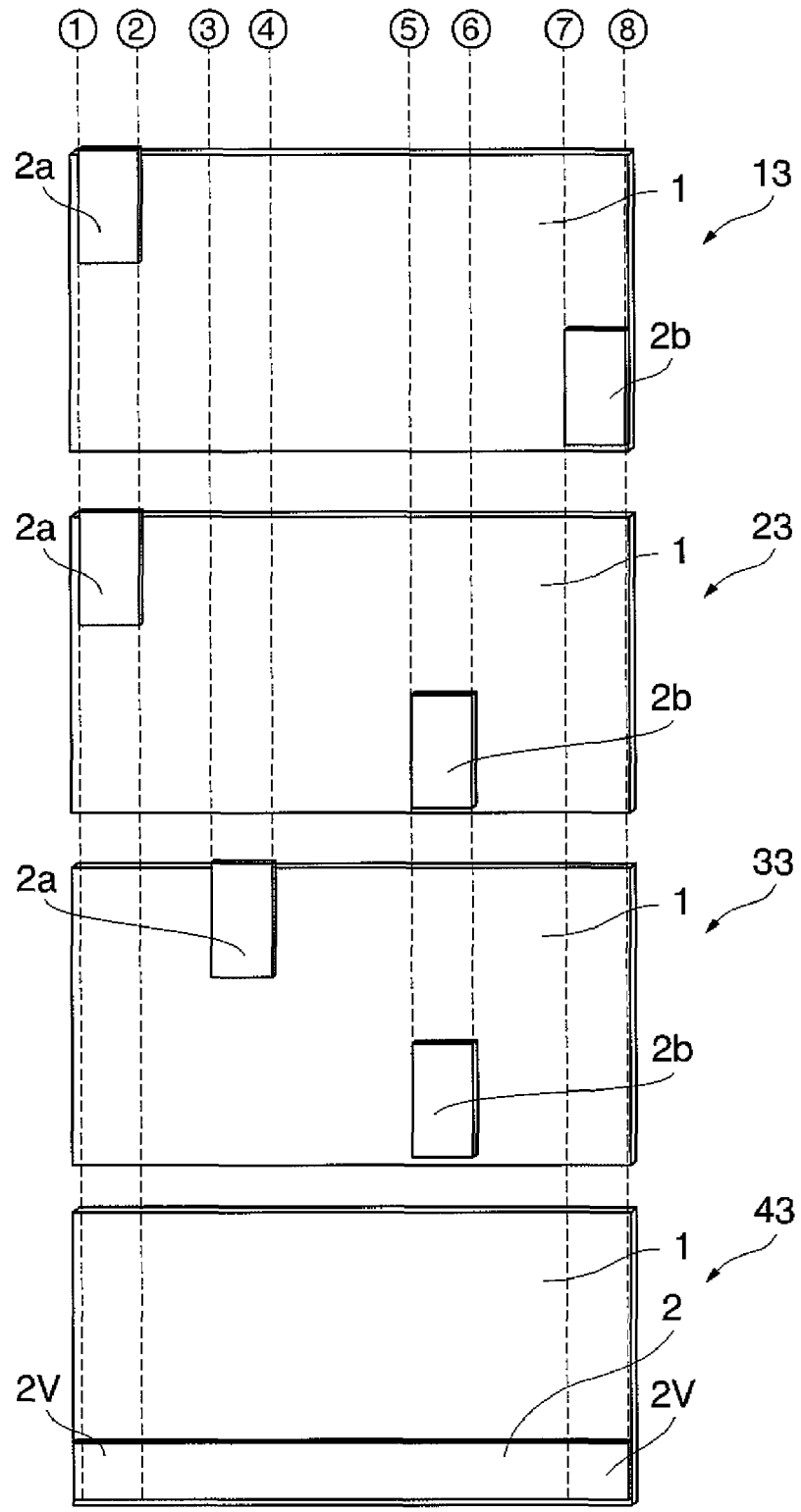

The construction and arrangement of the piezoelectric elements as components of the vibrator are not limited to the above-described embodiment. FIGS. 25A and 25B show respective displacements of the first-order out-of-plane bending vibration and the second-order out-of-plane bending vibration which are excited in the vibrator 3 and deformed out of plane along the length of the vibrator 3, and the arrangement of the piezoelectric elements 2a and 2b. In each of vibrators 13, 23, and 33, the two piezoelectric elements 2a and 2b are disposed at respective locations displaced with respect to the direction of arrangement of vibration nodes. Further, the piezoelectric element 2a on one side is disposed at a location where the directions of out-of-plane bending of the two vibrations coincide, and the piezoelectric element 2b on the other side is disposed at a location where the directions of out-of-plane bending of the two vibrations differ. This arrangement makes it possible to excite the two vibrations efficiently. Further, a vibrator 43 is provided with a single piezoelectric element 2. This piezoelectric element 2 is formed with two voltage applying electrodes 2V. The two voltage applying electrodes 2V are disposed at respective different locations in the direction of arrangement of the vibration nodes. One of the voltage applying electrodes 2V is disposed at a location where the directions of out-of-plane bending of the two vibrations coincide, and the other voltage applying electrode is disposed at a location where the directions of out-of-plane bending of the two vibrations differ. Similarly to the vibrators 13, 23, and 33, the vibrator 43 makes it possible to excite the two vibrations efficiently. Further, since only one piezoelectric element suffices, the manufacturing process is simplified, which contributes to reduction of costs.

Second Embodiment

In the above-described first embodiment, the amplitude ratio between the first-order out-of-plane bending vibration and the second-order out-of-plane bending vibration is set to 1:1, but this is not limitative. In the second embodiment, a case where the amplitude ratio between the first-order out-of-plane bending vibration and the second-order out-of-plane bending vibration is set to 1:4 is shown. It should be noted that a foreign substance removing device according to the second embodiment is installed in a camera as in the first embodiment, and is identical in construction to the foreign substance removing device according to the first embodiment.

Figure 26A:
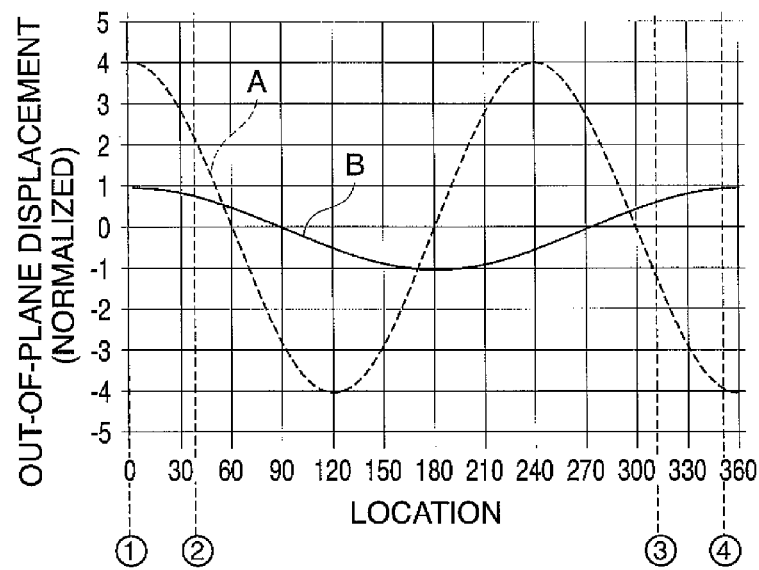
FIGS. 26A and 26B are a diagram showing respective displacements of the first-order out-of-plane bending vibration and the second-order out-of-plane bending vibration which are excited in the vibrator and deformed out of plane along the length of the vibrator, and the arrangement of piezoelectric elements of a foreign substance removing device according to a second embodiment of the present invention.
Figure 26B:
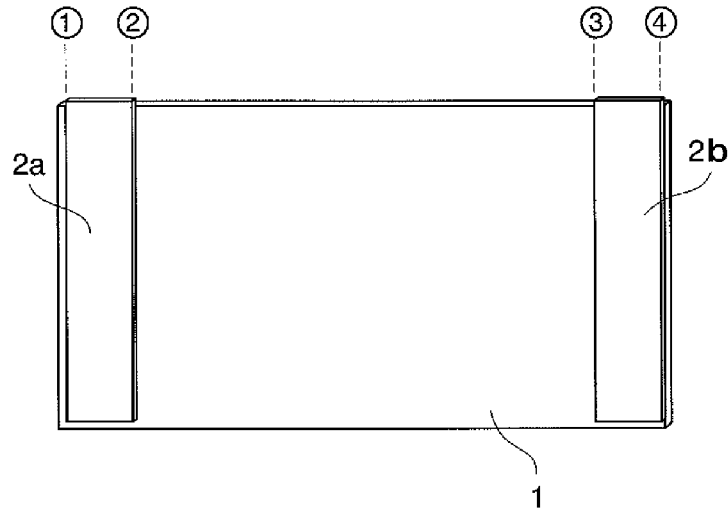
Figure 27:
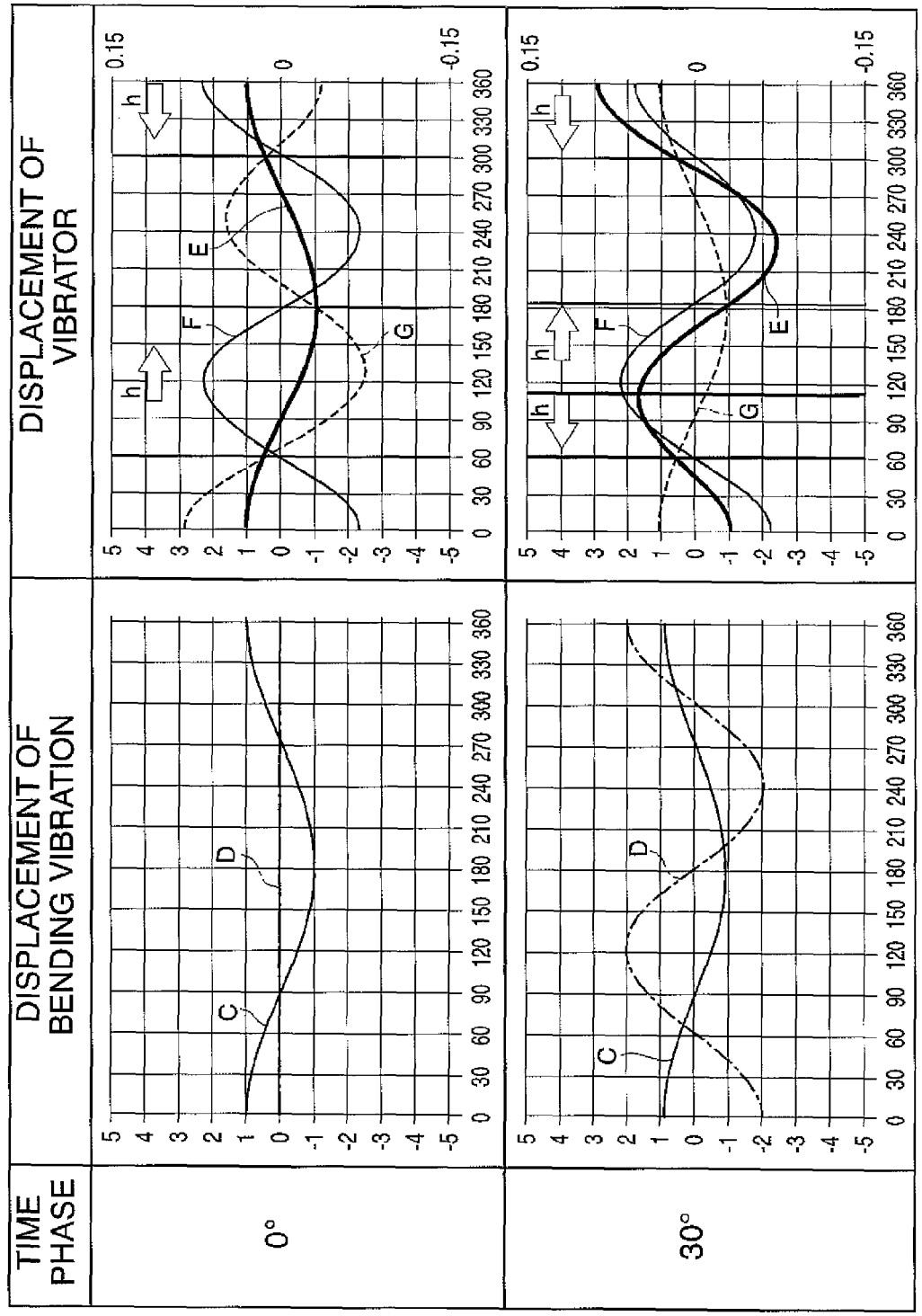
FIG. 27 is a graph showing respective displacements of a first-order out-of-plane bending vibration and a second-order out-of-plane bending vibration in a case where the time phase difference between the two vibrations is set to 90°, and displacement of the vibrator resulting from superposition of the two vibrations, on a time phase-by-time phase basis.
Figure 28:
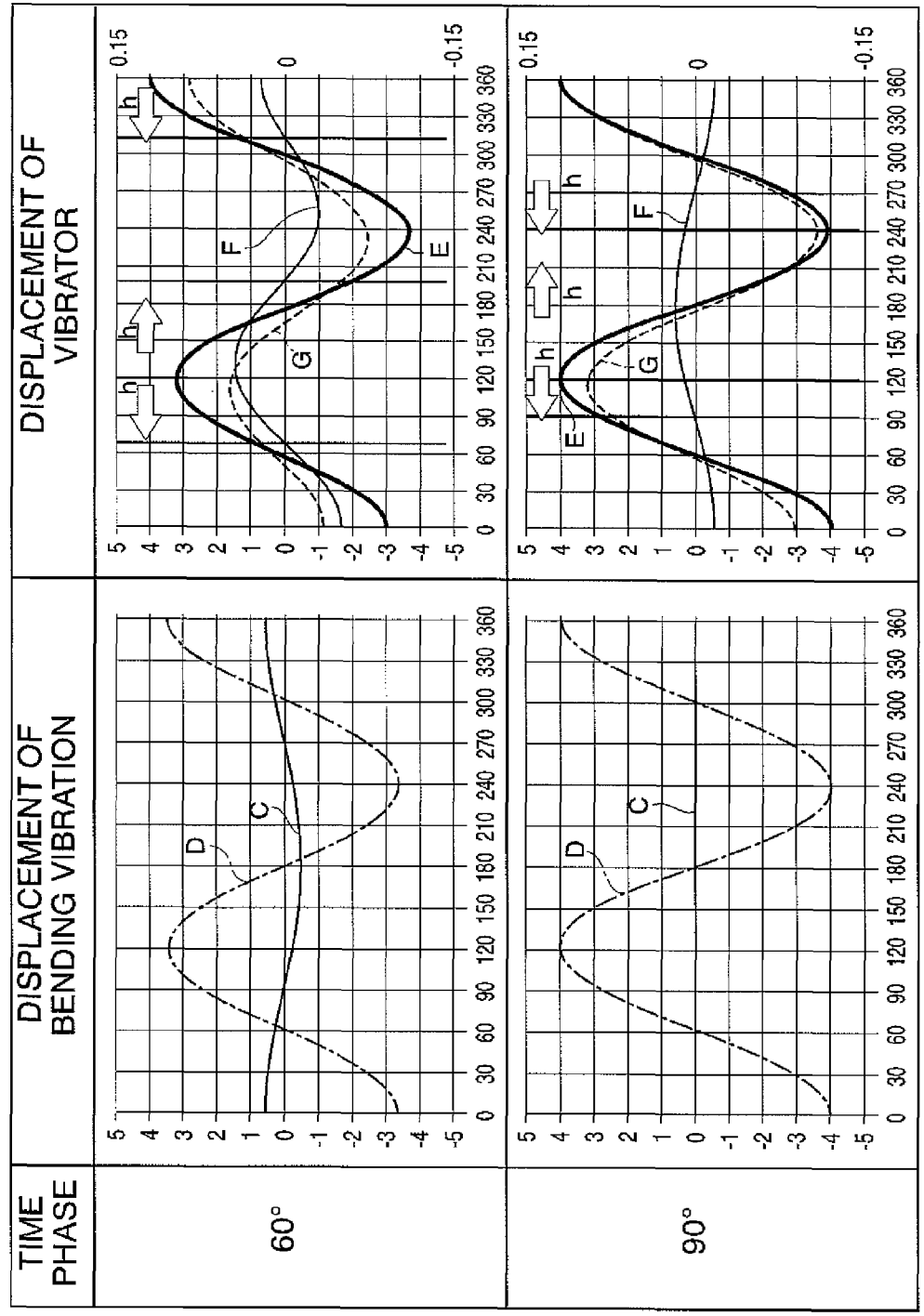
FIG. 28 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 29:
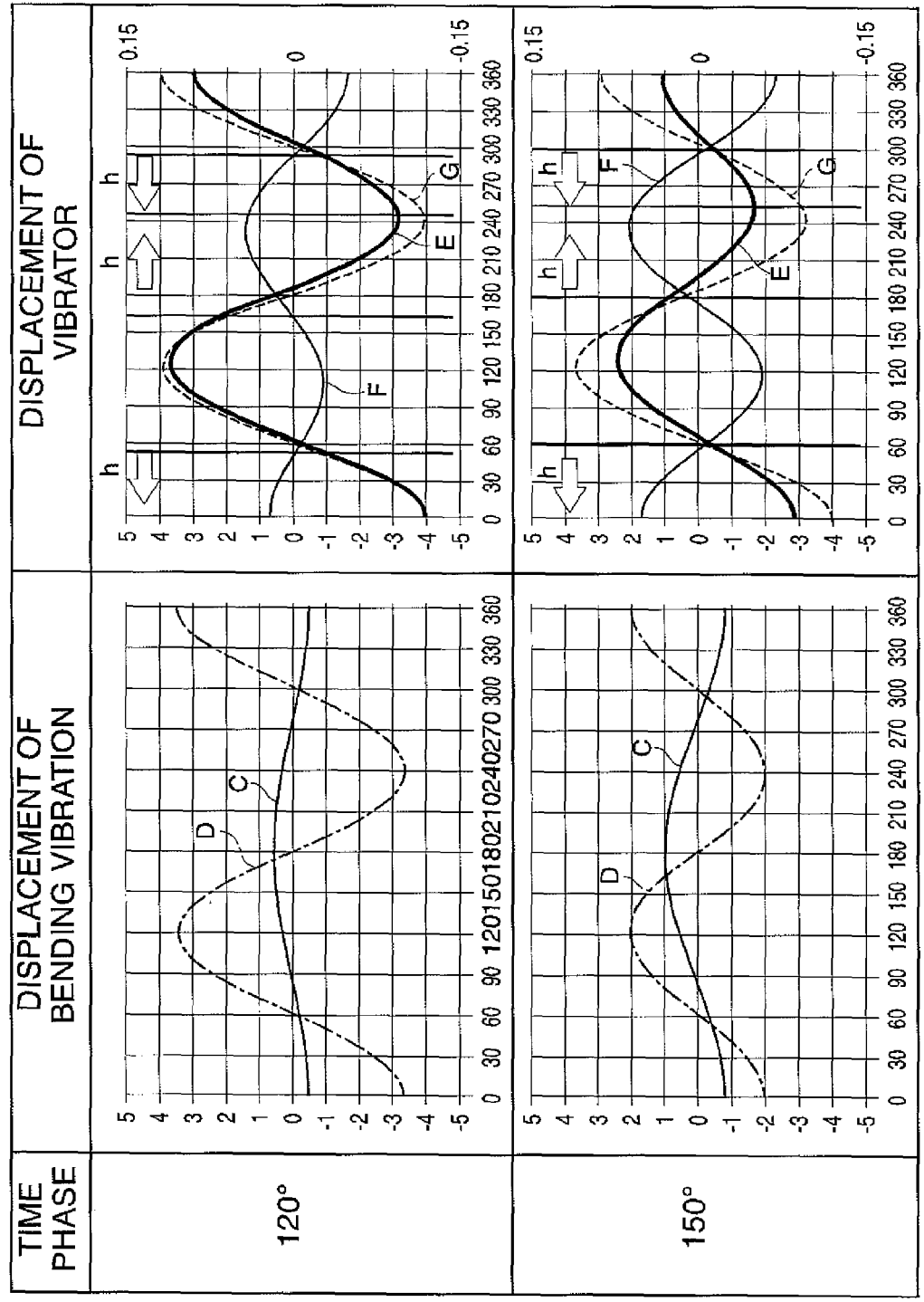
FIG. 29 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 30:
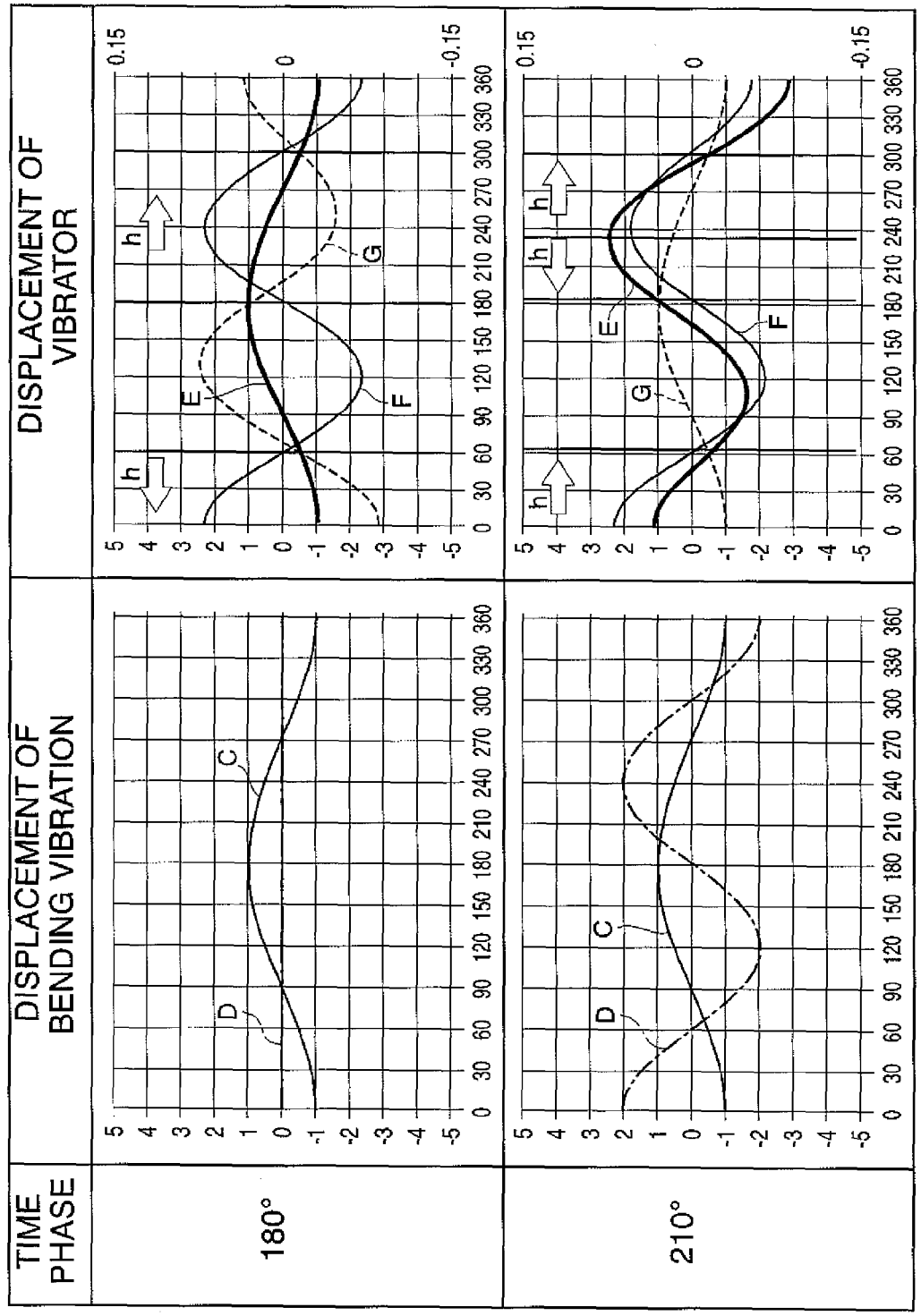
FIG. 30 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 31:
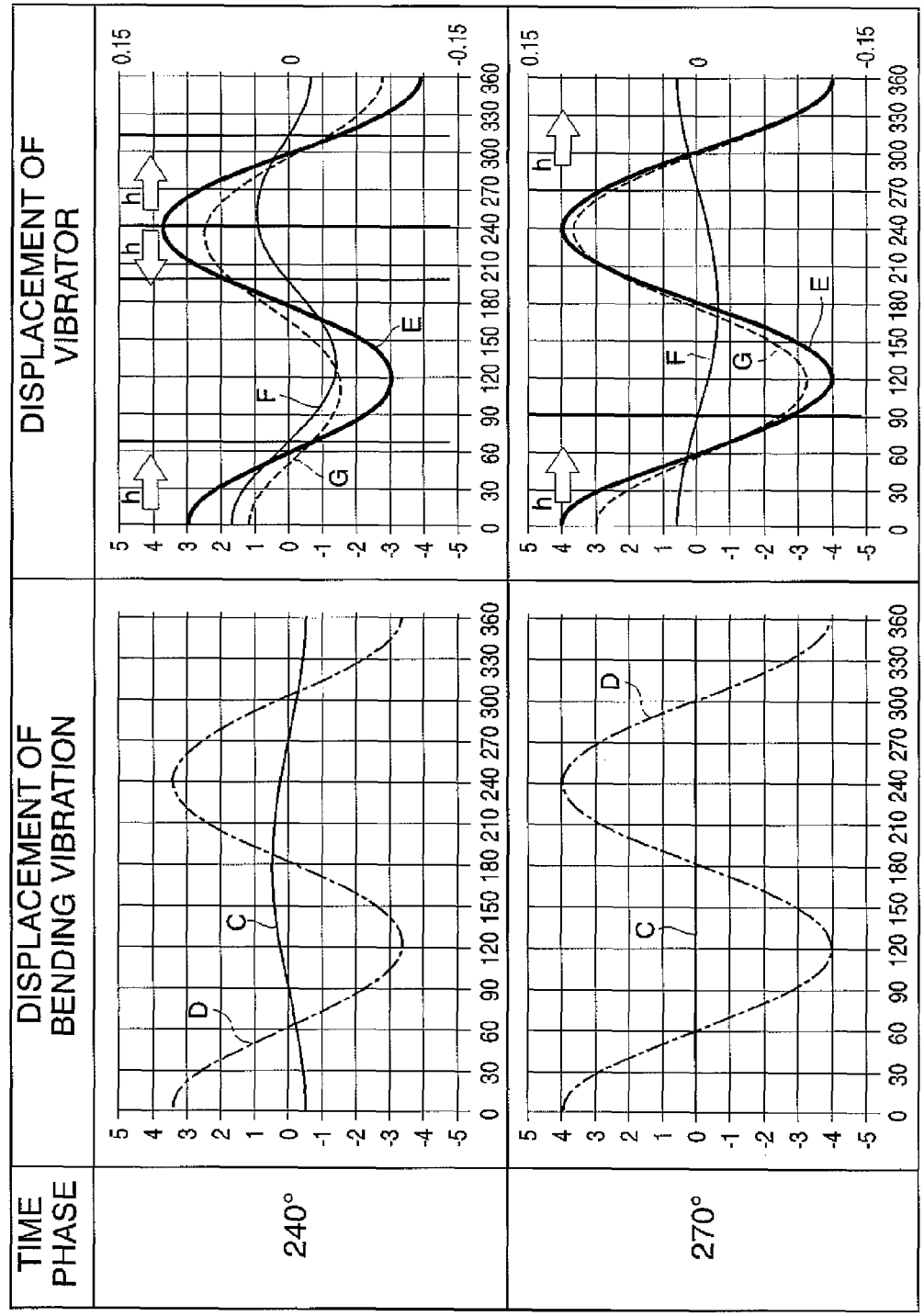
FIG. 31 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 32:
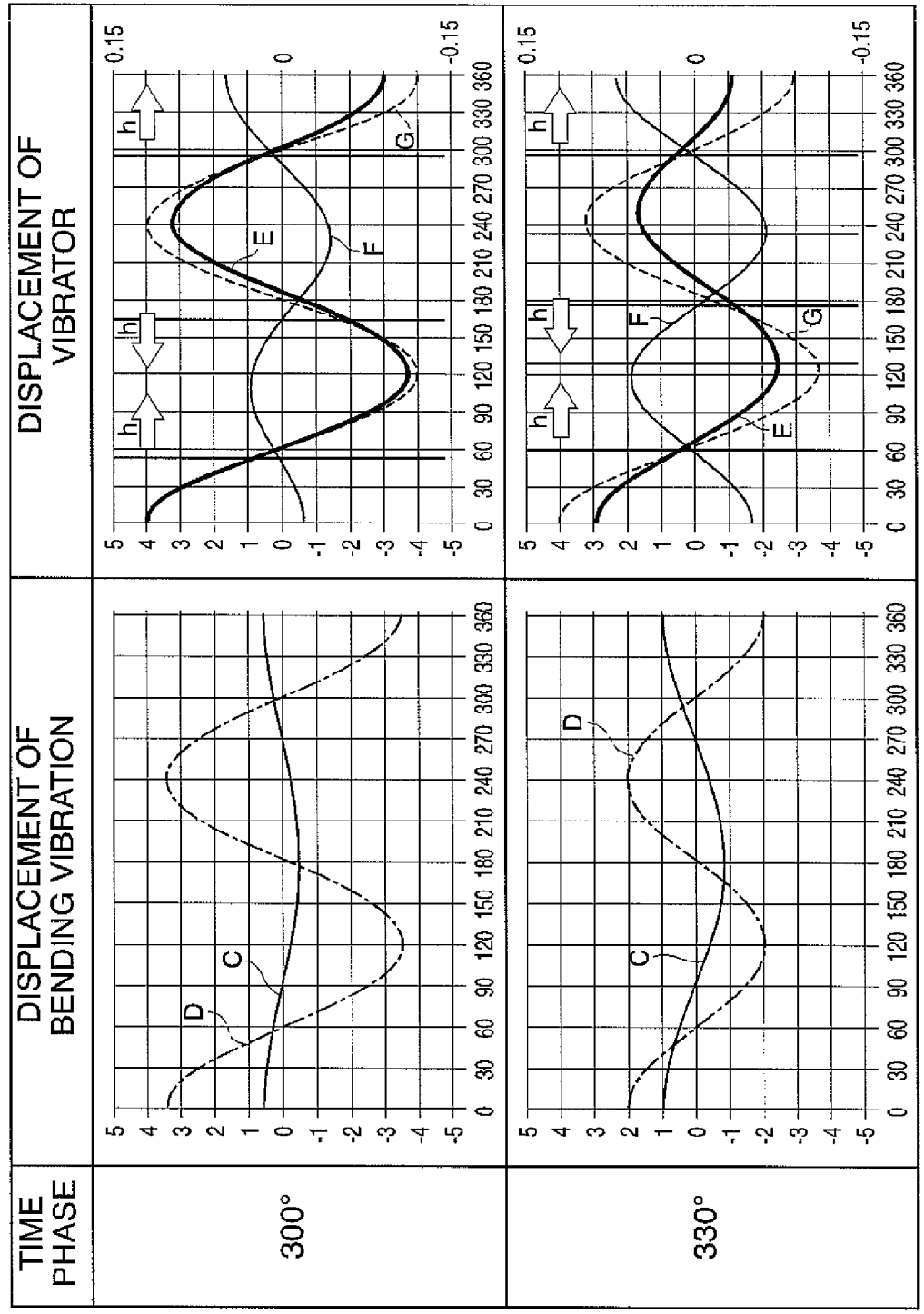
FIG. 32 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.
Figure 33:
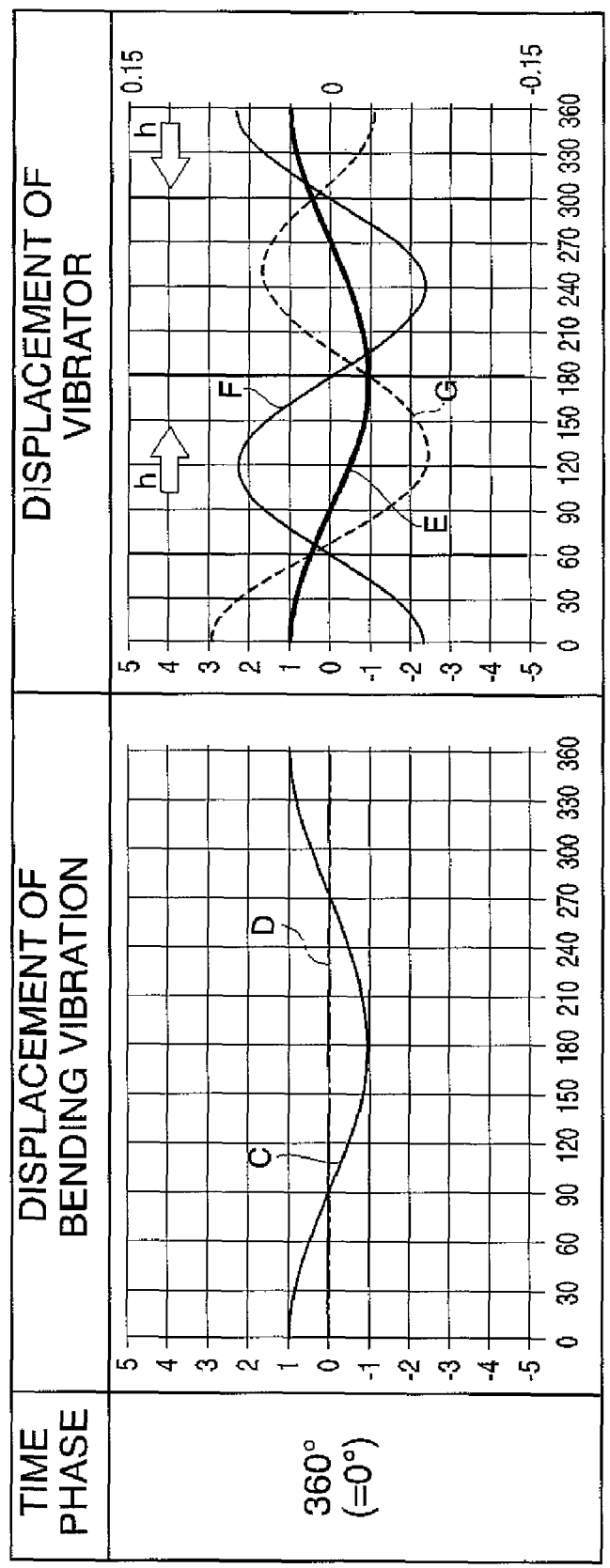
FIG. 33 is a graph showing respective displacements of the first-order out-of-plane bending vibration and the second-order out-of-plane bending vibration in the case where the time phase difference between the two vibrations is set to 90°, and displacement of the vibrator resulting from superposition of the two vibrations, on a time phase-by-time phase basis.

FIGS. 26A and 26B show respective displacements of the first-order out-of-plane bending vibration and the second-order out-of-plane bending vibration which are excited in the vibrator 3 and deformed out of plane along the length of the vibrator 3, and the arrangement of the piezoelectric elements 2a and 2b. The abscissa represents the position of the vibrator 3 in a case where the length of the vibrator 3 in the longitudinal direction is set to "360". The ordinate represents values obtained by normalizing out-of-plane displacement. In FIGS. 26A and 26B, a waveform B shows the first-order out-of-plane bending vibration, and a waveform A shows the second-order out-of-plane bending vibration.

FIGS. 27, 28, 29, 30, 31, 32, and 33 show graphs showing respective displacements of the first-order out-of-plane bending vibration and the second-order out-of-plane bending vibration in a case where the time phase difference between the two vibrations is set to 90°, and displacement of the vibrator resulting from superposition of the two vibrations, on a time phase-by-time phase basis. In these figures, a waveform C represents the displacement of the first-order out-of-plane bending vibration. A waveform D represents the displacement of the second-order out-of-plane bending vibration. A waveform E represents the displacement of the vibrator resulting from superposition of the two vibrations. A waveform G represents the displacement of the vibrator 3 in a 30° earlier time phase than the time phase of the waveform E. A waveform F represents the normalized Y-direction displacement speed of the vibrator 3.

In the foreign substance removing device, when the optical member 1 thrusts up a foreign substance out of the plane (i.e. in the positive Y direction in FIG. 27), the foreign substance adhering to the front surface of the optical member 1 receives a force in the normal direction and is moved in a repelled fashion. More specifically, when the waveform F indicative of the normalized Y-direction displacement speed of the vibrator 3 assumes a positive value in each time phase, the foreign substance is thrust up out of plane, and receives a force in the normal direction of the waveform E indicative of the displacement of the vibrator 3 in this time phase to be moved away. Each arrow h in FIG. 27 indicates a direction in which the foreign substance moves in a section.

According to the foreign substance removing device of the second embodiment, it is possible to remove a foreign substance as in the first embodiment. However, since the amplitude ratio between the first-order out-of-plane bending vibration and the second-order out-of-plane bending vibration is set to 1:4, the foreign substance is more largely moved in the negative X direction than in the position direction of in the X direction, differently from the case where the amplitude ratio is set to 1:1 as in the first embodiment. For this reason, compared with the first embodiment, the foreign substance removing efficiency is lower.

Third Embodiment

A foreign substance removing device according to a third embodiment is distinguished from the foreign substance removing device according to the first embodiment in that a frequency between the respective resonance frequencies of the second-order out-of-plane bending vibration and a third-order out-of-plane bending vibration which are deformed out of plane along the length of the vibrator 3 is applied to the piezoelectric elements 2. As a consequence, the second-order out-of-plane bending vibration having large displacement with a response of the resonance phenomenon and the third-order out-of-plane bending vibration with a time phase difference of 90° (i.e. 90° earlier than the second-order out-of-plane bending vibration) are simultaneously excited in the vibrator 3 at the same frequency. The vibrator 3 is deformed such that the two vibrations are superposed. It should be noted that the foreign substance removing device according to the third embodiment is installed in a camera as in the first embodiment, and is identical in construction to the foreign substance removing device according to the first embodiment.

Figure 34A:
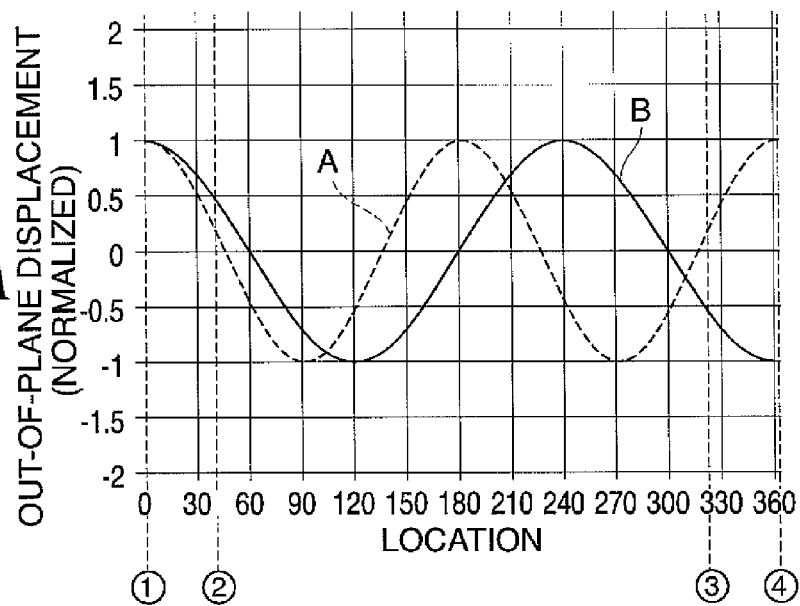
FIGS. 34A and 34B are a diagram showing respective displacements of a second-order out-of-plane bending vibration and a third-order out-of-plane bending vibration which are excited in the vibrator and deformed out of plane along the length of the vibrator, and the arrangement of piezoelectric elements of a foreign substance removing device according to a third embodiment of the present invention.
Figure 34B:
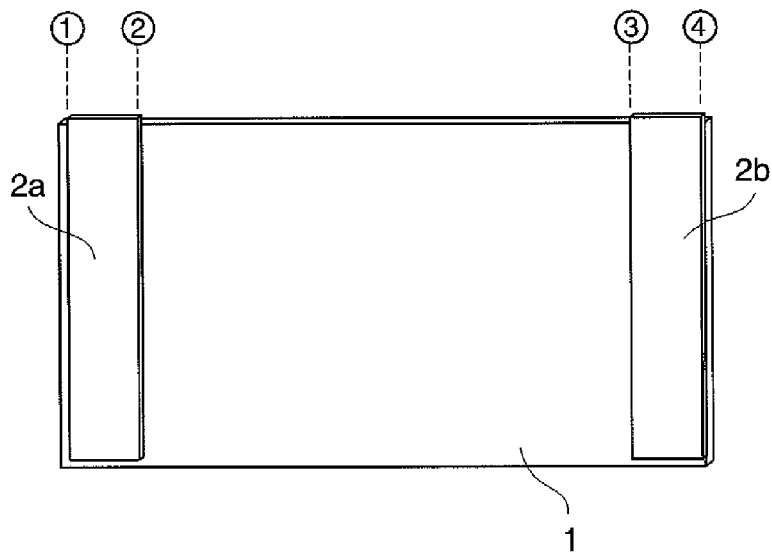
Figure 35:
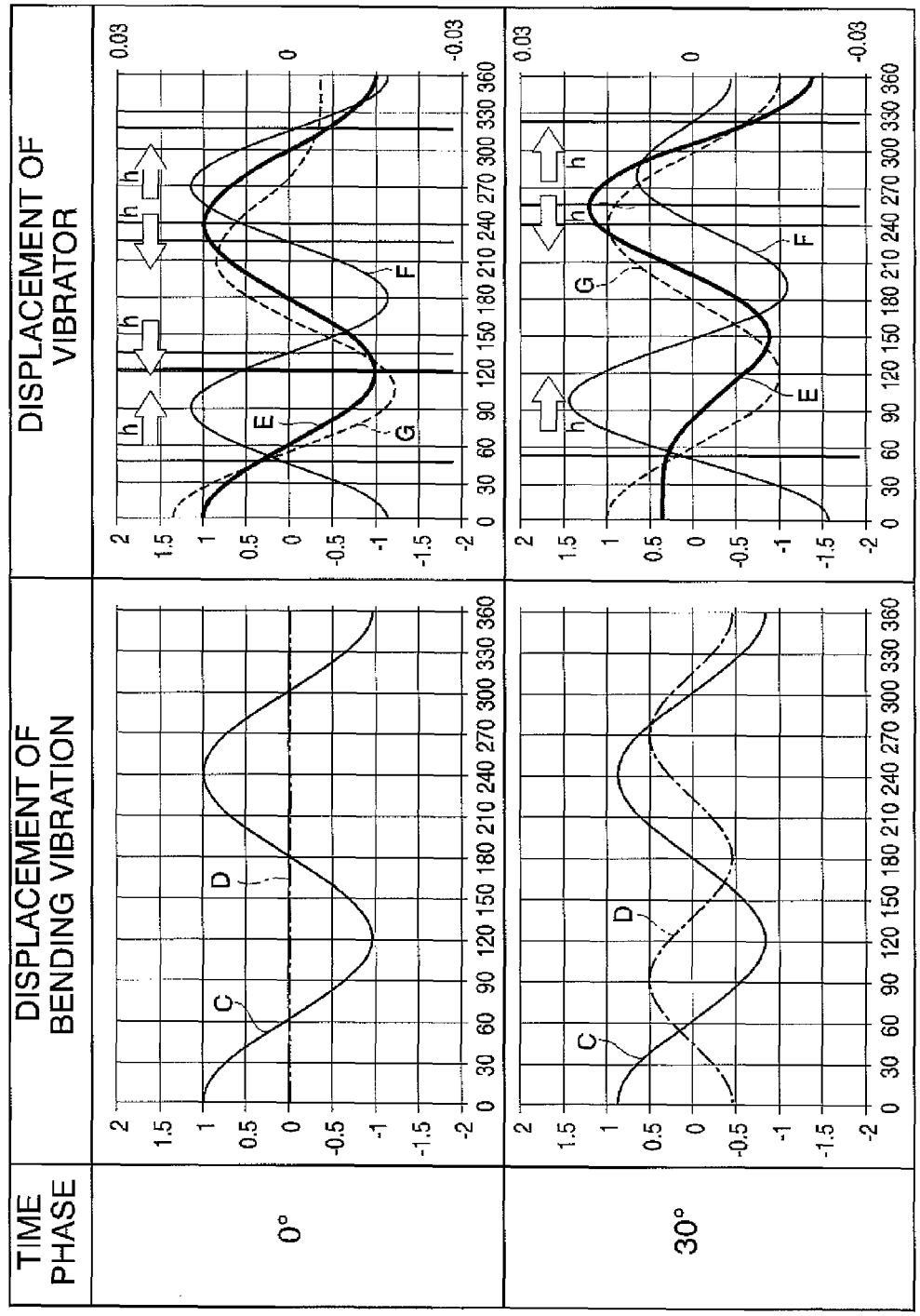
FIG. 35 is a graph showing respective displacements of the second-order out-of-plane bending vibration and the third-order out-of-plane bending vibration in a case where the time phase difference between the two vibrations is set to 90°, and displacement of the vibrator resulting from superposition of the two vibrations, on a time phase-by-time phase basis.
Figure 36:
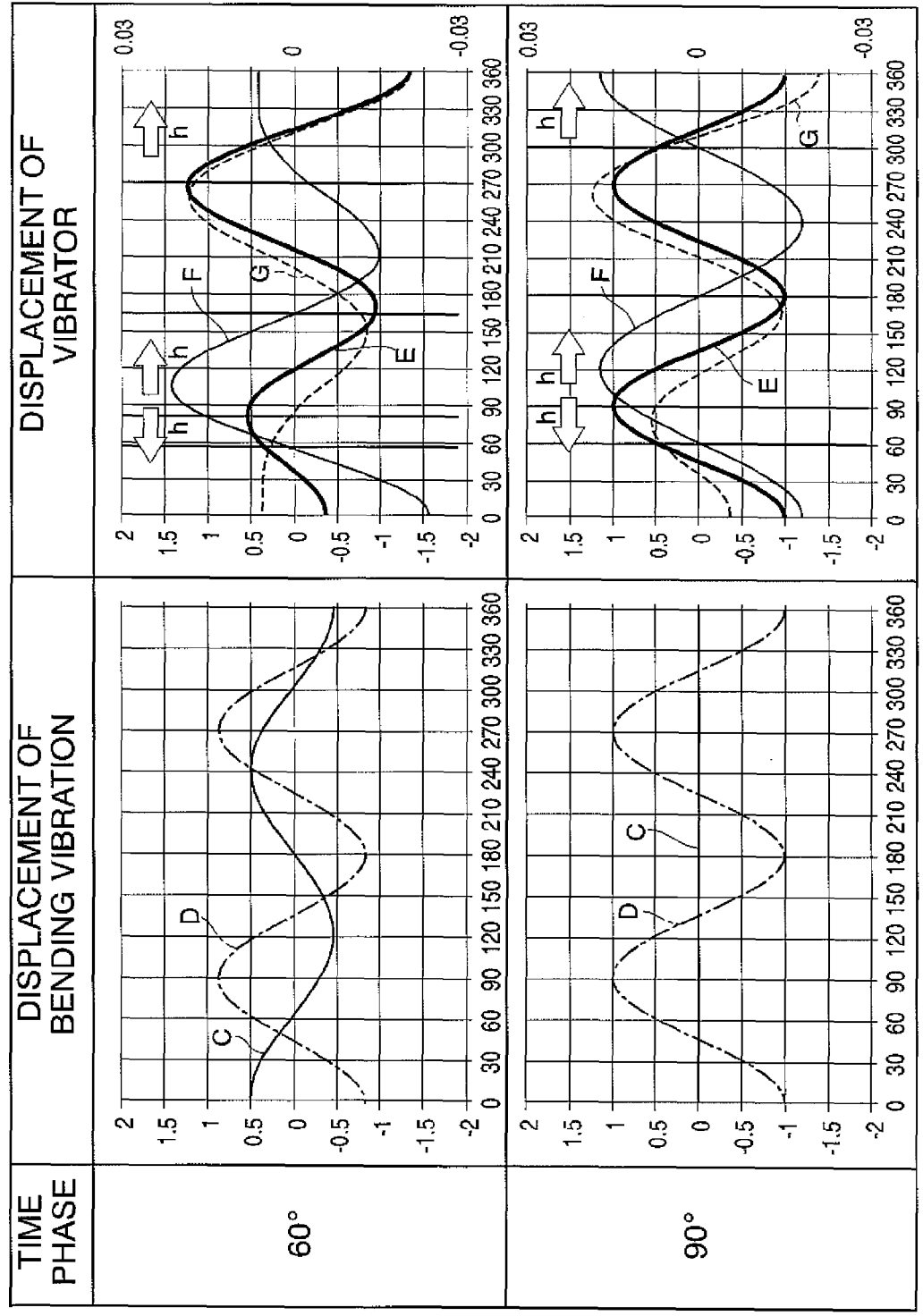
FIG. 36 is a graph showing respective displacements of the second-order out-of-plane bending vibration and the third-order out-of-plane bending vibration in the case where the time phase difference between the two vibrations is set to 90°, and displacement of the vibrator resulting from superposition of the two vibrations, on a time phase-by-time phase basis.
Figure 37:
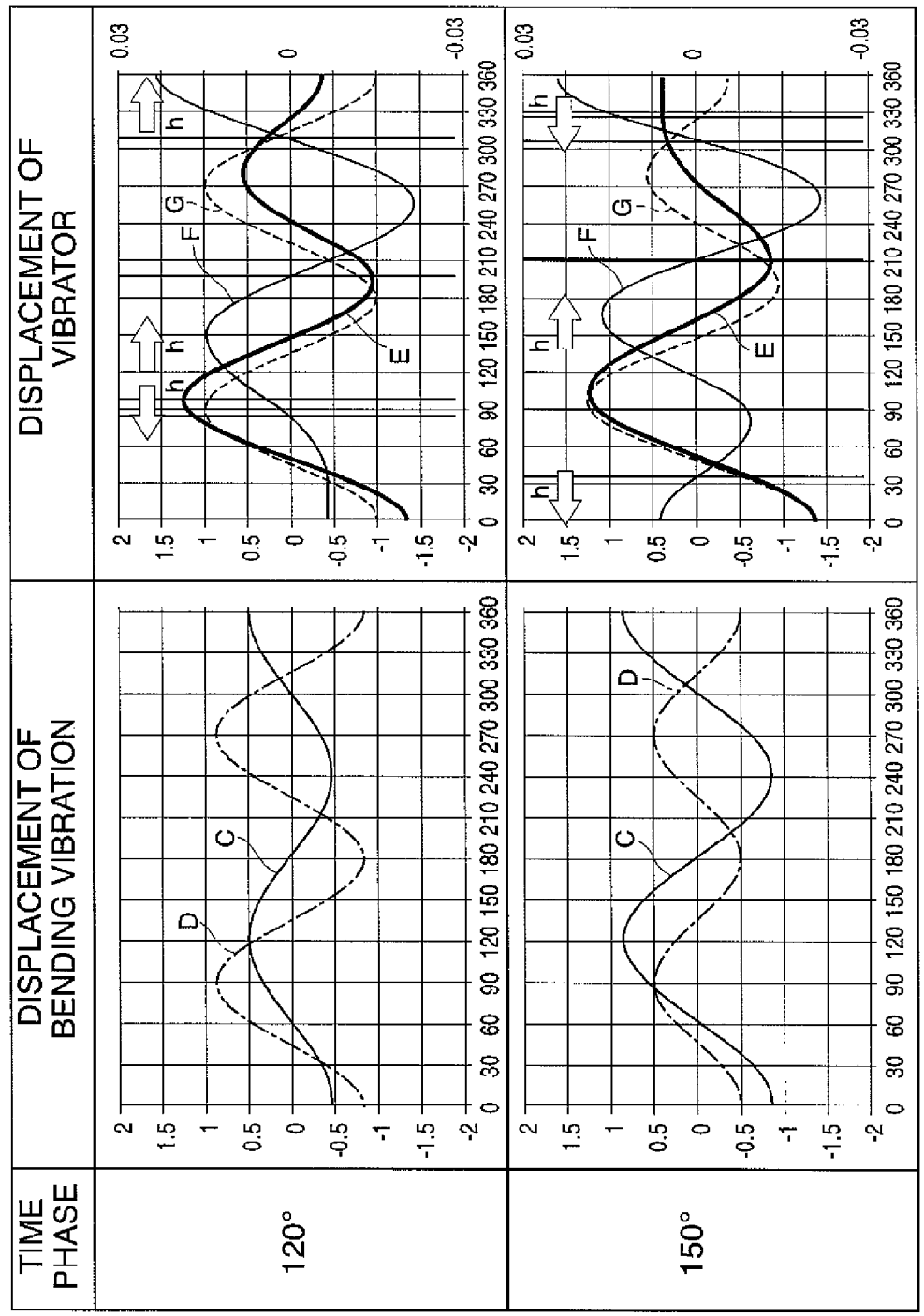
FIG. 37 is a graph showing respective displacements of the second-order out-of-plane bending vibration and the third-order out-of-plane bending vibration in the case where the time phase difference between the two vibrations is set to 90°, and displacement of the vibrator resulting from superposition of the two vibrations, on a time phase-by-time phase basis.
Figure 38:
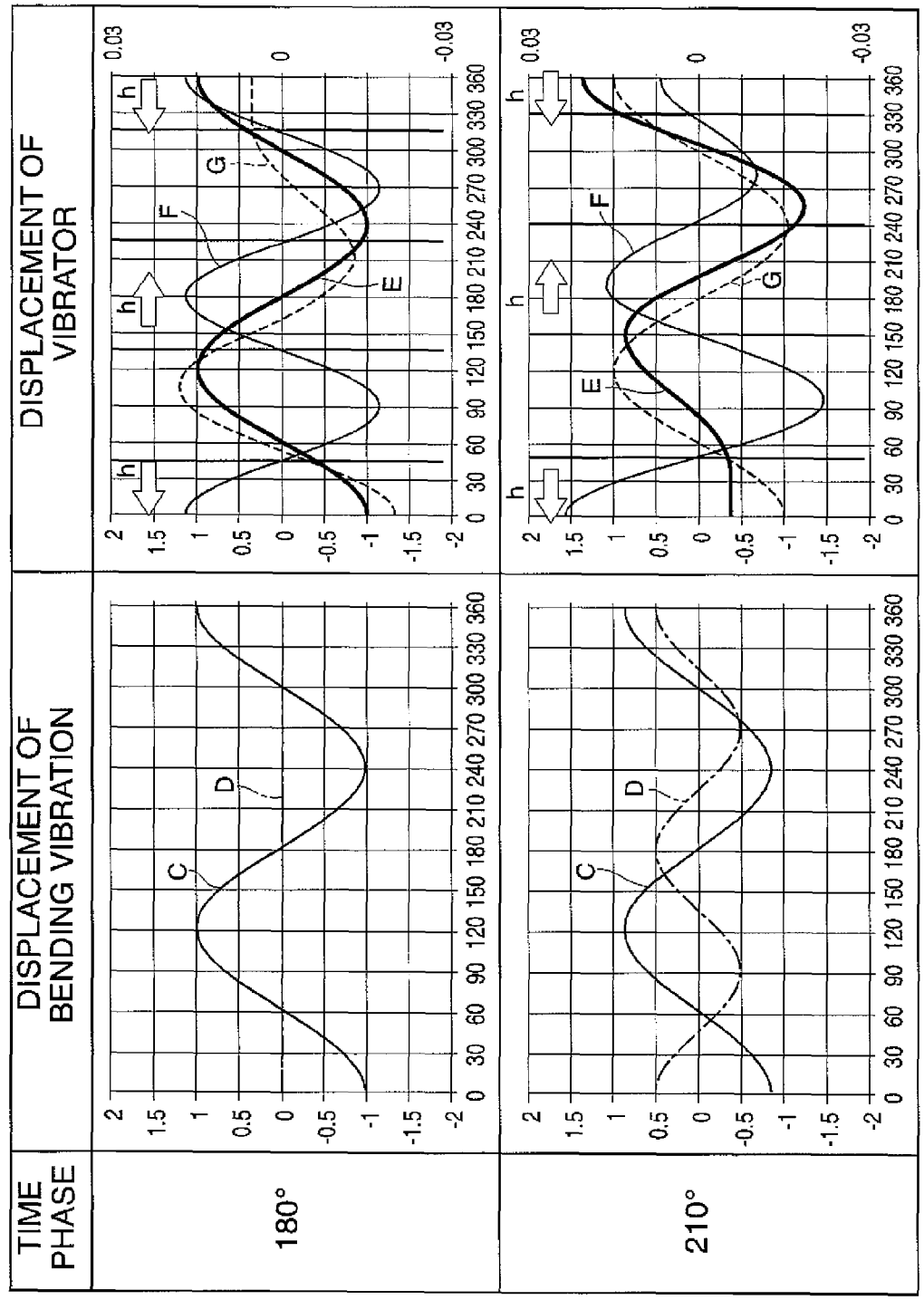
FIG. 38 is a graph showing respective displacements of the second-order out-of-plane bending vibration and the third-order out-of-plane bending vibration in the case where the time phase difference between the two vibrations is set to 90°, and displacement of the vibrator resulting from superposition of the two vibrations, on a time phase-by-time phase basis.
Figure 39:
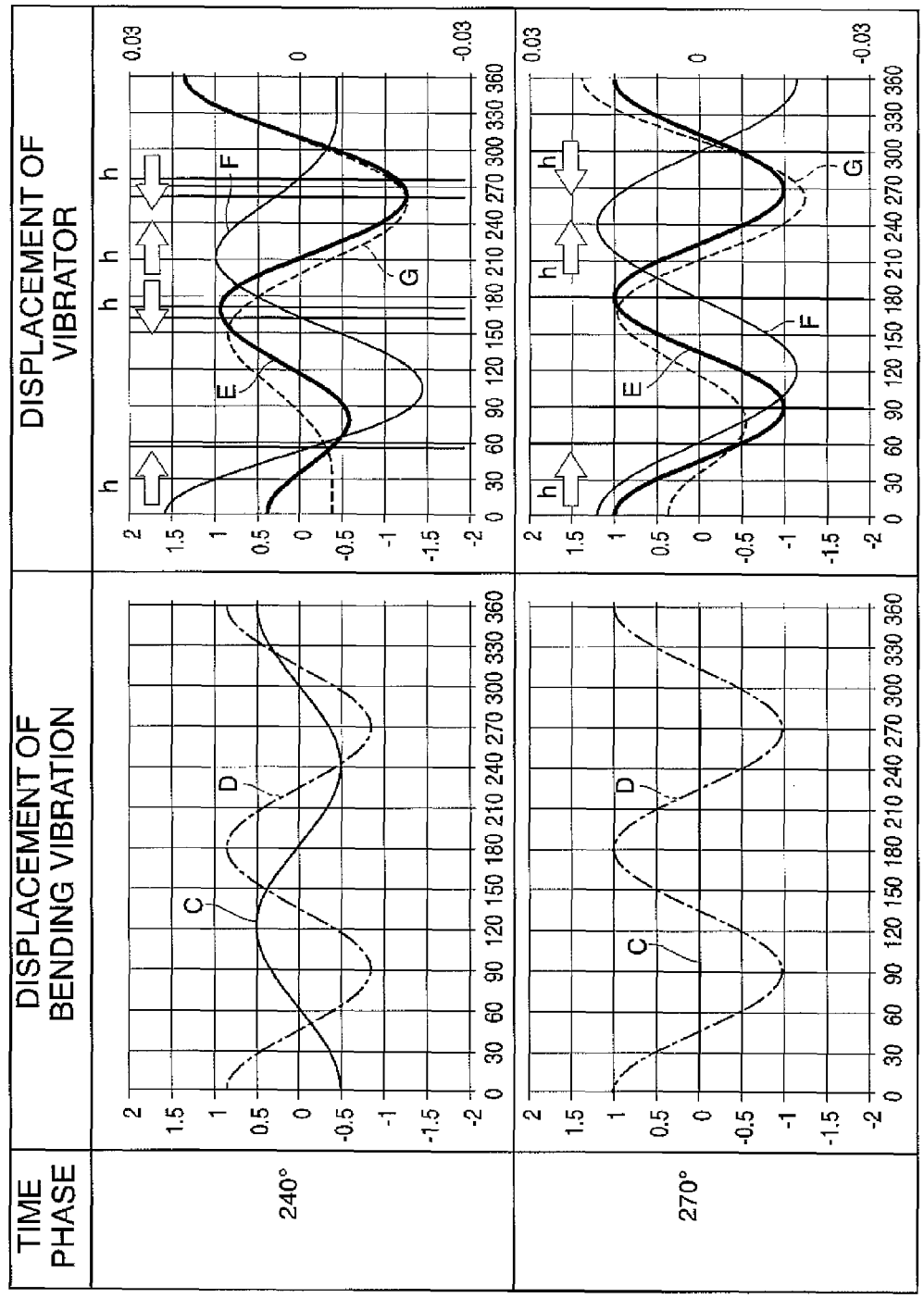
FIG. 39 is a graph showing respective displacements of the second-order out-of-plane bending vibration and the third-order out-of-plane bending vibration in a case where the time phase difference between the two vibrations is set to 90°, and displacement of the vibrator resulting from superposition of the two vibrations, on a time phase-by-time phase basis.
Figure 40:
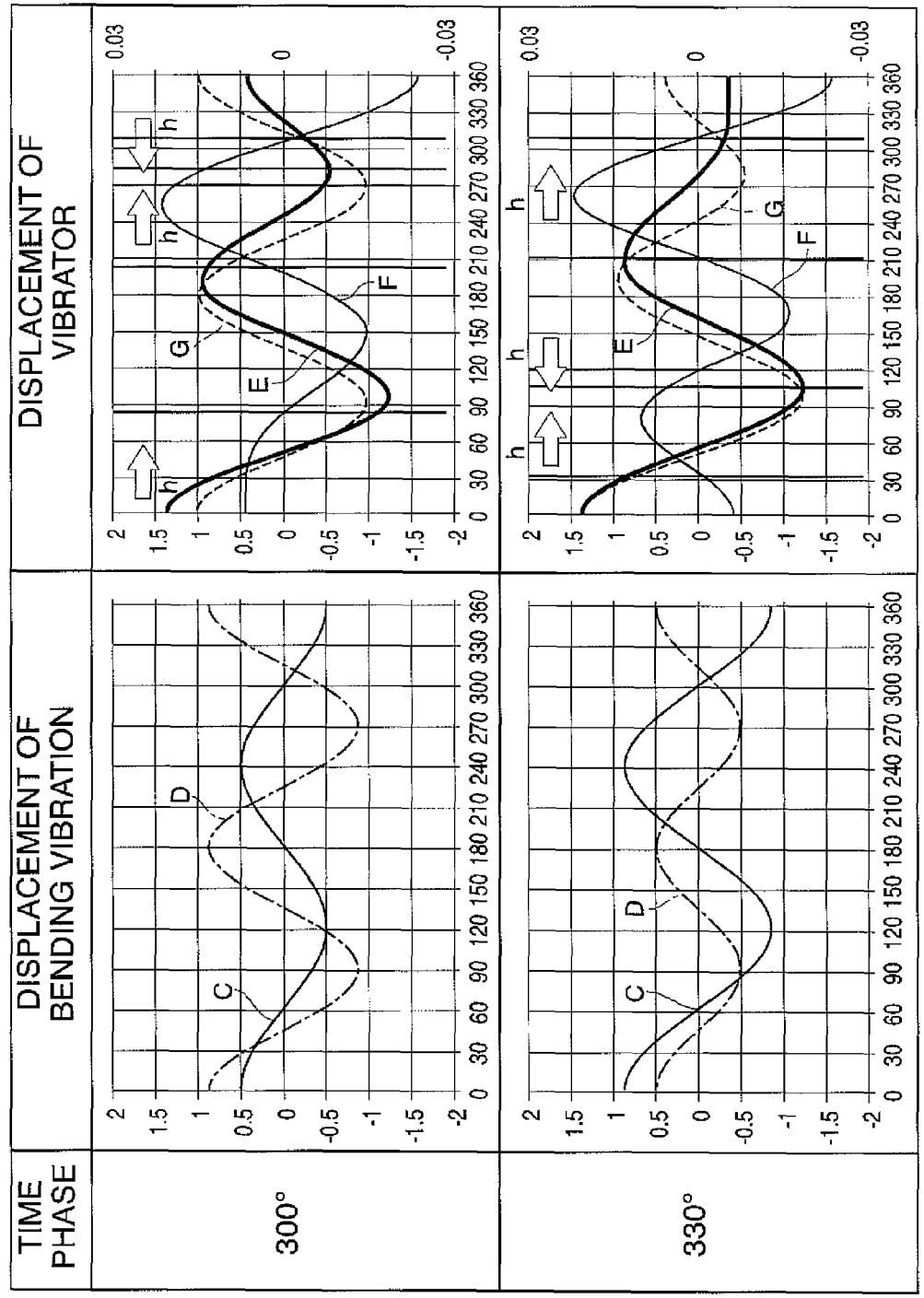
FIG. 40 is a graph showing respective displacements of the second-order out-of-plane bending vibration and the third-order out-of-plane bending vibration in a case where the time phase difference between the two vibrations is set to 90°, and displacement of the vibrator resulting from superposition of the two vibrations, on a time phase-by-time phase basis.
Figure 41:
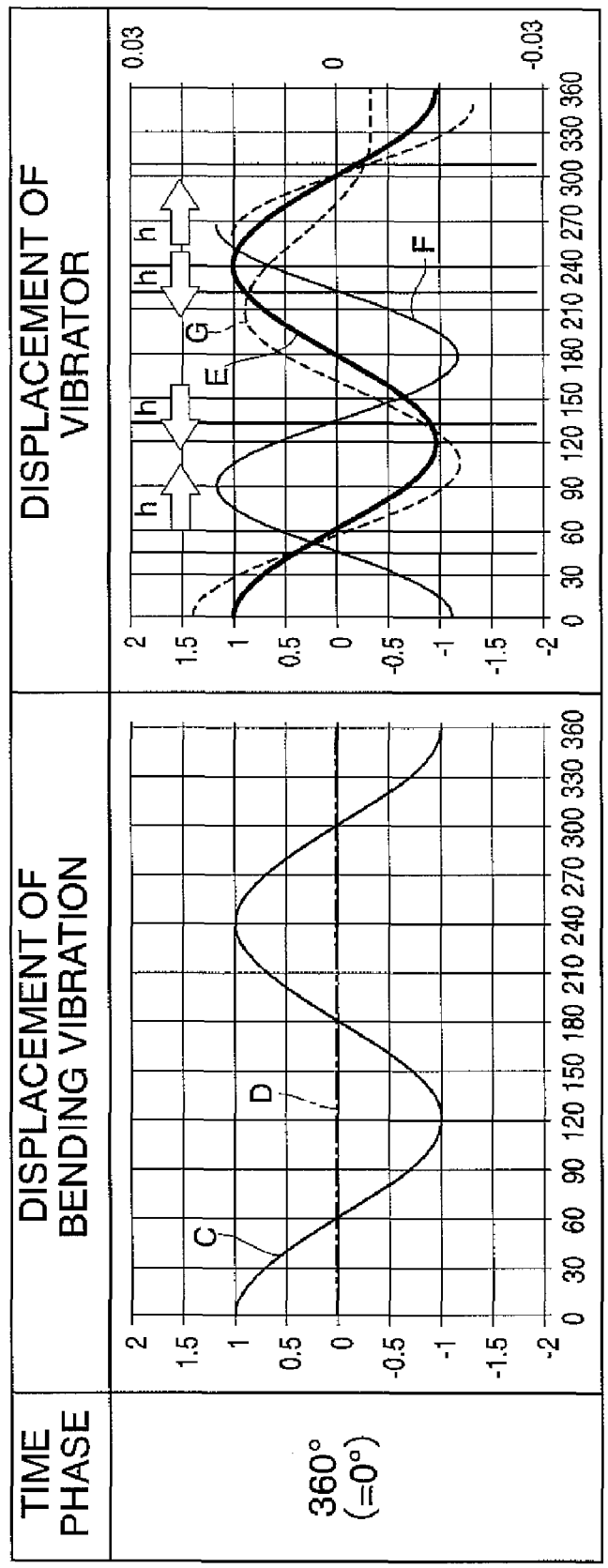
FIG. 41 is a graph showing respective displacements of the second-order out-of-plane bending vibration and the third-order out-of-plane bending vibration in the case where the time phase difference between the two vibrations is set to 90°, and displacement of the vibrator resulting from superposition of the two vibrations, on a time phase-by-time phase basis.

FIGS. 34A and 34B show respective displacements of the second-order out-of-plane bending vibration and the third-order out-of-plane bending vibration which are excited in the vibrator 3 and are deformed out of plane along the length of the vibrator 3, and the arrangement of the piezoelectric elements 2a and 2b. The abscissa represents the position of the vibrator 3 in a case where the length of the vibrator 3 in the longitudinal direction is set to "360". The ordinate represents values obtained by normalizing the out-of-plane displacement. In FIGS. 34A and 34B, a waveform B shows the second-order out-of-plane bending vibration, and a waveform A shows the third-order out-of-plane bending vibration. The effective portion of the optical element 1 for the image pickup device 4 corresponds to a range from a location 100 to a location 260.

FIGS. 35, 36, 37, 38, 39, 40, and 41 show graphs showing respective displacements of the second-order out-of-plane bending vibration and the third-order out-of-plane bending vibration in a case where the time phase difference between the two vibrations is set to 90°, and displacement of the vibrator resulting from superposition of the two vibrations, on a time phase-by-time phase basis. In these figures, a waveform C represents the displacement of the second-order out-of-plane bending vibration. A waveform D represents the displacement of the third-order out-of-plane bending vibration. A waveform E represents the displacement of the vibrator resulting from superposition of the two vibrations. A waveform G represents the displacement of the vibrator 3 in a 30° earlier time phase than the time phase of the waveform E. A waveform F represents the normalized Y-direction displacement speed of the vibrator 3.

In the foreign substance removing device, when the optical member 1 thrusts up the foreign substance out of plane, the foreign substance adhering to the front surface of the optical member 1 receives a force in the normal direction of the surface of the optical member 1 and is moved in a repelled fashion. More specifically, when the waveform F indicative of the normalized Y-direction displacement speed of the vibrator 3 assumes a positive value in each time phase, the foreign substance is thrust up out of plane, and receives a force in the normal direction of the waveform E indicative of the displacement of the vibrator 3 in the associated time phase to be moved away. Each arrow h in FIG. 35 indicates a direction in which the foreign substance moves in a section.

According to the foreign substance removing device of the third embodiment, as in the first embodiment, by repeatedly applying vibration to a foreign substance adhering to an area ranging between the location 100 and the location 260 as the effective portion of the optical member 1 for the image pickup device 4, it is possible to move the foreign substance rightward, as viewed in the figures, to thereby remove the same.

Fourth Embodiment

A foreign substance removing device according to the fourth embodiment is distinguished from the above-described first embodiment in that a frequency between the respective resonance frequencies of a tenth-order out-of-plane bending vibration and an eleventh-order out-of-plane bending vibration which are deformed out of plane along the length of the vibrator 3 is applied to the piezoelectric elements 2. As a consequence, the tenth-order out-of-plane bending vibration having large displacement with a response of the resonance phenomenon and the eleventh-order out-of-plane bending vibration with a time phase difference of 90° (i.e. 90° earlier than the tenth-order out-of-plane bending vibration) are simultaneously excited in the vibrator 3 at the same frequency. Therefore, the vibrator 3 is deformed such that the two vibrations are superposed. It should be noted that the foreign substance removing device according to the fourth embodiment is installed in a camera as in the first embodiment, and is identical in construction to the foreign substance removing device according to the first embodiment.

Figure 42A:
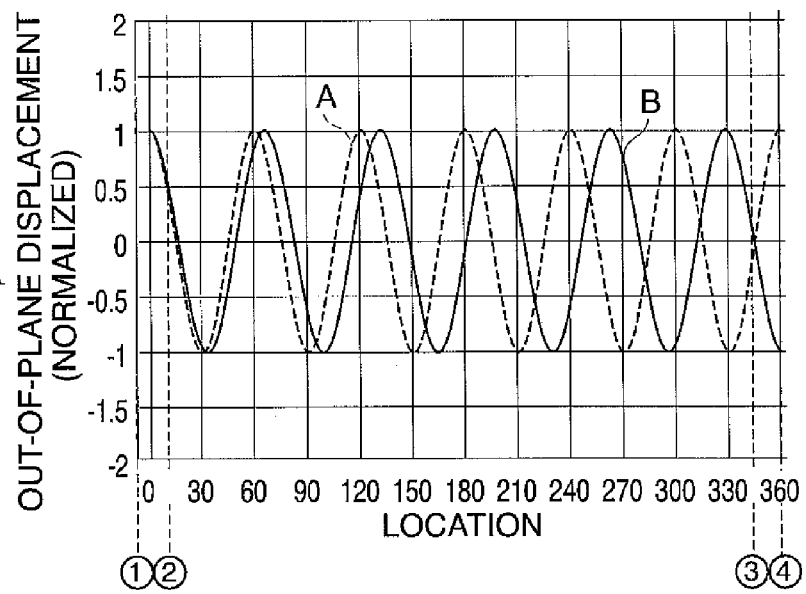
FIGS. 42A and 42B are a diagram showing respective displacements of a tenth-order out-of-plane bending vibration and an eleventh-order out-of-plane bending vibration which are excited in the vibrator and deformed out of plane along the length of the vibrator, and the arrangement of piezoelectric elements of a foreign substance removing device according to a fourth embodiment of the present invention.
Figure 42B:
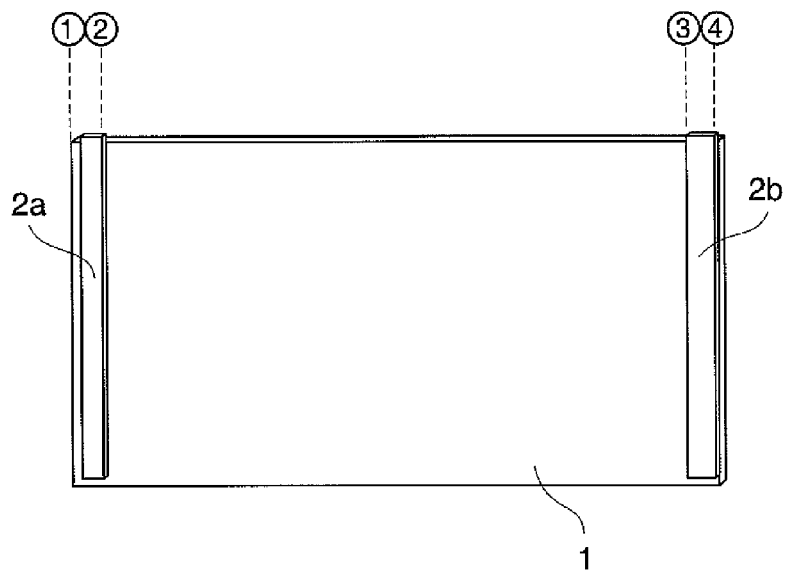
Figure 43:
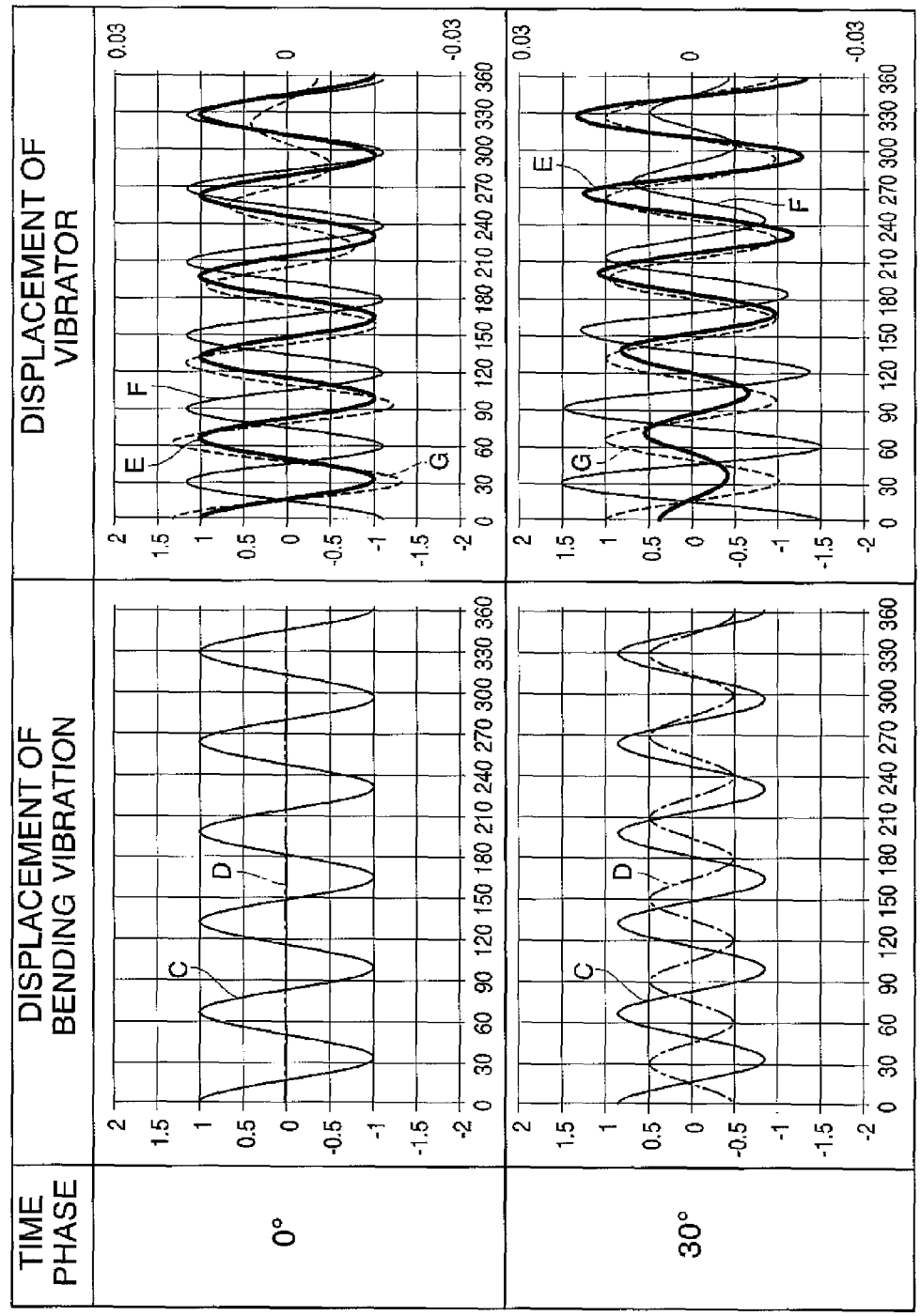
FIG. 43 is a graph showing respective displacements of the tenth-order out-of-plane bending vibration and the eleventh-order out-of-plane bending vibration in a case where the time phase difference between the two vibrations is set to 90°, and displacement of the vibrator resulting from superposition of the two vibrations, on a time phase-by-time phase basis.
Figure 44:
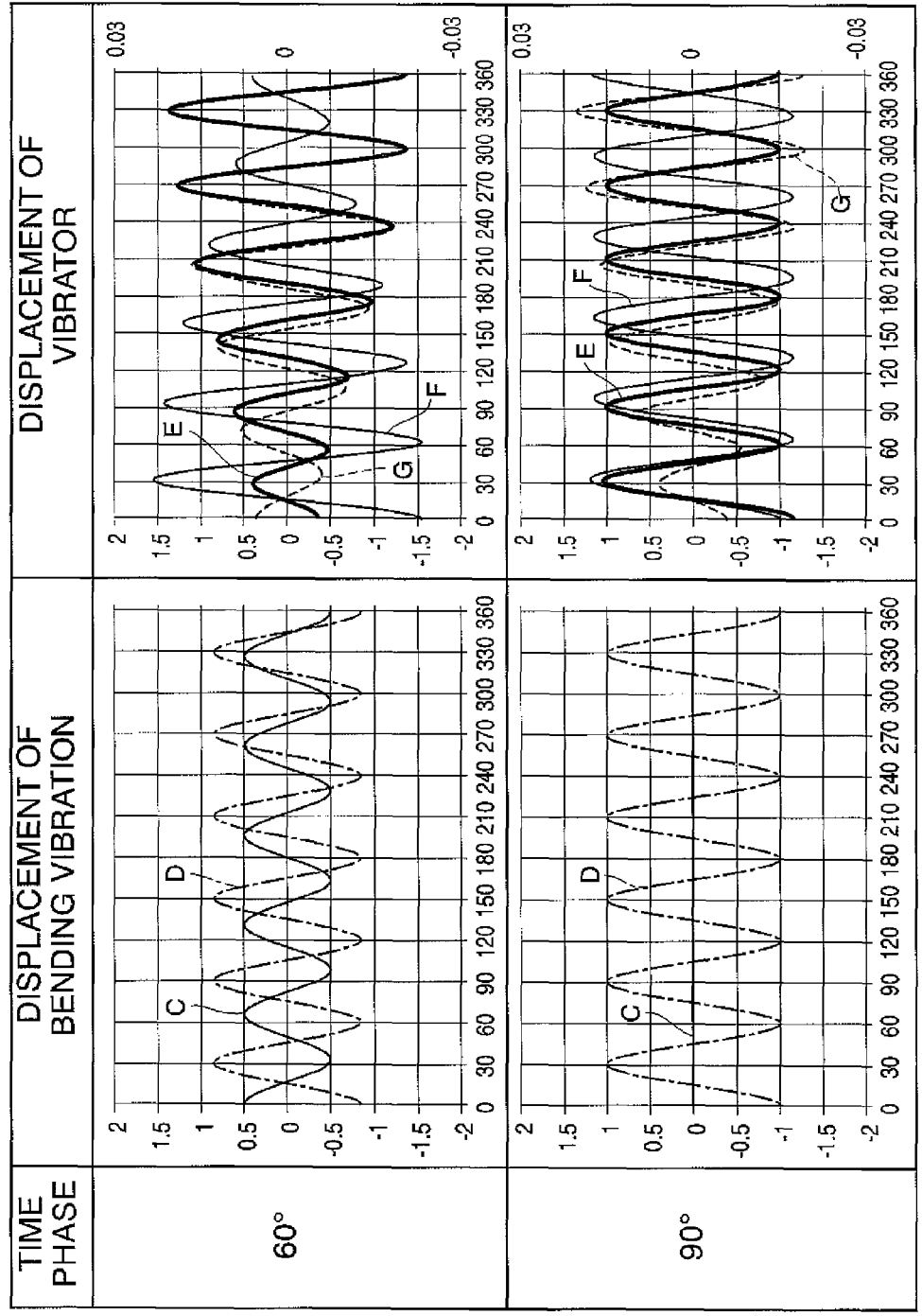
FIG. 44 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.
Figure 45:
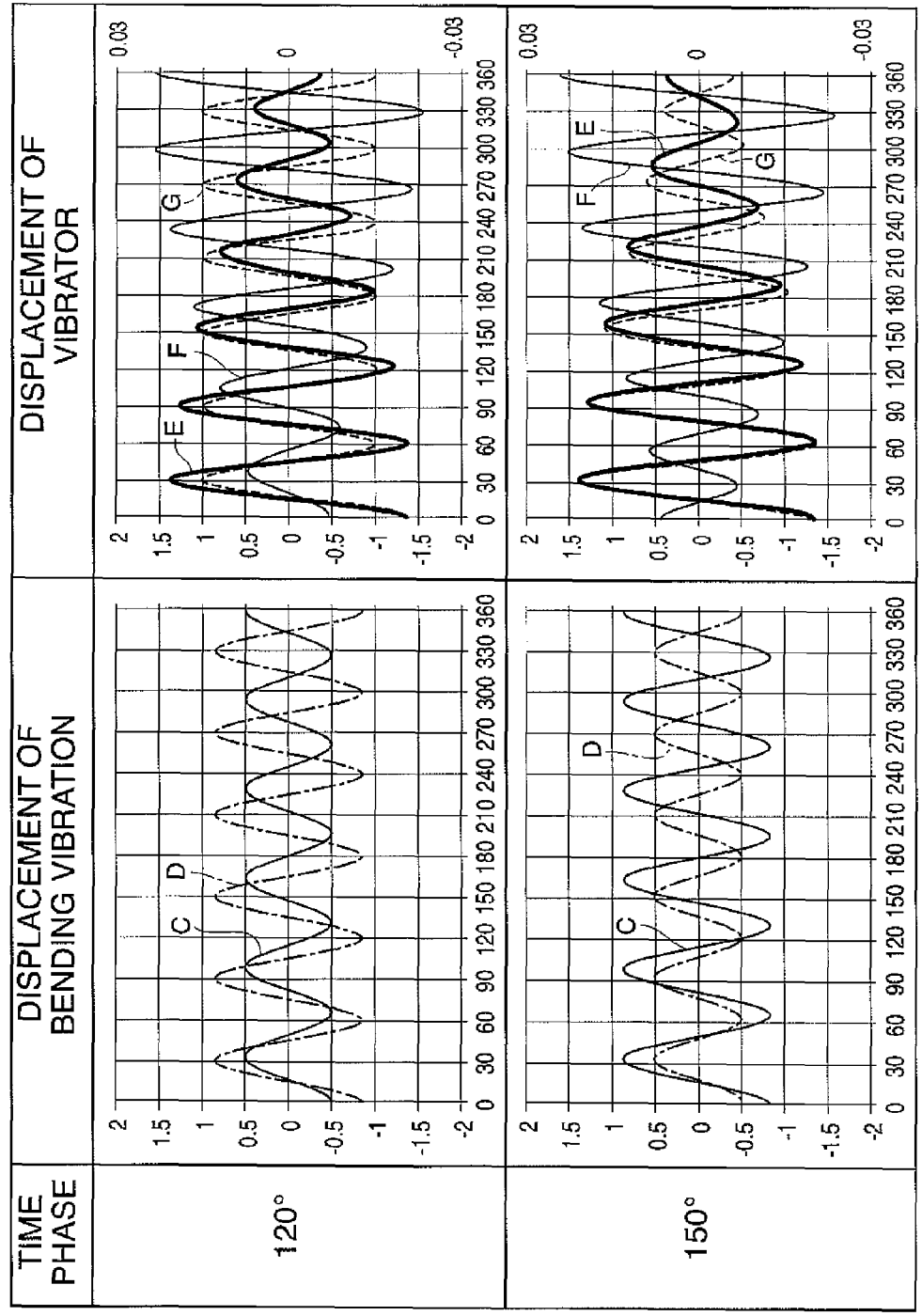
FIG. 45 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.
Figure 46:
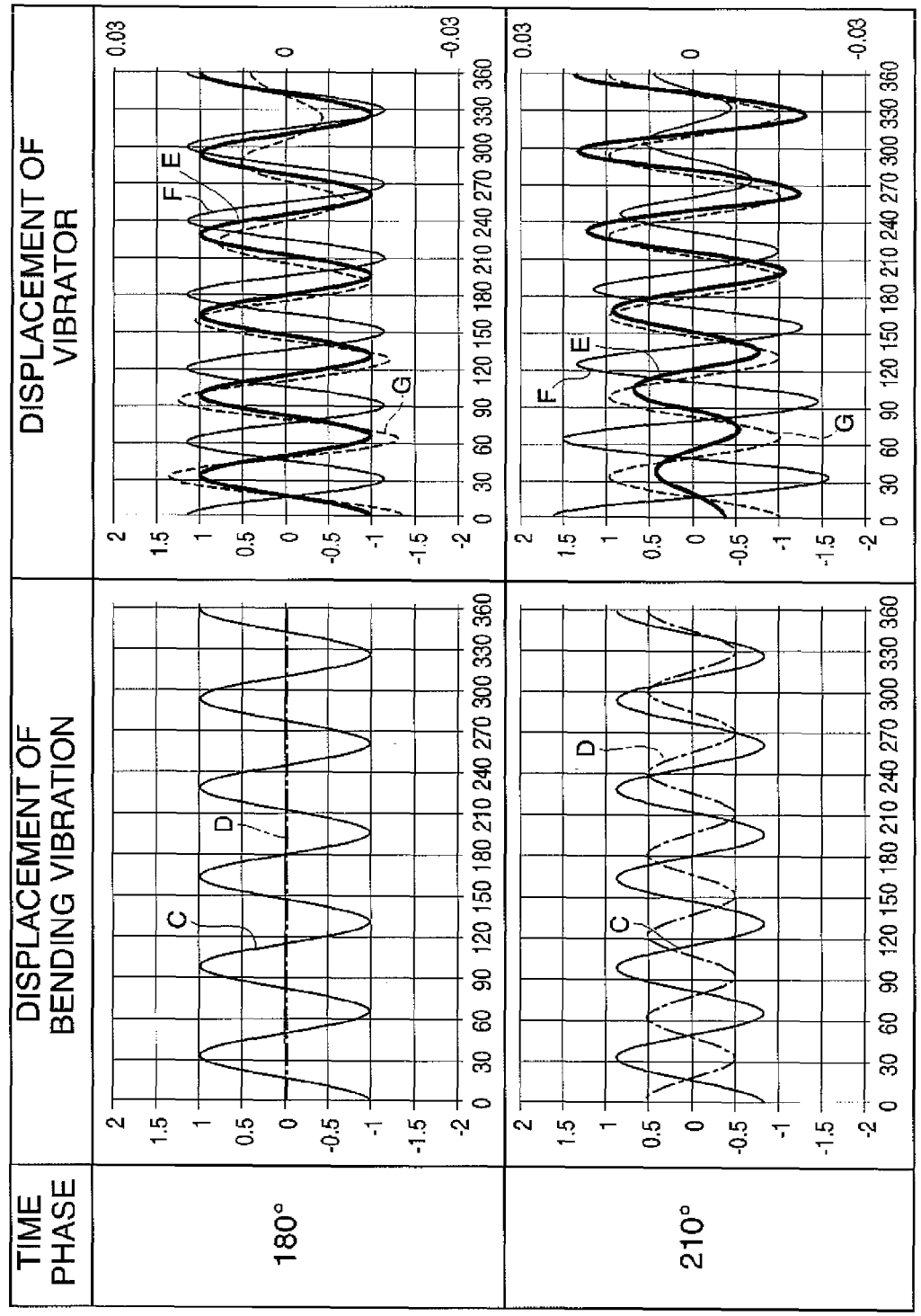
FIG. 46 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.
Figure 47:
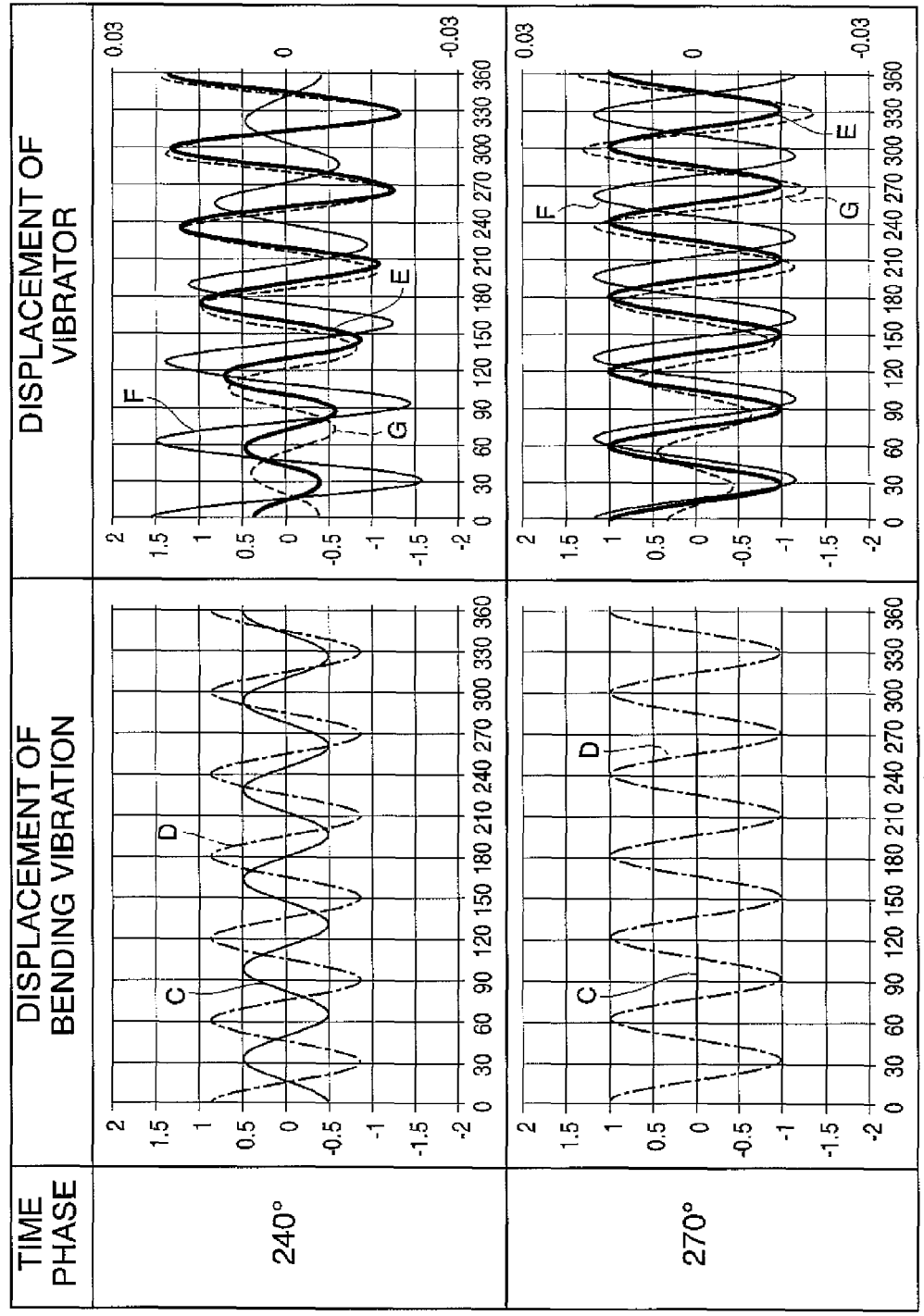
FIG. 47 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.
Figure 48:
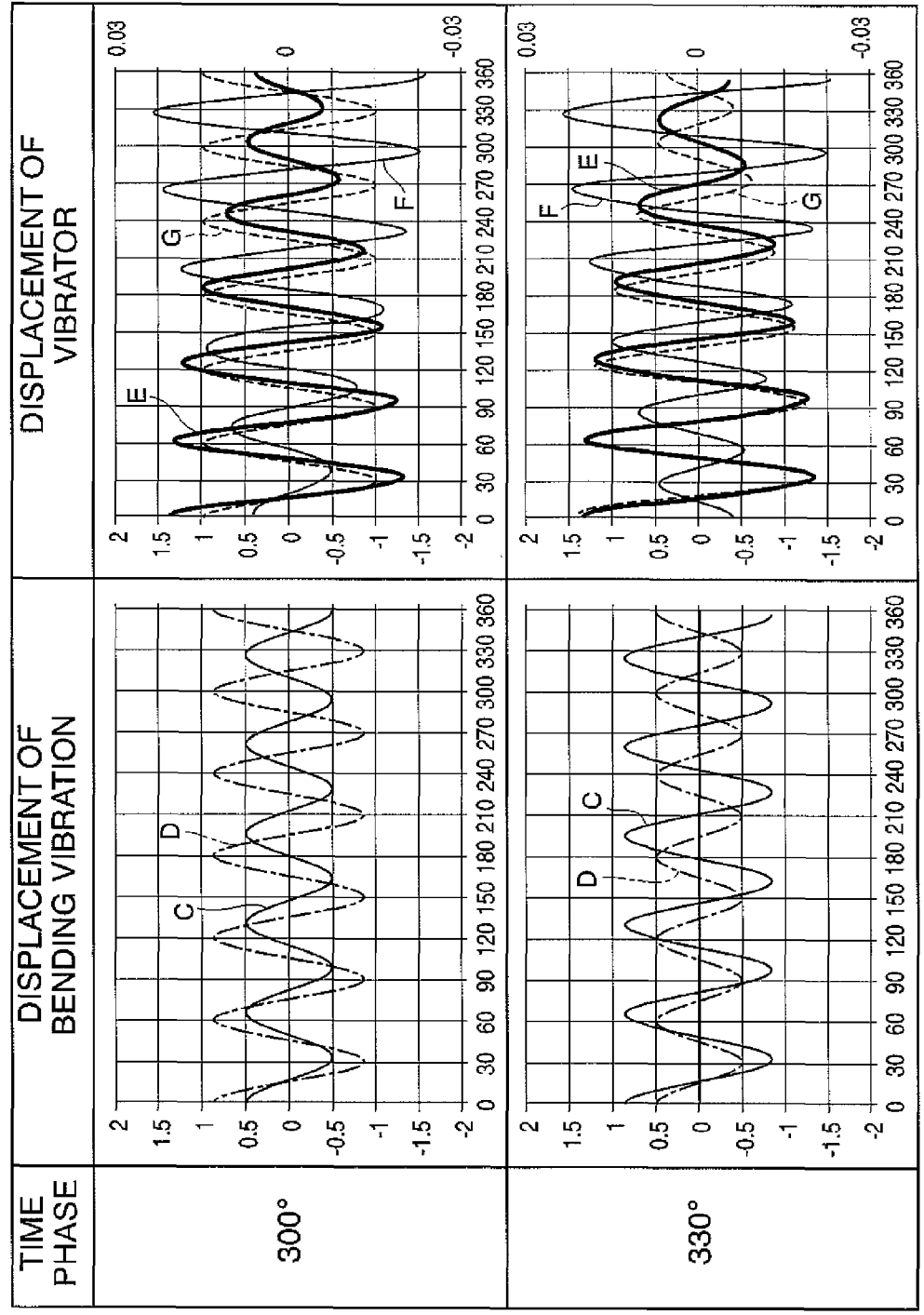
FIG. 48 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.
Figure 49:
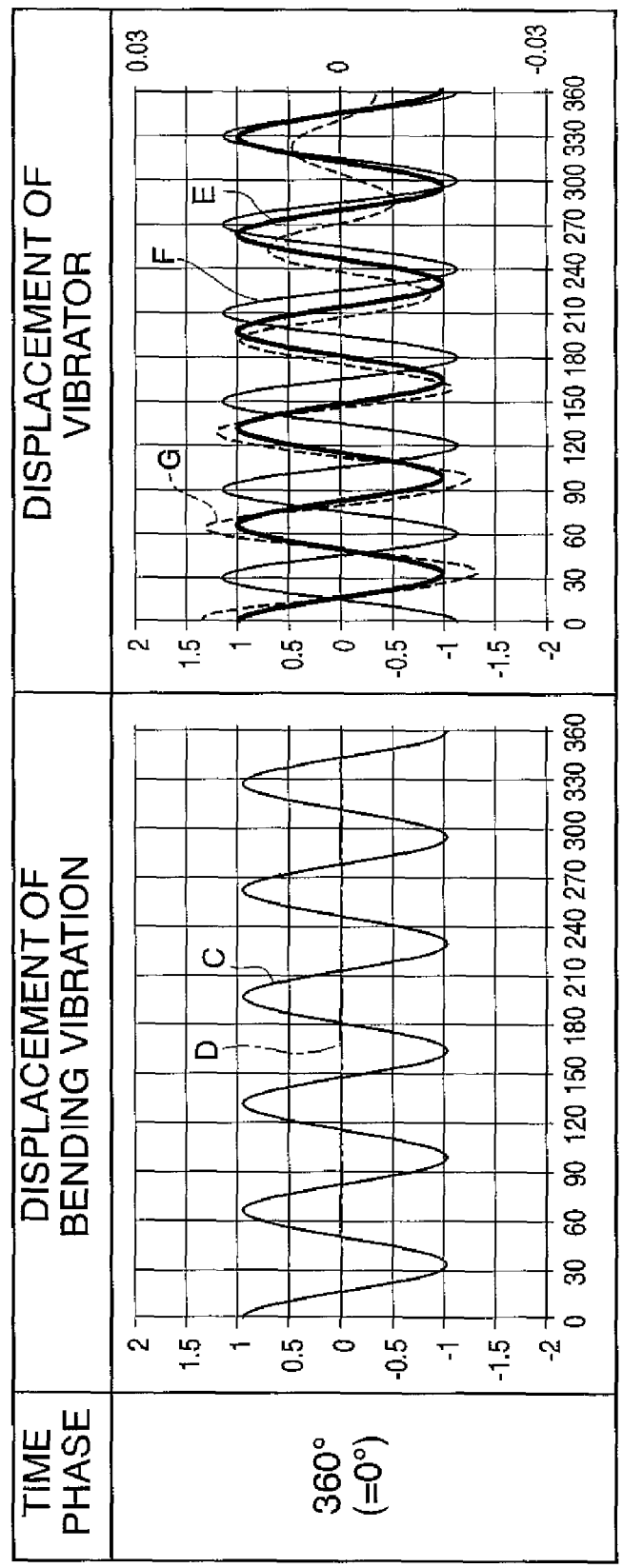
FIG. 49 is a graph showing respective displacements of the tenth-order out-of-plane bending vibration and the eleventh-order out-of-plane bending vibration in the case where the time phase difference between the two vibrations is set to 90°, and displacement of the vibrator resulting from superposition of the two vibrations, on a time phase-by-time phase basis.

FIGS. 42A and 42B show respective displacements of the tenth-order out-of-plane bending vibration and the eleventh-order out-of-plane bending vibration which are excited in the vibrator 3 and are deformed out of plane along the length of the vibrator 3, and the arrangement of the piezoelectric elements 2a and 2b. The abscissa represents the position of the vibrator 3 in a case where the length of the vibrator 3 in the longitudinal direction is set to "360". The ordinate represents values obtained by normalizing the out-of-plane displacement. In FIGS. 42A and 42B, a waveform B shows the tenth-order out-of-plane bending vibration, and a waveform A shows the eleventh-order out-of-plane bending vibration. The effective portion of the optical element 1 for the image pickup device 4 corresponds to a range from a location 100 to a location 260.

FIGS. 43, 44, 45, 46, 47, 48, and 49 show graphs showing displacement of the tenth-order out-of-plane bending vibration and that of the eleventh-order out-of-plane bending vibration in a case where the time phase difference between the two vibrations is set to 90°, and displacement of the vibrator resulting from superposition of the two vibrations, on a time phase-by-time phase basis. In these figures, a waveform C represents the displacement of the tenth-order out-of-plane bending vibration. A waveform D represents the displacement of the eleventh-order out-of-plane bending vibration. A waveform E represents the displacement of the vibrator resulting from superposition of the two vibrations. A waveform G represents the displacement of the vibrator in a 30° earlier time phase than the time phase of the waveform E. A waveform F represents the normalized Y-direction displacement speed of the vibrator 3.

In the foreign substance removing device, when the optical member 1 thrusts up the foreign substance out of the plane, the foreign substance adhering to the front surface of the optical member 1 receives a force in the normal direction and is moved in a repelled fashion. More specifically, when the waveform F indicative of the normalized Y-direction displacement speed of the vibrator 3 assumes a positive value in each time phase, the foreign substance is thrust up out of plane, and receives a force in the normal direction of the waveform E indicative of the displacement of the vibrator 3 in this time phase to be moved away.

According to the foreign substance removing device of the fourth embodiment, similarly to the first to third embodiments, by repeatedly applying vibration to a foreign substance adhering to an area ranging between the location 100 and the location 260 as the effective portion of the optical member 1 for the image pickup device 4, it is possible to move the foreign substance rightward, as viewed in the figures, to thereby remove the same.

As described above, according to the first to fourth embodiments, an alternating voltage having a frequency between the resonance frequencies of respective two out-of-plane bending vibrations different in order by one is applied to each of the piezoelectric elements 2 to excite a vibration having a response of the resonance phenomenon occurring between the two out-of-plane bending vibrations in the vibrator 3. This makes it possible to reduce the difference between the frequency of the applied voltage and the frequency of each of the resonance frequencies of respective two out-of-plane bending vibrations and excite a larger vibration in the vibrator 3 with a response of a larger resonance phenomenon of each vibration. Thus, the speed at which the foreign substance adhering to the optical member 1 is moved can be increased, and therefore it is possible to remove the foreign substance in a shorter time.

Fifth Embodiment

A foreign substance removing device according to the fifth embodiment is distinguished from the above-described first to fourth embodiments in that a frequency between the respective resonance frequencies of the first-order out-of-plane bending vibration and the third-order out-of-plane bending vibration which are deformed out of plane along the length of the vibrator 3 is applied to the piezoelectric elements 2. As a consequence, the first-order out-of-plane bending vibration having large displacement with a response of the resonance phenomenon and the third-order out-of-plane bending vibration with a time phase difference of −90° (i.e. 90° later than the first-order out-of-plane bending vibration) are simultaneously excited in the vibrator 3 with the same frequency. The vibrator 3 is deformed such that the two vibrations are superposed. It should be noted that the foreign substance removing device according to the fifth embodiment is installed in a camera as in the first embodiment, and is identical in construction to the foreign substance removing device according to the first embodiment.

Figure 50A:
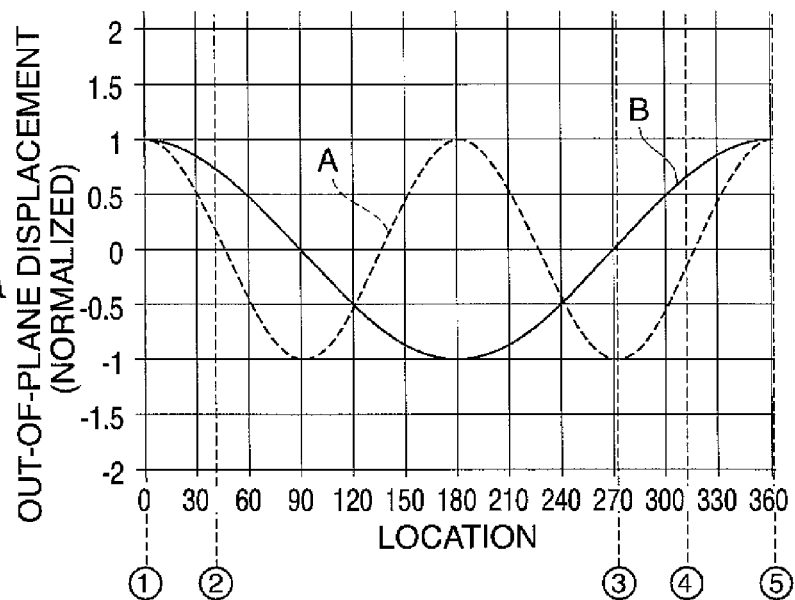
FIGS. 50A and 50B are a view showing respective displacements of a first-order out-of-plane bending vibration and a third-order out-of-plane bending vibration which are excited in the vibrator and deformed out of plane along the length of the vibrator, and the arrangement of piezoelectric elements of a foreign substance removing device according to a fifth embodiment of the present invention.
Figure 50B:
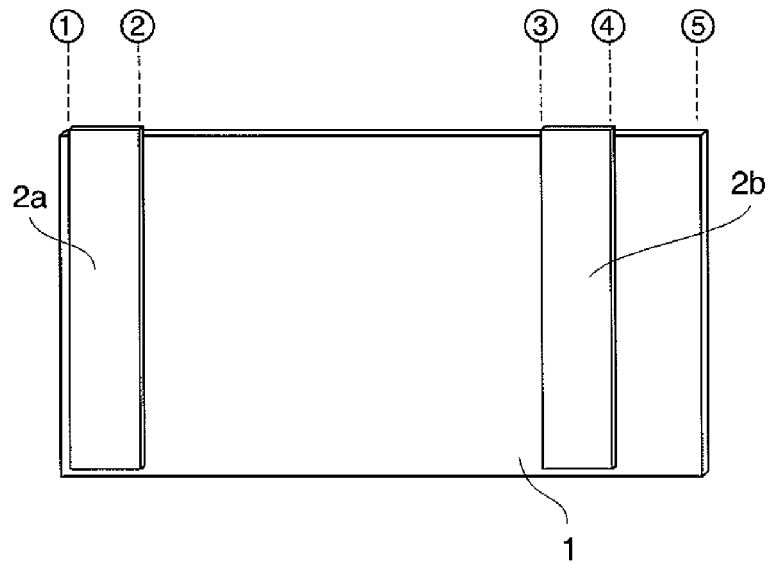
Figure 51:
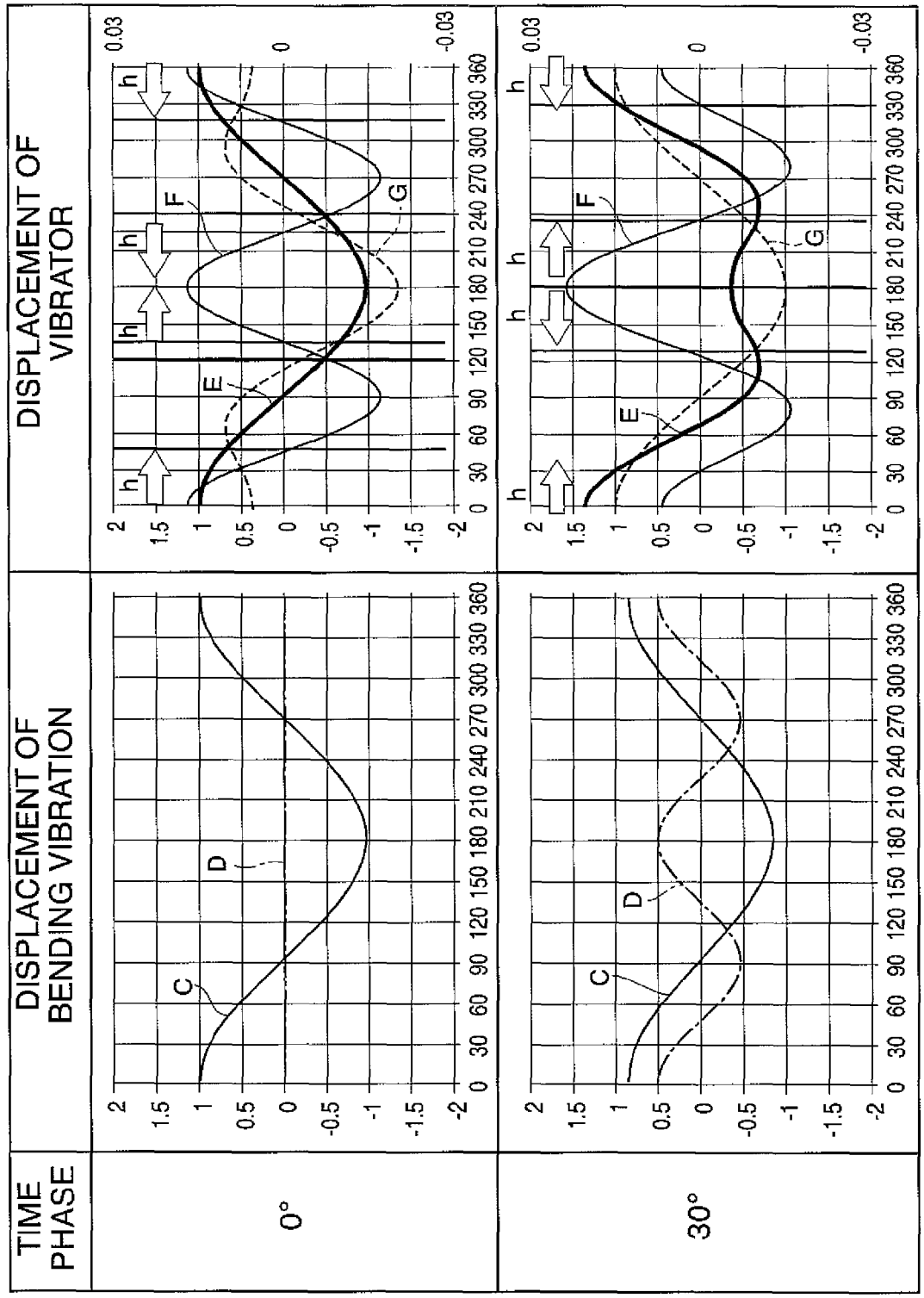
FIG. 51 is a graph showing respective displacements of the first-order out-of-plane bending vibration and the third-order out-of-plane bending vibration in a case where the time phase difference between the two vibrations is set to −90°, and displacement of the vibrator resulting from superposition of the two vibrations, on a time phase-by-time phase basis.
Figure 52:
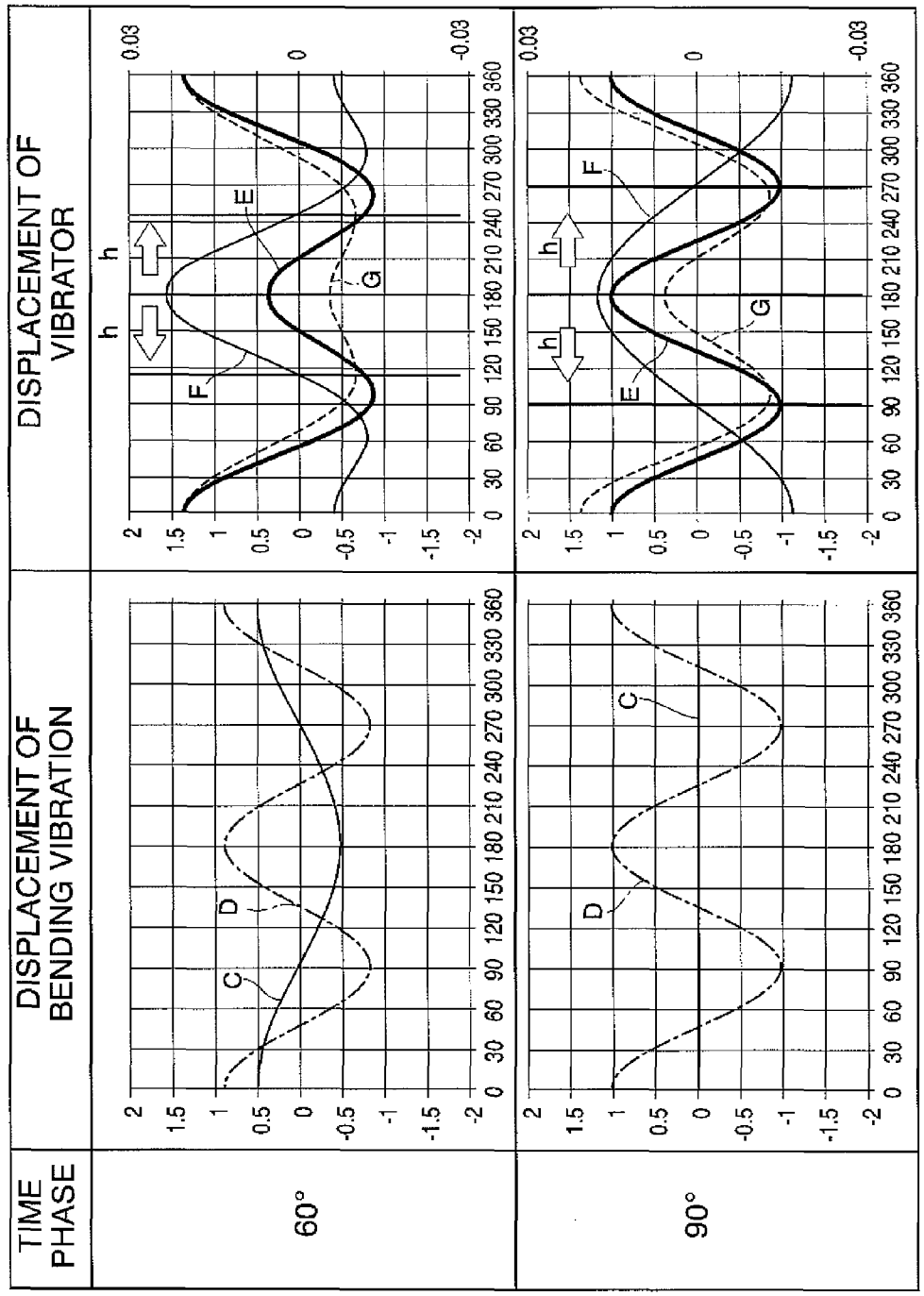
FIG. 52 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.
Figure 53:
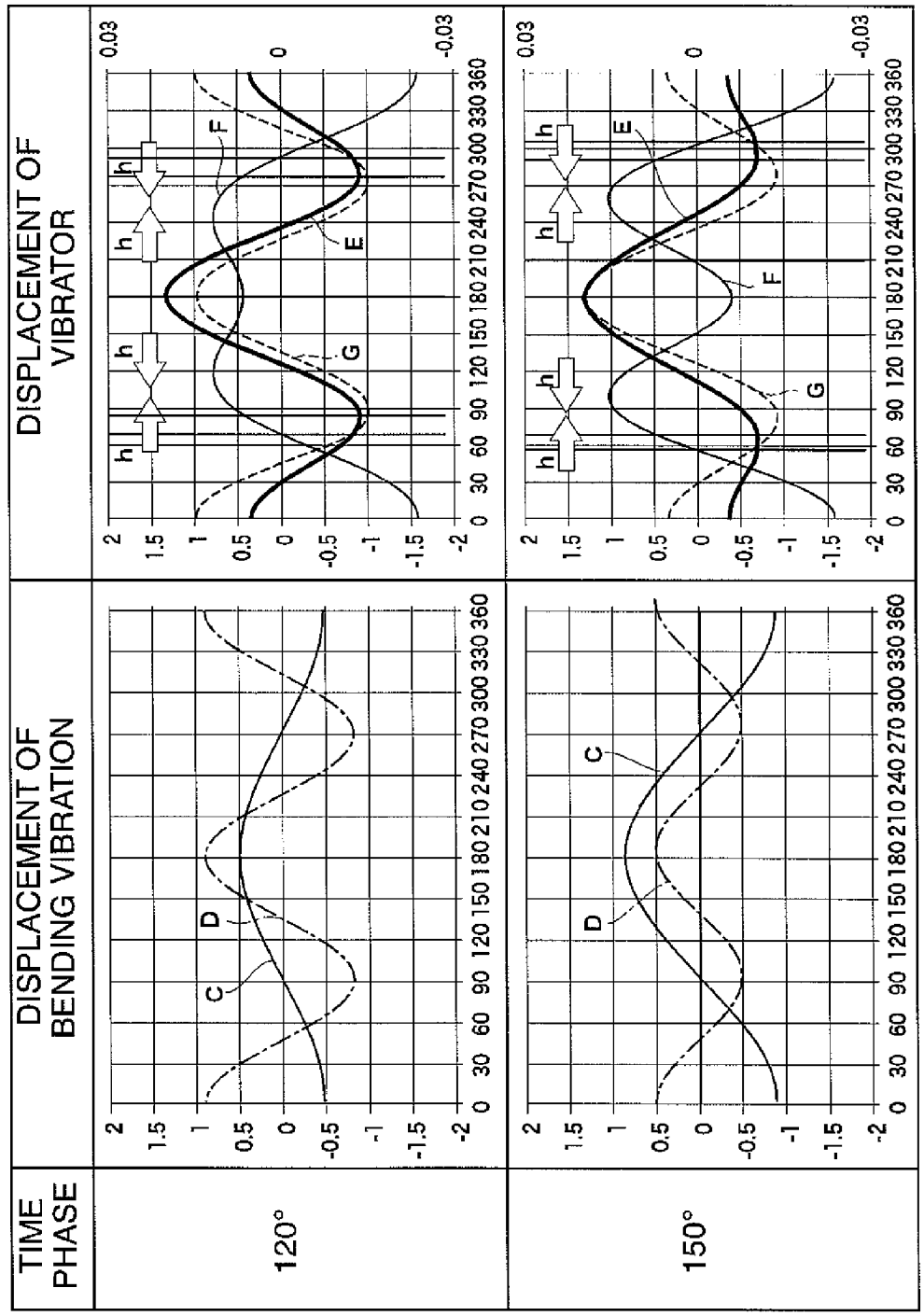
FIG. 53 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.
Figure 54:
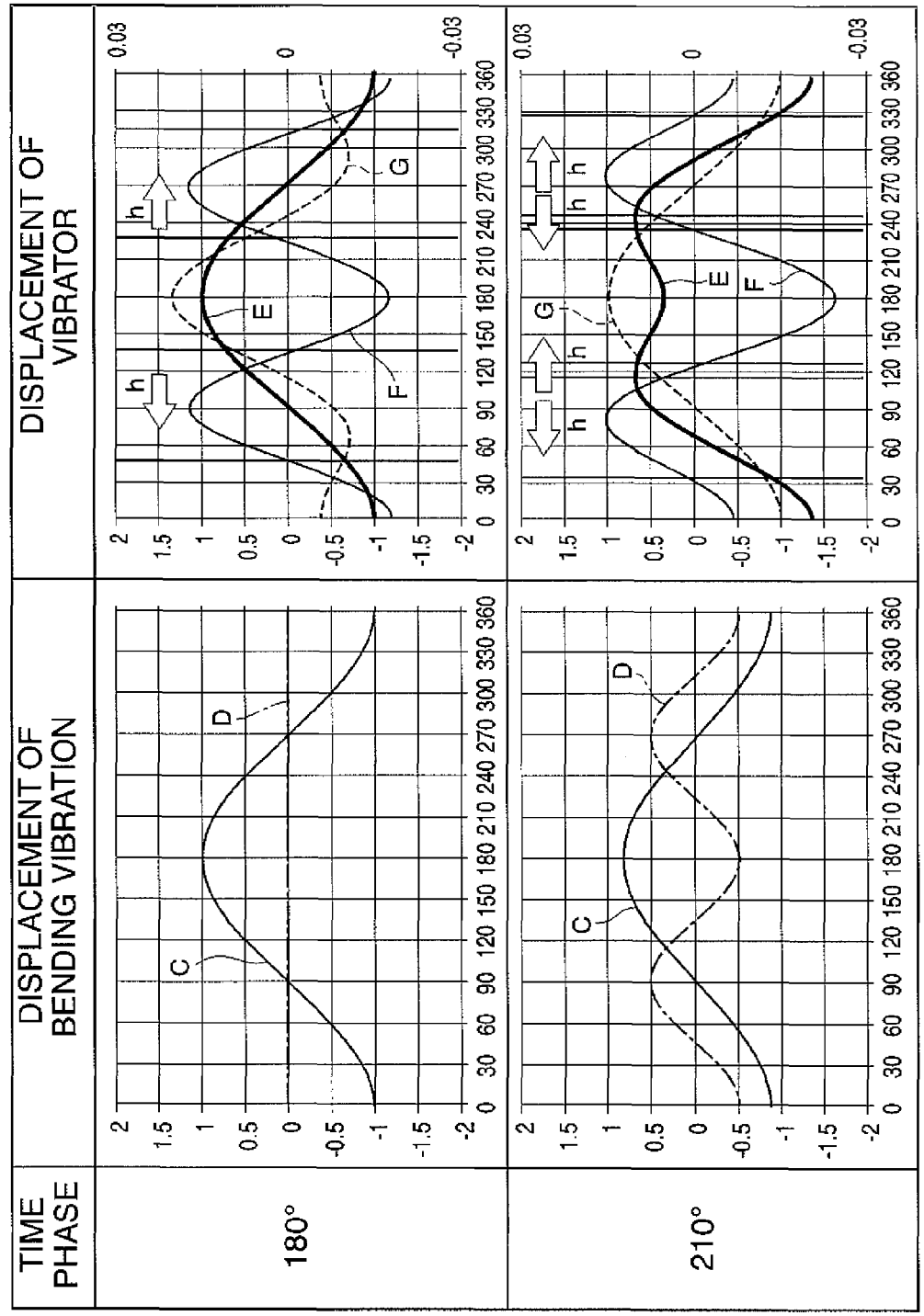
FIG. 54 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.
Figure 55:
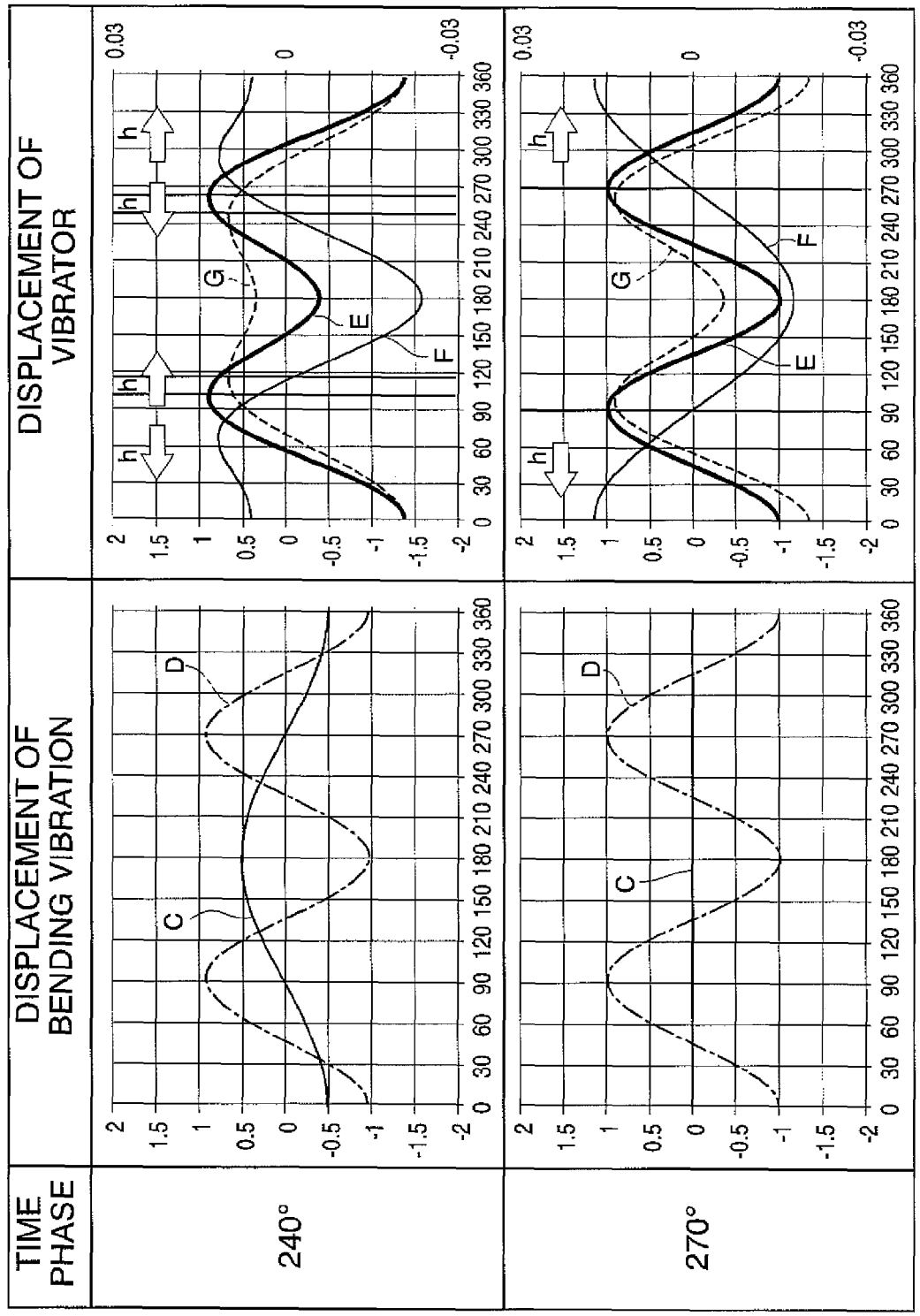
FIG. 55 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.
Figure 56:
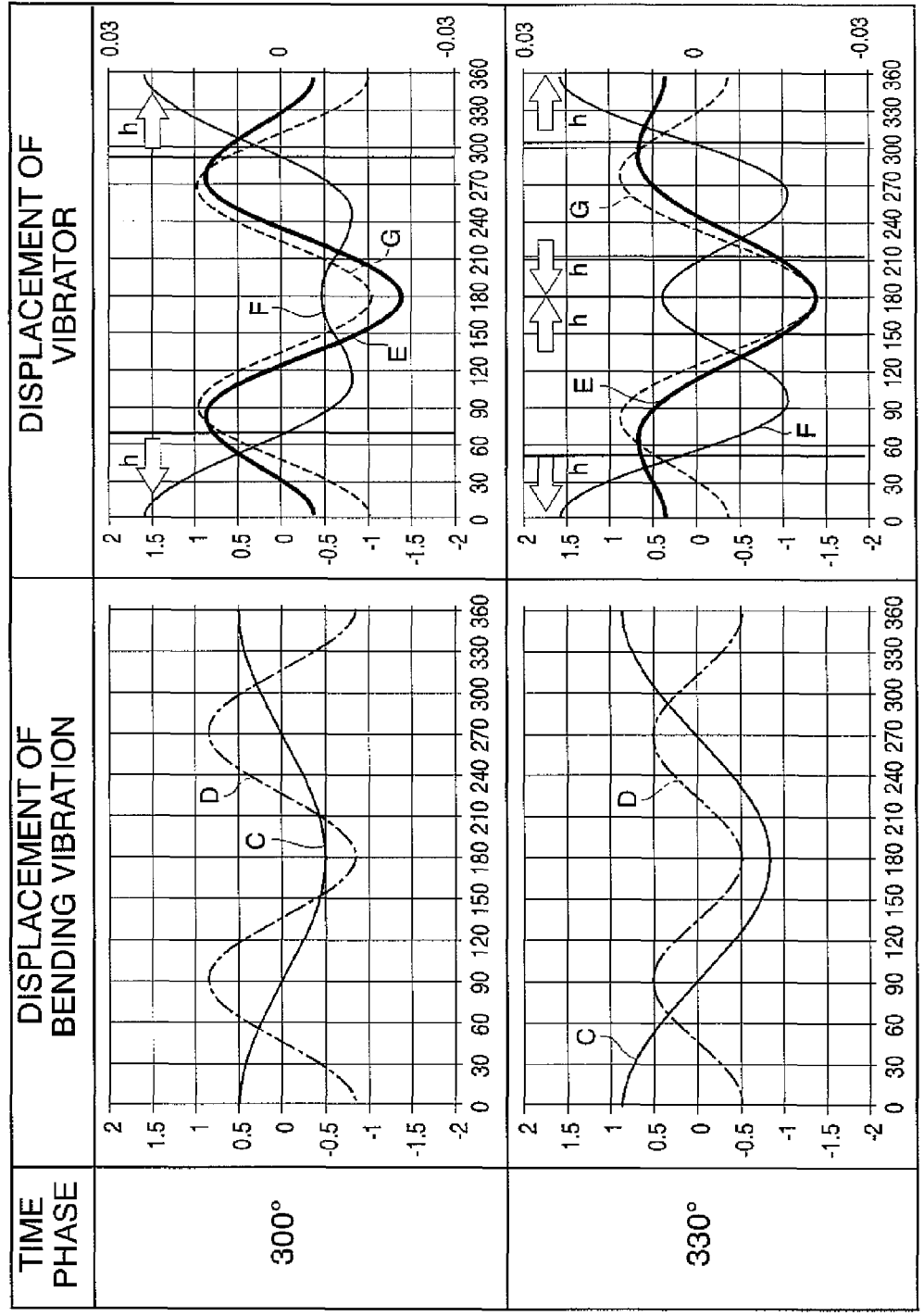
FIG. 56 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.
Figure 57:
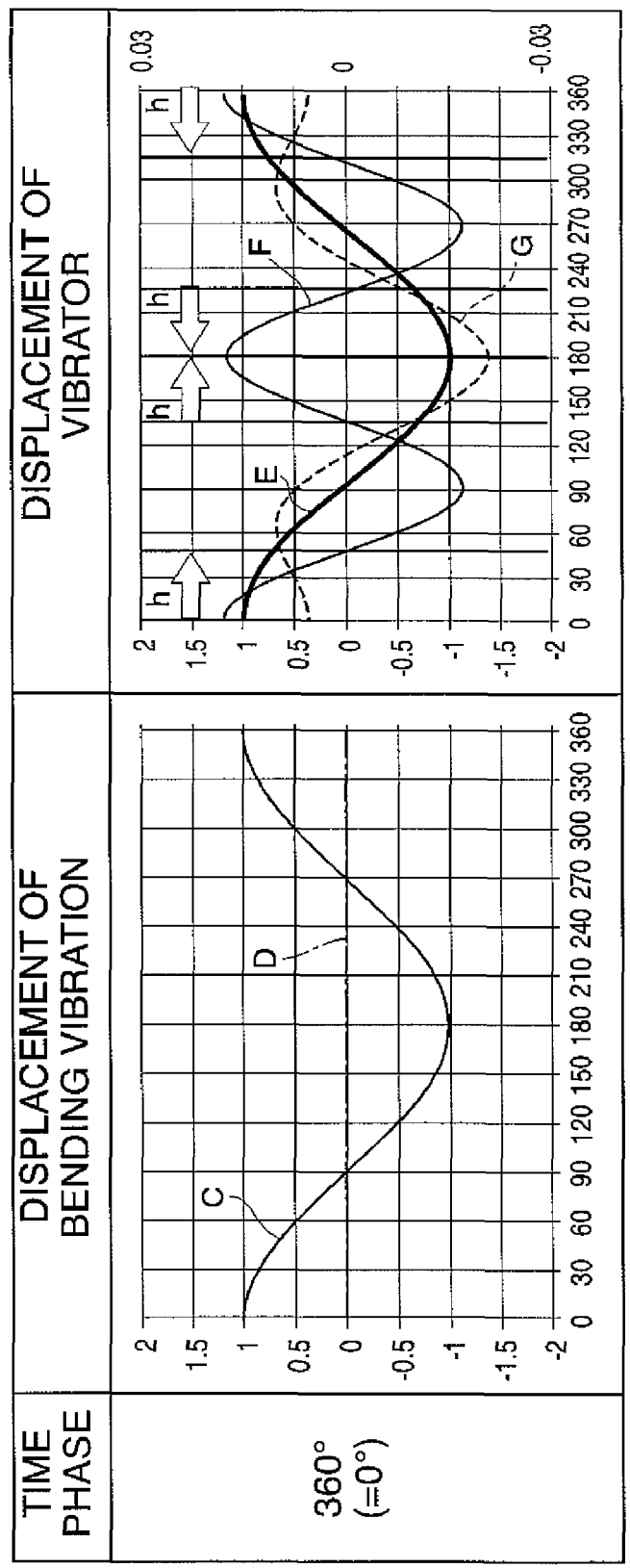
FIG. 57 is a graph showing respective displacements of the first-order out-of-plane bending vibration and the third-order out-of-plane bending vibration in the case where the time phase difference between the two vibrations is set to −90°, and displacement of the vibrator resulting from superposition of the two vibrations, on a time phase-by-time phase basis.

FIGS. 50A and 50B show respective displacements of the first-order out-of-plane bending vibration and the third-order out-of-plane bending vibration which are excited in the vibrator 3 and deformed out of plane along the length of the vibrator 3, and the arrangement of the piezoelectric elements 2a and 2b. The abscissa represents the position of the vibrator 3 in a case where the length of the vibrator 3 in the longitudinal direction is set to "360". The ordinate represents values obtained by normalizing the out-of-plane displacement. In FIGS. 50A and 50B, a waveform B shows the first-order out-of-plane bending vibration, and a waveform A shows the third-order out-of-plane bending vibration. The effective portion of the optical element 1 for the image pickup device 4 corresponds to a range from a location 100 to a location 260.

FIGS. 51, 52, 53, 54, 55, 56, and 57 show graphs showing displacements of the first-order out-of-plane bending vibration and the third-order out-of-plane bending vibration in a case where the time phase difference between the two vibrations is set to −90°, and displacement of the vibrator resulting from superposition of the two vibrations, on a time phase-by-time phase basis. In these figures, a waveform C represents the displacement of the first-order out-of-plane bending vibration. A waveform D represents the displacement of the third-order out-of-plane bending vibration. A waveform E represents the displacement of the vibrator resulting from superposition of the two vibrations. A waveform G represents the displacement of the vibrator in a 30° earlier time phase than the time phase of the waveform E. A waveform F represents the normalized Y-direction displacement speed of the vibrator 3.

In the foreign substance removing device, when the optical member 1 thrusts up a foreign substance out of plane, the foreign substance adhering to the front surface of the optical member 1 receives a force in the normal direction of the surface of the optical member 1 and is moved in a repelled fashion. More specifically, when the waveform F indicative of the normalized Y-direction displacement speed of the vibrator 3 assumes a positive value in each time phase, the foreign substance is thrust up out of plane, and receives a force in the normal direction of the waveform E indicative of the displacement of the vibrator 3 in this time phase to be moved away. Each arrow h in the figures indicates a direction in which the foreign substance moves in a section.

According to the foreign substance removing device of the fifth embodiment, by repeatedly applying vibration to the foreign substance adhering to an area ranging between the location 100 and the location 260 as the effective portion of the optical member 1 for the image pickup device 4, it is possible to move the foreign substance rightward, as viewed in the figures, to thereby remove the same. Further, in the present embodiment, on a side leftward, as viewed in the figures, of the location 180 as the center position, a foreign substance moves leftward, as viewed in the figures, while on a side rightward, as viewed in the figures, of the location 180, a foreign substance moves rightward, as viewed in the figures. Therefore, it is possible to quickly remove the foreign substance from the effective portion of the optical member 1.

In the first to fourth embodiments, an alternating voltage having a frequency between the resonance frequencies of respective two out-of-plane bending vibrations different in order by one is applied to each of the piezoelectric elements, as described hereinbefore. On the other hand, in the fifth embodiment, an alternating voltage having a frequency between the resonance frequencies of respective two out-of-plane bending vibrations different in order by two is applied to each of the piezoelectric elements. In this case as well, it is possible to remove a foreign substance.

It should be noted that in the present embodiment, if the time phases of the respective two vibrations are made different from each other by 90°, on the left side, as viewed in the figures, with respect to the location 180 as the center position, a foreign substance moves rightward as viewed in the figures, while on the right side, as viewed in the figures, with respect to the location 180, a foreign substance moves leftward as viewed in the figures. As a consequence, the foreign substances are collected at a spot at the location 180 as the center position.

Further, in the present embodiment, in a case where two vibrations different in order by two are excited, a foreign substance can also be removed by setting the time phase difference to another desired value. Furthermore, in a case where two vibrations are different in order by three or more, even if the time phase difference between the two vibrations is set to any value, there occurs some spot where foreign substances are collected. In this case, it is required to set the spot where the foreign substances are collected to a location which cannot cause any problem in terms of the functions of the camera.

Further, as described in the first to fifth embodiments, in any combination of orders of two vibrations, a foreign substance can be moved, and therefore it is possible to configure the selected combination such that the foreign substance is removed.

It should be noted that the present invention is not limited to the above-described arrangements of the respective embodiments, but any suitable arrangement may be employed insofar as it can attain the functions of each of the embodiments.

Figure 58:
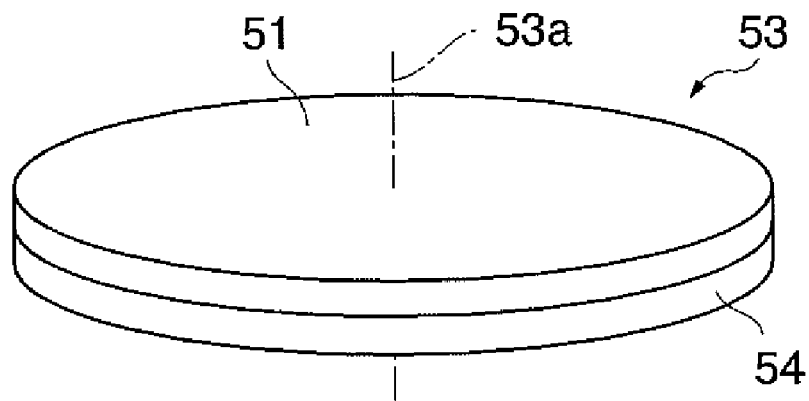
FIG. 58 is a perspective showing the shape of a vibrator in a foreign substance removing device according to another embodiment of the present invention.
Figure 59:
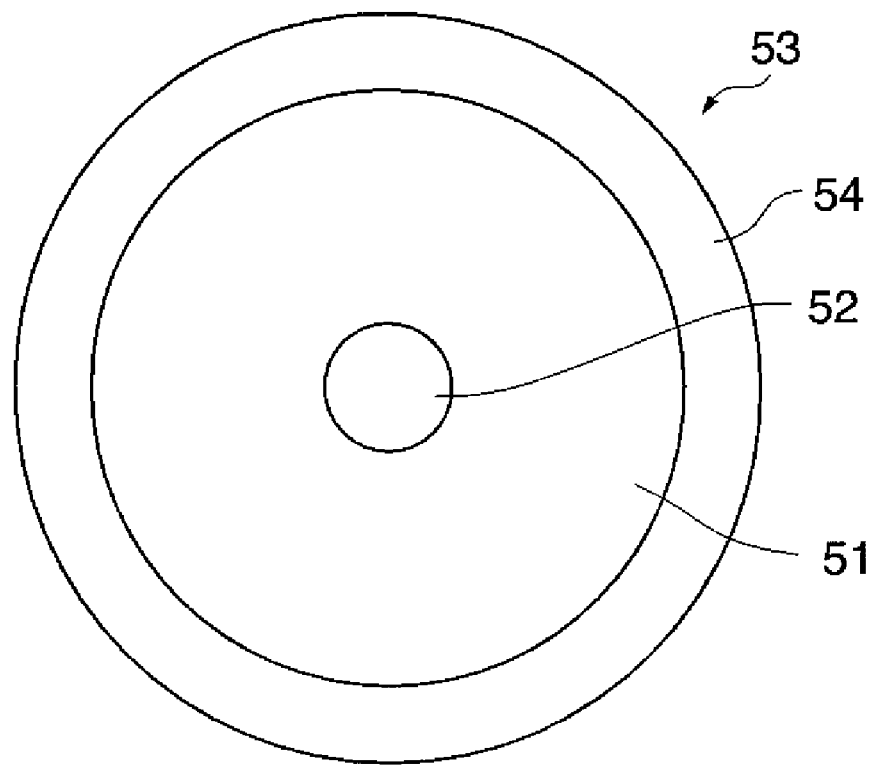
FIG. 59 is a view showing the arrangement of piezoelectric elements of the vibrator.

For example, in each of the above-described arrangements, the vibrator of the foreign substance removing device installed in a camera has a rectangular shape, but this is not limitative. FIG. 58 is a perspective showing the shape of a vibrator in a foreign substance removing device according to another embodiment. This foreign substance removing device is installed in a camera. FIG. 59 is a view showing the arrangement of piezoelectric elements of the vibrator. The vibrator 53 is comprised of a disk-shaped optical member 51 having an axis 53a as a center, a small disk-shaped piezoelectric element 52 rigidly glued to a central part of the rear surface of the optical member 51, and an annular piezoelectric element 54 rigidly glued to the periphery of the rear surface of the optical member 51. The piezoelectric elements 52 and 54 are transparent electromechanical energy conversion elements formed of lithium niobate.

Figure 60:
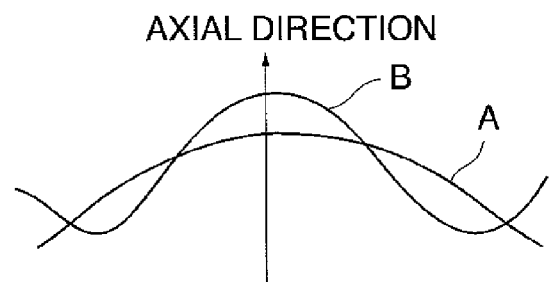
FIG. 60 is a diagram showing a first-order out-of-plane bending vibration and a second-order out-of-plane bending vibration.
Figure 61:
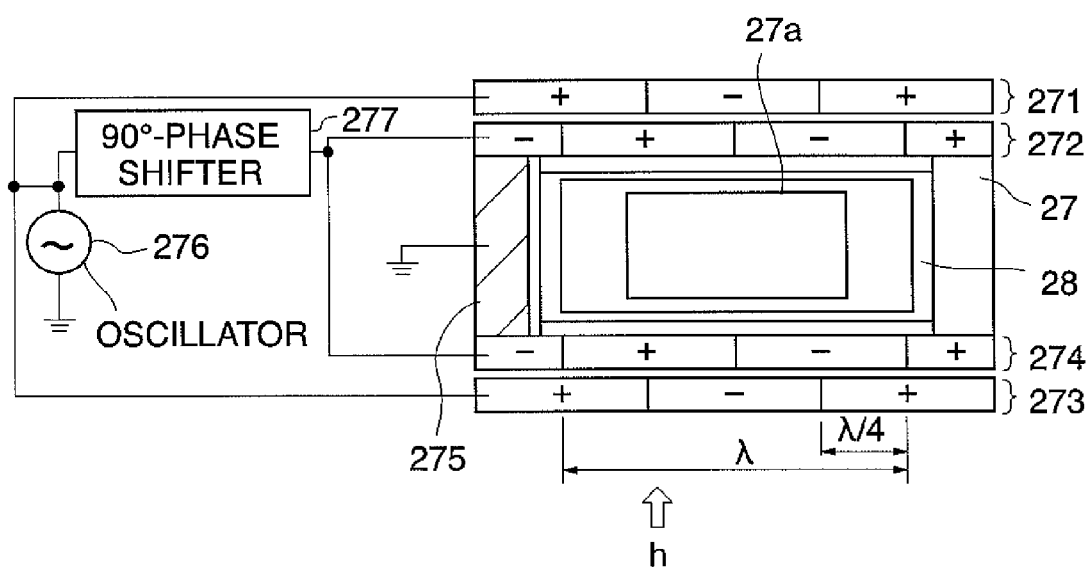
FIG. 61 is a view of a conventional dustproof device.

FIG. 60 is a diagram showing a first-order out-of-plane bending vibration and a second-order out-of-plane bending vibration. The frequency of an alternating voltage to be applied to each of the piezoelectric elements 52 and 54 disposed in the central part and the outer periphery, respectively, is set to a frequency between the resonance frequency of the first-order out-of-plane bending vibration deformed in the axial direction of the disk and that of the second-order out-of-plane bending vibration also deformed in the axial direction of the disk. In FIG. 60, a waveform A and a waveform B show the first-order out-of-plane bending vibration and the second-order out-of-plane bending vibration, respectively. Further, the time phase difference between the alternating voltages to be applied to the respective piezoelectric elements 52 and 54 disposed in the central part and the outer periphery, respectively, is set to 90°.

On the thus shaped vibrator 53, a foreign substance is moved from the center position of the optical member 51 toward the outer peripheral edge of the same, and is removed from the optical member 51. It should be noted that the shape of the vibrator is not limited to a disk shape, but it suffices that the vibrator has a shape having ends. In this case, the vibrator is capable of moving the foreign substance toward an end or away from the end to thereby remove the foreign substance.

Further, although in each of the above described embodiments, the foreign substance removing device according to the present invention is applied to a camera as an optical apparatus, the foreign substance removing device can also be applied to a facsimile machine, a scanner, a projector, a copying machine, a laser beam printer, an ink-jet printer, a lens, binoculars, an image display apparatus, and other optical apparatuses. Further, the foreign substance removing device according to the present invention is also applicable to various apparatuses other than optical apparatuses, which require removal of foreign substances.

INDUSTRIAL APPLICABILITY

The foreign substance removing device according to the present invention can be applied to can be applied to optical apparatuses, such as a camera, a facsimile machine, a scanner, a projector, a copying machine, a laser beam printer, an ink-jet printer, a lens, binoculars, an image display apparatus, as well as various apparatuses which require removal of foreign substances, whereby it is capable of moving foreign substances in a desired direction at a high removing efficiency to remove the foreign substance therefrom.

The invention claimed is:

1. A foreign substance removing device that removes a foreign substance on an object therefrom, comprising:
    a vibrator comprising of the object, and a first electromechanical energy conversion element and a second electromechanical energy conversion element disposed on the object;
    power supplies configured to apply alternating voltages to said first and second electromechanical energy conversion elements, respectively; and
    a control circuit configured to control the alternating voltages respectively applied by said power supplies,
    wherein, in order to generate a vibration obtained by superposing a first standing wave and a second standing wave different in order, said control circuit sets a frequency of the alternating voltages, and makes respective phases of the alternating voltages applied to said first and second electromechanical energy conversion elements different from each other.

2. The foreign substance removing device according to claim 1, wherein a plurality of nodes of the first standing wave and a plurality of nodes of the second standing wave are arranged in a same direction, and said first electromechanical energy conversion element and said second electromechanical energy conversion element are disposed in a manner displaced in position in the same direction.

3. The foreign substance removing device according to claim 1, wherein the first standing wave and the second standing wave are different in order by one.

4. The foreign substance removing device according to claim 1, wherein said control circuit sets a phase difference between the alternating voltage applied to said first electromechanical energy conversion element and the alternating voltage applied to said second electromechanical energy conversion element to any value except 0° and 180°.

5. The foreign substance removing device according to claim 1, wherein depending on a position of the foreign substance on the object, a phase difference of the alternating voltage applied to said second electromechanical energy conversion element with respect to the alternating voltage applied to said first electromechanical energy conversion element is switched between a value larger than 0° and smaller than 180° and a value larger than −180° and smaller than 0°.

6. The foreign substance removing device according to claim 1, wherein depending on a position of a center of gravity of the foreign substance and a position of contact of the foreign substance with the object, a phase difference of the alternating voltage applied to said second electromechanical energy conversion element with respect to the alternating voltage applied to said first electromechanical energy conversion element is switched between a value larger than 0° and smaller than 180° and a value larger than −180° and smaller than 0°.

7. The foreign substance removing device according to claim 1, wherein said control circuit switches between:
    driving of said vibrator by setting a phase difference between the alternating voltage applied to said first electromechanical energy conversion element and the alternating voltage applied to said second electromechanical energy conversion element to any value except 0° and 180°, and causing the first standing wave and the second standing wave different in order to be concurrently generated in said vibrator, and
    driving of said vibrator by causing one standing wave to be generated in said vibrator.

8. The foreign substance removing device according to claim 7, wherein said control circuit sets a phase difference between the alternating voltage applied to said first electromechanical energy conversion element and the alternating voltage applied to said second electromechanical energy conversion element to any value except 0° and 180°, and causes the first standing wave and the second standing wave different in order to be concurrently generated in said vibrator, to thereby move the foreign substance on the object, and then causes one standing wave to be generated in said vibrator to thereby cause the foreign substance on the object to jump off.

9. The foreign substance removing device according to claim 1, comprising a first sensor and a second sensor provided on said first electromechanical energy conversion element and said second electromechanical energy conversion element, respectively, for detecting amplitudes of the two standing waves different in order, respectively, and
wherein said control circuit controls at least one of the frequency, the amplitudes, and a phase difference of the alternating voltages, according to a ratio between an output from said first sensor and an output from said second sensor.

10. The foreign substance removing device according to claim 1, including an attitude sensor configured to detect an attitude of said vibrator, and
wherein said control circuit sets respective phases of the alternating voltages such that a direction of removing the foreign substance on the object, determined from the detected attitude, becomes smaller than 90° with respect to a direction of gravity.

11. The foreign substance removing device according to claim 1, wherein the object is an optical member that passes light therethrough.

12. The foreign substance removing device according to claim 1, wherein the object is a rectangular optical member.

13. The foreign substance removing device according to claim 1, wherein the foreign substance removing device is installed on any of a camera, a facsimile apparatus, a scanner, a projector, a copying machine, a laser beam printer, an inkjet printer, a lens, binoculars, and an image display device.

14. A method of removing a foreign substance on an object therefrom, a vibrator comprising of the object, and a first electromechanical energy conversion element and a second electromechanical energy conversion element disposed on the object, comprising:
a voltage application step of applying alternating voltages to the first electromechanical energy conversion element and the second electromechanical energy conversion element from power supplies, respectively;
a control step of controlling the alternating voltages respectively applied by the power supplies,
wherein said control step includes, so as to generate a vibration obtained by superposing a first standing wave and a second standing wave different in order, setting a frequency of the alternating voltage, and making respective phases of the alternating voltages applied to the first and second electromechanical energy conversion elements different from each other.

15. The method according to claim 14, wherein said control step includes setting a phase difference between the alternating voltage applied to the first electromechanical energy conversion element and the alternating voltage applied to the second electromechanical energy conversion element to any value except 0° and 180°.

16. The method according to claim 15, wherein said control step includes switching between:

driving of the vibrator by setting a phase difference between the alternating voltage applied to the first electromechanical energy conversion element and the alternating voltage applied to the second electromechanical energy conversion element to any value except 0° and 180°, and generating the vibration obtained by superposing first standing wave and the second standing wave different in order, in the vibrator, and
driving of the vibrator by generating one standing wave in the vibrator.

17. The method according to claim 16, wherein in said control step includes setting a phase difference between the alternating voltage applied to the first electromechanical energy conversion element and the alternating voltage applied to the second electromechanical energy conversion element to any value except 0° and 180°, and causing the first standing wave and the second standing wave different in order to be concurrently generated in the vibrator, to thereby move the foreign substance on the object, and then causing one standing wave to be generated in the vibrator to thereby cause the foreign substance on the object to jump off.

18. A foreign substance removing device that removes a foreign substance on an object therefrom, comprising:
a vibrator comprising the object, and a first electromechanical energy conversion element and a second electromechanical energy conversion element disposed on the object, respectively, said vibrator vibrating by alternating voltages being applied to the first electromechanical energy conversion element and the second electromechanical energy conversion element, respectively,
wherein a frequency of the alternating voltages applied to the first electromechanical energy conversion element and the second electromechanical energy conversion element is such a frequency as to excite a vibration obtained by superposing a first bending vibration and a second bending vibration which are different in order from each other, in the vibrator, and
the alternating voltage applied to the first electromechanical energy conversion element and the alternating voltage applied to the second electromechanical energy conversion element are different in phase from each other.

19. The foreign substance removing device according to claim 18, further comprising a control circuit configured to set the alternating voltages respectively applied to the first electromechanical energy conversion element and the second electromechanical energy conversion element.

20. The foreign substance removing device according to claim 18, wherein the frequency of the alternating voltages respectively applied to the first electromechanical energy conversion element and the second electromechanical energy conversion element is set between a resonance frequency of the first bending vibration and a resonance frequency of the second bending vibration.

21. The foreign substance removing device according to claim 18, wherein a plurality of nodes of the first bending vibration and a plurality of nodes of the second bending vibration are arranged in a same direction, and said first electromechanical energy conversion element and said second electromechanical energy conversion element are disposed in a manner displaced in the same direction.

22. The foreign substance removing device according to claim 18, wherein the first bending vibration and the second bending vibration are different in order by one.

23. The foreign substance removing device according to claim 19, wherein said control circuit is configured to set a phase difference between the alternating voltage applied to said first electromechanical energy conversion element and the alternating voltage applied to said second electromechanical energy conversion element to any value except 0° and 18°.

24. The foreign substance removing device according to claim 18, wherein on the basis of a position of the foreign substance on the object, a phase difference of the alternating voltage applied to said second electromechanical energy conversion element with respect to the alternating voltage applied to said first electromechanical energy conversion element is switched between a value larger than 0° and smaller than 180° and a value larger than -180° and smaller than 0°.

25. The foreign substance removing device according to claim 19, wherein on the basis of a position of a center of gravity of the foreign substance and a position of contact of the foreign substance with the object, a phase difference of the alternating voltage applied to said second electromechanical energy conversion element with respect to the alternating voltage applied to said first electromechanical energy conversion element is switched between a value larger than 0° and smaller than 180° and a value larger than -180° and smaller than 0°.

26. The foreign substance removing device according to claim 19, wherein said control circuit is configured to switch between:
   driving of said vibrator by setting a phase difference between the alternating voltage applied to said first electromechanical energy conversion element and the alternating voltage applied to said second electromechanical energy conversion element to any value except 0° and 180°, and exciting a vibration obtained by superposing a first bending vibration and a second bending vibration which are different in order from each other, in the vibrator, and
   driving of said vibrator by causing one bending vibration to be generated in said vibrator.

27. The foreign substance removing device according to claim 26, wherein said control circuit is configured to set a phase difference between the alternating voltage applied to said first electromechanical energy conversion element and the alternating voltage applied to said second electromechanical energy conversion element to any value except 0° and 180°, to excite a vibration obtained by superposing a first bending vibration and a second bending vibration which are different in order from each other, in the vibrator, to thereby move the foreign substance on the object, and then to cause one standing wave to be generated in said vibrator to thereby cause the foreign substance on the object to jump off.

28. The foreign substance removing device according to claim 19, comprising a first sensor and a second sensor provided on said first electromechanical energy conversion element and said second electromechanical energy conversion element, respectively, for detecting amplitudes of the two bending vibrations different in order from each other, respectively, and
   wherein said control circuit is configured to control at least one of the frequency, the amplitudes, and a phase difference of the alternating voltages, according to a ratio between an output from said first sensor and an output from said second sensor.

29. The foreign substance removing device according to claim 19, including an attitude sensor configured to detect an attitude of said vibrator, and
   wherein said control circuit is configured to set respective phases of the alternating voltages such that a direction of removing the foreign substance on the object becomes smaller than 90° with respect to a direction of gravity, a removing direction of the foreign substance on the object is determined from the detected attitude.

30. The foreign substance removing device according to claim 18, wherein the object is an optical member that passes light therethrough.

31. The foreign substance removing device according to claim 18, wherein the object is a rectangular optical member.

32. The foreign substance removing device according to claim 18, wherein the object is disposed in a light path.

33. An image pickup apparatus comprising a foreign substance removing device as claimed in claim 18, and an image pickup element,
   wherein said foreign substance removing device is disposed such that light passing through the object enters a light-receiving surface of the image pickup element.

34. A method of removing a foreign substance on an object therefrom, comprising:
   a voltage application step of applying alternating voltages to the first electromechanical energy conversion element and the second electromechanical energy conversion element disposed on the object, respectively, in which the object, and the first electromechanical energy conversion element and the second electromechanical energy conversion element constitutes a vibrator,
   wherein a frequency of the alternating voltages respectively applied to the first electromechanical energy conversion element and the second electromechanical energy conversion element is such a frequency as to excite a vibration obtained by superposing a first bending vibration and a second bending vibration which are different in order from each other, in the vibrator, and
   the alternating voltage applied to the first electromechanical energy conversion element and the alternating voltage applied to the second electromechanical energy conversion element are different in phase from each other.

35. The method according to claim 34, further comprising a control step of setting the alternating voltages respectively applied to the first electromechanical energy conversion element and the second electromechanical energy conversion element.

36. The method according to claim 34, wherein the frequency of the alternating voltages respectively applied to the first electromechanical energy conversion element and the second electromechanical energy conversion element is set between a resonance frequency of the first bending vibration and a resonance frequency of the second bending vibration.

37. The method according to claim 35, wherein said control step includes setting a phase difference between the alternating voltage applied to the first electromechanical energy conversion element and the alternating voltage applied to the second electromechanical energy conversion element to any value except 0° and 180°.

38. The method according to claim 37, wherein said control step includes switching between:
   driving of the vibrator by setting a phase difference between the alternating voltage applied to the first electromechanical energy conversion element and the alternating voltage applied to the second electromechanical energy conversion element to any value except 0° and 180°, exciting a vibration obtained by superposing a first bending vibration and a second bending vibration which are different in order from each other, in the vibrator, and
   driving of the vibrator by generating one standing wave in the vibrator.

39. The method according to claim 38, wherein in said control step includes setting a phase difference between the alternating voltage applied to the first electromechanical energy conversion element and the alternating voltage applied to the second electromechanical energy conversion element to any value except 0° and 180°, and exciting a vibration obtained by superposing a first bending vibration and a second bending vibration which are different in order from each other, to thereby move the foreign substance on the object, and then causing one bending vibration to be generated in the vibrator to thereby cause the foreign substance on the object to jump off.

40. A vibration apparatus comprising a vibrator constituted by an object, and a first electromechanical energy conversion element and a second electromechanical energy conversion element disposed on the object, respectively, wherein said vibrator vibrates by alternating voltages being applied to the first electromechanical energy conversion element and the second electromechanical energy conversion element, respectively, a frequency of the alternating voltages respectively applied to the first electromechanical energy conversion element and the second electromechanical energy conversion element is such a frequency as to excite a vibration obtained by superposing a first bending vibration and a second bending vibration which are different in order from each other, in the vibrator, the alternating voltage applied to the first electromechanical energy conversion element and the alternating voltage applied to the second electromechanical energy conversion element are different in phase from each other, both of the first electromechanical energy conversion element and the second electromechanical energy conversion element excite the first bending vibration and the second bending vibration, respectively, and a plurality of nodes of the first bending vibration and a plurality of nodes of the second bending vibration are identical in arrangement direction with each other.

41. The vibration apparatus according to claim 40, wherein the first electromechanical energy conversion element is disposed on one end of the object and the second electromechanical energy conversion element is disposed on the other end of the object.

42. The vibration apparatus according to claim 40, wherein the first bending vibration and the second vibration is different in order from each other by one.

43. The vibration apparatus according to claim 40, wherein the alternating voltages respectively applied to the first electromechanical energy conversion element and the second electromechanical energy conversion element is set between a resonance frequency of the first bending vibration and a resonance frequency of the second bending vibration.

44. The vibration apparatus according to claim 40, wherein a phase difference between the alternating voltage applied to said first electromechanical energy conversion element and the alternating voltage applied to said second electromechanical energy conversion element is set to any angle except 180°.

45. The vibration apparatus according to claim 40, further comprising a control circuit configured to set the alternating voltages, respectively, and a first sensor and a second sensor respectively formed on the first electromechanical energy conversion element and the second electromechanical energy conversion element, and configured to detect respective amplitudes of the first bending vibration and the second bending vibration which are different in order from each other, wherein said control circuit is configured to control at least one of a frequency, an amplitude, and a phase difference of the alternating voltages, depending on a ratio of an output of the first sensor and an output of the second sensor.

* * * * *